United States Patent [19]

Okitaka

[11] Patent Number: 5,386,390
[45] Date of Patent: Jan. 31, 1995

[54] SEMICONDUCTOR MEMORY WITH LOOPED SHIFT REGISTERS AS ROW AND COLUMN DRIVERS

[75] Inventor: Takenori Okitaka, Itami, Japan

[73] Assignee: Mitsubishi Denki Kabushiki Kaisha, Tokyo, Japan

[21] Appl. No.: 43,725

[22] Filed: Apr. 8, 1993

[30] Foreign Application Priority Data

Apr. 28, 1992 [JP] Japan .................. 4-110058
Nov. 6, 1992 [JP] Japan .................. 4-297038

[51] Int. Cl.$^6$ .......................................... G11C 13/00
[52] U.S. Cl. .................. 365/230.06; 365/221; 365/230.08; 377/73
[58] Field of Search .......... 365/230.06, 230.08, 365/240, 221, 189.05; 377/73

[56] References Cited

U.S. PATENT DOCUMENTS

| | | | |
|---|---|---|---|
| 4,903,242 | 2/1990 | Hamaguchi et al. | 365/230.08 |
| 5,198,999 | 3/1993 | Abe et al. | 365/189.12 |
| 5,327,386 | 7/1994 | Fudeyasu | 365/189.05 |

FOREIGN PATENT DOCUMENTS 55-501194 12/1980 Japan .

*Primary Examiner*—Eugene R. LaRoche
*Assistant Examiner*—Christopher R. Glembocki
*Attorney, Agent, or Firm*—Oblon, Spivak, McClelland, Maier & Neustadt

[57] ABSTRACT

Address pointers (11, 12, 13, 14) include flip-flop circuits and flip-flop circuits including data through circuits. A control circuit (10) controls the flip-flop circuits such that the data through circuits of unnecessary flip-flop circuits cause data to pass through to prevent the flip-flop circuits from selecting unnecessary memory cells (7). The control circuit (10) generates control signals in selection signal producing means including fuses and the like and a decoding portion. Since the decoding portion decodes a flip-flop selection signal, the number of fuses is reduced. This achieves a semiconductor memory comprising address parts for memory cell selection and redundancy circuits which has a reduced area for provision of the fuses for providing redundancy to the semiconductor memory.

32 Claims, 26 Drawing Sheets

SEMICONDUCTOR MEMORY WITH LOOPED SHIFT REGISTERS AS ROW AND COLUMN DRIVERS

BACKGROUND OF THE INVENTION

1. Field of the Invention

The present invention relates to a semiconductor memory and more particularly to a redundancy circuit for a first-in first-out (hereinafter referred to as FIFO) memory for selecting memory cells by means of an address part.

2. Description of the Background Art

FIG. 26 is a conventional two-port FIFO memory including a redundancy circuit. In FIG. 26, reference numeral 1 designates a memory cell array including a plurality of memory cells arranged in matrix form; 7 designates a regular memory cell forming the memory cell array 1; reference character 7a designates a spare memory cell for redundancy forming the memory cell array 1; 170 designates a word address counter for outputting the count of pulses of a write clock signal WT; 171 designates a write word address decoder for decoding the count of the write word address counter 170; 172 designates a read word address counter for outputting the count of pulses of a read clock signal RT; 173 designates a read word address decoder for decoding the count of the read word address counter 172; 174 designates a write bit address counter for outputting the count of pulses of the write clock signal WT; 175 designates a write bit address decoder for decoding the count of the write bit address counter 174; 176 designates a read bit address counter for outputting the count of pulses of the read clock signal RT; 177 designates a read bit address decoder for decoding the count of the read bit address counter 176; 178 designates a spare memory cell array; 179 designates a redundancy decoder for decoding the count of the write bit address counter 174 or the read bit address counter 176; and 180 designates a fuse.

Operation will be described below. In the write operation of data into the memory cells 7 included in the memory cell array 1, the selection of a specific memory cell 7 in the memory cell array 1 is achieved such that the write word address decoder 171 and write bit address decoder 175 decode the counts of the write word address counter 170 and write bit address counter 174 which increase in synchronism with the write clock signal WT. In the read operation of data from the memory cells 7 included in the memory cell array 1, the selection of a specific memory cell 7 in the memory cell array 1 is achieved such that the read word address decoder 173 and read bit address decoder 177 decode the counts of the read word address counter 172 and read bit address counter 176 which increase in synchronism with the read clock signal RT.

When a fault is developed in a regular memory cell 7, the fuse 180 of the bit line connected to the defective memory cell 7 is cut off by means of laser blowing or the like. The insufficient memory capacitance is compensated for by the spare memory cell array 178. The redundancy decoder 179 is processed by means of laser blowing such that it decodes only the count to be decoded for the bit line whose fuse 180 is cut off. The number of sets of spare memory cell arrays 178 and redundancy decoders 179 to be prepared is arbitrary. When the redundancy memory is unnecessary, the fuse 180 of the bit line connected to the spare memory cells 7a is cut off by means of laser blowing or the like.

The conventional semiconductor memory has drawbacks to be described below. Since a fault might be developed in a memory cell 7 in the memory cell array 1, it is necessary to provide the fuse 180 for redundancy for each bit line, resulting in a need for a large area for the fuses 180.

The address decoders of the FIFO memory require no counter and is easily formed by a shift register including flip-flop circuits connected in series. However, it is difficult to provide a redundancy circuit in the FIFO memory.

It is further difficult to provide redundancy in relation to a start address in the FIFO memory.

SUMMARY OF THE INVENTION

According to a first aspect of the present invention, a semiconductor memory comprises: (a) a plurality of memory cells arranged in the form of a matrix having a plurality of rows and a plurality of columns; (b) memory cell selecting means including a plurality of memory cell selecting portions provided in corresponding relation to the plurality of rows or the plurality of columns and each having an input node, an output node, a control node, a selection signal output node, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the corresponding selecting portion and data through portion operable and makes the other portion inoperable, the input and output nodes of the memory cell selecting portions being connected in series so that the memory cell selecting portions form a loop; and (c) programmable control means for outputting the control signals to the plurality of control nodes of the memory cell selecting means as a function of signals smaller in number than the control signals in order to make the selecting portion inoperable and make the data through portion operable in at least one of the plurality of memory cell selecting portions of the memory cell selecting means.

The control means outputs the control signal to the memory cell selecting portion connected to an unnecessary memory cell including a fault to make the selection portion of the memory cell selecting portion inoperable and make the data through portion thereof operable so that a signal for memory cell selection is not outputted from the memory cell selecting portion. Among the memory cell selecting portions connected in the form of a loop in the memory cell selecting means, only required memory cell selecting portions are adapted to output the signal for memory cell selection. The control means locally controls the memory cells. The number of original signals for outputting the control signal is reduced, and the signal producing means for producing the original signals is simplified.

For example, the control signals produced as a function of the signals outputted from the signal producing means including fuses smaller in number than the memory cell selecting portions are outputted to the control signal nodes of the memory cell selecting portions. Therefore, the number of means for producing the signals of the fuses which form the selecting signal producing means of the control circuit is reduced, and the area of the semiconductor memory is reduced. The control means may be formed in any location. When the signal producing means such as fuses are used, for example, the control means may be formed in a position which facilitates laser blowing for determining the signals to be outputted from the signal producing means. This is effective in that the semiconductor memory is fabricated without difficulty.

In a second aspect of the present invention, a semiconductor memory comprises: (a) a plurality of memory cells arranged in the form of a matrix having a plurality of rows and a plurality of columns; (b) memory cell selecting means including a plurality of first memory cell selecting portions and at least one second memory cell selecting portion, the first and second memory cell selecting portions being provided in corresponding relation to the plurality of rows or the plurality of columns and each having an input node, an output node, a control node, a selection signal output node, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the corresponding selecting portion and data through portion operable and makes the other portion inoperable, the input and output nodes of the first and second memory cell selecting portions being connected in series so that the first and second memory cell selecting portions form a loop; (c) first programmable control means for selectively outputting the control signals to the control nodes for the first memory cell selecting portions of the memory cell selecting means as a function of signals smaller in number than the control signals in order to make the selecting portion inoperable and make the data through portion operable in the first memory cell selecting portions of the memory cell selecting means; and (d) second programmable control means for outputting the control signal to the control node for the second memory cell selecting portion of the memory cell selecting means in order to make the selecting portion operable and make the data through portion inoperable in the second memory cell selecting portion of the memory cell selecting means.

The first control means outputs the control signal to the first memory cell selecting portion connected to an unnecessary memory cell including a fault, if generated, to make the selecting portion of the first memory cell selecting portion inoperable and make the data through portion thereof operable, so that a signal for memory cell selection is not outputted from the first memory cell selecting portion. The memory cell selection signal is adapted to be outputted only from required first memory cell selecting portions among the memory cell selecting portions connected in the form of a loop in the memory cell selecting means. The control means locally controls the memory cells. The number of original signals for outputting the control signal is reduced, and the signal producing means for producing the original signals is simplified.

The second control means outputs the control signal to the second memory cell selecting portion connected to the memory cell to be substituted for the unnecessary memory cell including the fault, if generated, to make the selecting portion of the second memory cell selecting portion operable and make the data through portion thereof inoperable, so that the signal for memory cell selection is not outputted from the second memory cell selecting portion. The memory cell selection signal is adapted to be outputted only from required second memory cell selecting portion among the memory cell selecting portions connected in the form of a loop in the memory cell selecting means. When no fault is generated, the memory cells connected to the first memory cell selecting portions are selected, and the memory cells connected to the second memory cell selecting portion are not selected, whereby the operation for redundancy is omitted.

For example, the control signals produced as a function of the signals outputted from the signal producing means including fuses smaller in number than the memory cell selecting portions are outputted to the control signal nodes of the memory cell selecting portions. Therefore, the number of means for producing the signals of the fuses which form the selecting signal producing means of the control circuit is reduced, and the area of the semiconductor memory is reduced. The control means may be formed in any location. When the signal producing means such as fuses are used, for example, the control means may be formed in a position which facilitates laser blowing for determining the signals to be outputted from the signal producing means. This is effective in that the semiconductor memory is fabricated without difficulty. In addition, when no fault is generated in the memory cells so that the spare memory cells need not be used, no operation is required for the first and second control means, the fabrication process steps being simplified.

In a third aspect of the present invention, a semiconductor memory comprises: (a) a plurality of memory cells arranged in the form of a matrix having a plurality of rows and a plurality of columns; (b) memory cell selecting means including a plurality of memory cell selecting portions provided in corresponding relation to rows or columns and each having an input node, an output node, a control node, a selection signal output node, a state setting signal input terminal, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the corresponding selecting portion and data through portion operable and makes the other portion inoperable, each of the plurality of memory cell selecting portions executing a predetermined setting whether to produce therein data to be stored or to erase the stored data in accordance with a state setting signal inputted to the state setting signal input terminal, and a start address memory cell selecting portion provided in corresponding relation to at least one row or one column and having an input node, an output node, a control node, a selection signal output node, a state setting signal input terminal, a start address control signal input terminal, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the selecting portion and data through portion operable and makes the other portion inoperable, the start address memory cell selecting portion selectively setting whether to produce therein data to be stored or to erase the stored data in accordance with a state setting signal inputted to the state setting signal input terminal and a start address control signal inputted to the start address control signal input terminal, the input and output nodes of the memory cell selecting portions and the start address memory cell selecting portion being connected in series so that the memory cell selecting portions and the start address memory cell selecting portion form a loop; and (c) programmable control means for outputting the control signals to the control nodes of the memory cell selecting means as a function of signals smaller in number than the control signals in order to make the selecting portion inoperable and make the data through portion operable in at least one of the plurality of memory cell selecting portions and start address memory cell selecting portion of the memory cell selecting means.

The control means outputs the control signal to the memory cell selecting portion connected to the unnecessary memory cell including a fault to make the selecting portion of the memory cell selecting portion inoperable and make the data through portion thereof operable, so that the signal for memory cell selection is not outputted from the memory cell selecting portion. Among the memory cell selecting portions connected in the form of a loop in the memory cell selecting means, only required memory cell selecting portions are adapted to output the signal for memory cell selection. The control means locally controls the memory cells. The number of original signals for outputting the control signal is reduced, and the signal producing means for producing the original signals is simplified.

The start address control means selects the production of data to be stored in the start address memory cell selecting portion by means of the state setting signal inputted to the state setting signal input terminal and the start address control signal inputted to the start address control signal input terminal, or the erase of the stored data. When a fault is generated in the memory cell connected to the memory cell selecting portion providing the start address, the data through circuit of the memory cell selecting portion is operated, and the start address control signal causes the start address memory cell selecting portion to produce data to be stored when the state setting signal is inputted. The start address memory cell selecting portion then outputs the start address in place of the memory cell selecting portion which has outputted the start address. The fault is redressed if generated in the memory cells of the memory cell selecting portion which has outputted the start address.

The fault is redressed if generated in any memory cell. For example, the control signals produced as a function of the signals outputted from the signal producing means including fuses smaller in number than the memory cell selecting portions are outputted to the control signal nodes of the memory cell selecting portions. Therefore, the number of means for producing the signals of the fuses which form the selecting signal producing means of the control circuit is reduced, and the area of the semiconductor memory is reduced. The control means may be formed in any location. When the signal producing means such as fuses are used, for example, the control means may be formed in a position which facilitates laser blowing for determining the signals to be outputted from the signal producing means. This is effective in that the semiconductor memory is fabricated without difficulty.

In a fourth aspect of the present invention, a semiconductor memory comprises: (a) a plurality of memory cells arranged in the form of a matrix having a plurality of rows and a plurality of columns; (b) memory cell selecting means including a plurality of first memory cell selecting portions provided in corresponding relation to rows or columns and each having an input node, an output node, a control node, a selection signal output node, a state setting signal input terminal, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the corresponding selecting portion and data through portion operable and makes the other portion inoperable, each of the plurality of memory cell selecting portions producing therein data to be stored or erasing the stored data in accordance with a state setting signal inputted to the state setting signal input terminal, and a second memory cell selecting portion provided in corresponding relation to at least one row or one column and having an input node, an output node, a control node, a selection signal output node, a state setting signal input terminal, a start address control signal input terminal, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to the selecting portion for transmitting the data inputted to the corresponding input node directly to the corresponding output node, the control node receiving a control signal which makes one of the selecting portion and data through portion operable and makes the other portion inoperable, the second memory cell selecting portion selectively setting whether to produce therein data to be stored or to erase the stored data in accordance with a state setting signal inputted to the state setting signal input terminal and a start address control signal inputted to the start address control signal input terminal, the input and output nodes of the first and second memory cell selecting portions being connected in series so that the first and second memory cell selecting portions form a loop; (c) programmable control means for selectively outputting the control signals to the control nodes for the first memory cell selecting portions of the memory cell selecting means as a function of signals smaller in number than the control signals in order to make the selecting portion inoperable and make the data through portion operable in the plurality of first memory cell selecting portions of the memory cell selecting means; and (d) programmable start address control means for outputting the control signal to the control node for the second memory cell selecting portion of the memory cell selecting means in order to make the selecting portion operable and make the data through portion inoperable in the second memory cell selecting portion of the memory cell selecting means.

The first control means outputs the control signal to the first memory cell selecting portion connected to an unnecessary memory cell including a fault, if generated, to make the selecting portion of the first memory cell selecting portion inoperable and make the data through portion thereof operable, so that the signal for memory cell selection is not outputted from the first memory cell selecting portion. The memory cell selection signal is adapted to be outputted only from required first memory cell selecting portions among the memory cell selecting portions connected in the form of a loop in the memory cell selecting means. The control means locally controls the memory cells. The number of original signals for outputting the control signal is reduced, and the signal producing means for producing the original signals is simplified.

The second control means outputs the control signal to the second memory cell selecting portion connected to the memory cell to be substituted for the unnecessary memory cell including the fault, if generated, to make the selecting portion of the second memory cell selecting portion operable and make the data through portion thereof inoperable, so that the signal for memory cell selection is not outputted from the second memory cell selecting portion. The memory cell selection signal is adapted to be outputted only from required second memory cell selecting portion among the memory cell selecting portions connected in the form of a loop in the memory cell selecting means. When no fault is generated, the memory cells connected to the first memory cell selecting portions are selected, and the memory cells connected to the second memory cell selecting portion are not selected, whereby the operation for redundancy is omitted.

The start address control means selects the production of the data to be stored in the start address memory cell selecting portion by means of the state setting signal inputted to the state setting signal input terminal and the start address control signal inputted to the start address control signal input terminal, or the erase of the stored data. When a fault is generated in the memory cell connected to the memory cell selecting portion providing the start address, the data through circuit of the memory cell selecting portion is operated, and the start address control signal causes the start address memory cell selecting portion to produce data to be stored when the state setting signal is inputted. The start address memory cell selecting portion then outputs the start address in place of the memory cell selecting portion which has outputted the start address. The fault is redressed if generated in the memory cells of the memory cell selecting portion which has outputted the start address.

For example, the control signals produced as a function of the signals outputted from the signal producing means including fuses smaller in number than the memory cell selecting portions are outputted to the control signal nodes of the memory cell selecting portions. Therefore, the number of means for producing the signals of the fuses which form the selecting signal producing means of the control circuit is reduced, and the area of the semiconductor memory is reduced. The control means may be formed in any location. When the signal producing means such as fuses are used, for example, the control means may be formed in a position which facilitates laser blowing for determining the signals to be outputted from the signal producing means. This is effective in that the semiconductor memory is fabricated without difficulty. In addition, when no fault is generated in the memory cells so that the spare memory cells need not be used, no operation is required for the first and second control means, the fabrication process steps being simplified.

In a fifth aspect of the present invention, a semiconductor memory comprises: (a) a memory cell array including a plurality of memory cells; (b) a plurality of memory cell selection lines for transmitting a signal for selecting a memory cell from or into which data is to be read or written from the plurality of memory cells; (c) an address pointer including a plurality of flip-flop circuits each having an input terminal, an output terminal, a control terminal, a selection signal output terminal connected to the corresponding memory cell selection line, and a data through circuit connected to the input and output terminals, the plurality of flip-flop circuits being connected in series to form a loop; and (d) a control circuit including a plurality of control signal output terminals corresponding to the flip-flop circuits, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the flip-flop circuits, respectively, the control circuit controlling the data through circuits by means of the first or second control signal outputted from the control terminals to select a data transmission path in the flip-flop circuits, wherein each of the flip-flop circuits enters a first state of passing data inputted from the input terminal directly to the output terminal by means of the data through circuit in response to the first control signal inputted to the control terminal, and enters a second state of outputting a signal for selecting the memory cells from the selection signal output terminal by means of the signal inputted from the input terminal without passing the data inputted from the input terminal directly to the output terminal by means of the data through circuit in response to the second control signal inputted to the control terminal.

The control circuit outputs the flip-flop selection signal for selecting necessary and unnecessary flip-flop circuits by means of the selection signal producing means and decodes the flip-flop selection signal in the decoding means to output the first or second control signal to the plurality of flip-flop circuits. The control circuit outputs the second control signal to the flip-flop circuits connected to the memory cell selection lines selecting the necessary memory cells to place the flip-flop circuits into normal operation. The control circuit outputs the first control signal to the flip-flop circuit connected to the memory cell selection line of the unnecessary memory cell, putting the data through circuit into operation and passing the data inputted to the flip-flop circuit through, so that the flip-flop circuit does not output the memory cell selection signal to the memory cell selection line.

For example, the flip-flop selection signal produced by means of the selection signal producing means including fuses smaller in number than the flip-flop circuits is decoded in the decoding means, so that the first or second control signal is outputted to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

In a sixth aspect of the present invention, a semiconductor memory comprises: (a) a memory cell array including a plurality of memory cells; (b) at least one spare memory cell; (c) a plurality of memory cell selection lines for transmitting a signal for selecting a memory cell from or into which data is to be read or written from the plurality of memory cells; (d) a spare memory cell selection line for transmitting a signal for selecting a spare memory cell into which data is to be written or from which data stored therein is to be read; (e) an address pointer including a plurality of flip-flop circuits each having an input terminal, an output terminal, a control terminal, a selection signal output terminal connected to the corresponding memory cell selection line and a data through circuit connected to the input and output terminals, and a spare flip-flop circuit having a spare input terminal, a spare output terminal, a spare control terminal, a spare selection signal output terminal connected to the corresponding spare memory cell selection line and a spare data through circuit connected to the spare input and output terminals, the plurality of flip-flop circuits and the spare flip-flop circuit being connected in series to form a loop; (f) a control circuit including a plurality of control signal output terminals corresponding to the flip-flop circuits, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the flip-flop circuits, respectively, the control circuit controlling the data through circuits by means of the first or second control signal outputted from the control terminals to select a data transmission path in the flip-flop circuits; and (g) a spare control circuit including a spare control signal output terminal corresponding to the spare flip-flop circuit, the spare control signal output terminal being connected to the spare control terminal of the spare flip-flop circuit, the spare control circuit controlling the spare data through circuit by means of a first or second spare control signal outputted from the spare control signal output terminal to select a data transmission path in the spare flip-flop circuit, wherein each of the flip-flop circuits enters a first state of passing data inputted from the input terminal directly to the output terminal by means of the data through circuit in response to the first control signal inputted to the control terminal, and enters a second state of outputting a signal for selecting the memory cells from the selection signal output terminal by means of the signal inputted from the input terminal without passing the data inputted to the input terminal directly to the output terminal by means of the data through circuit in response to the second control signal inputted to the control terminal, and wherein the spare flip-flop circuit enters a first state of outputting a signal for selecting the spare memory cell from the spare selection signal output terminal by means of a signal inputted from the spare input terminal without passing the data inputted from the spare input terminal directly to the spare output terminal by means of the spare data through circuit in response to the first spare control signal inputted to the spare control terminal, and enters a second state of passing the data inputted from the spare input terminal directly to the spare output terminal by means of the spare data through circuit in response to the second spare control signal inputted to the spare control terminal.

When a fault is generated in the memory cell array, the control circuit outputs the flip-flop selection signal for selecting the required flip-flop circuits and the flip-flop circuit corresponding to the defective memory cell by means of the selection signal producing means and decodes the flip-flop selection signal in the decoding means to output the first or second control signal to the plurality of flip-flop circuits. The control circuit outputs the second control signal to the flip-flop circuits connected to the memory cell selection lines selecting the required memory cells to place the flip-flop circuits into normal operation. The control circuit outputs the first control signal to the flip-flop circuit connected to the memory cell selection line of the defective memory cell, putting the data through circuit into operation and passing the data inputted to the flip-flop circuit through, so that the flip-flop circuit does not output the memory cell selection signal to the memory cell selection line. The spare control circuit to be substituted for the memory cells selected by the flip-flop circuit corresponding to the defective memory cell outputs the first spare control signal to the spare flip-flop circuit connected to the spare memory cell selection line selecting the required spare memory cell, to place the spare flip-flop circuit into normal operation.

For example, the flip-flop selection signal produced by means of the selection signal producing means including fuses smaller in number than the flip-flop circuits is decoded in the decoding means, so that the first or second control signal is outputted to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

In a seventh aspect of the present invention, a semiconductor memory comprises: (a) a memory cell array including a plurality of memory cells; (b) a plurality of memory cell selection lines for transmitting a signal for selecting a memory cell from or into which data is to be read or written from the plurality of memory cells; (c) an address pointer including a plurality of flip-flop circuits each having an input terminal and an output terminal, and a plurality of first switch circuits each having a first terminal, a second terminal and a control terminal, the input terminals of the flip-flop circuits being connected to the second terminals of the first switch circuits, the output terminals of the flip-flop circuits being connected to the first terminals of the first switch circuits whereby the flip-flop circuits and the first switch circuits are connected in series alternately with each other to form a loop, the memory cell selection lines being connected to connections between the output terminals of the flip-flop circuits and the first terminals of the first switch circuits; (d) a plurality of second switch circuits each including a first terminal, a second terminal and a control terminal, the first terminals being connected to the input terminals of the flip-flop circuits, the second terminals being connected to the second terminals of the first switch circuits connected to the output terminals of the flip-flop circuits; and (e) a control circuit including a plurality of control signal output terminals corresponding to the plurality of first and second switch circuits, respectively, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the first and second switch circuits, respectively, the control circuit controlling the first and second switch circuits by means of the first or second control signal outputted to the control terminals from the control signal output terminals to select a first state of turning off the first switch circuits and turning on the second switch circuits or a second state of turning on the first switch circuits and turning off the second switch circuits.

The control circuit outputs the flip-flop selection signal for selecting necessary and unnecessary flip-flop circuits by means of the selection signal producing means and decodes the flip-flop selection signal in the decoding means to output the first or second control signal to the plurality of flip-flop circuits. The control circuit outputs the second control signal to the first and second switch circuits corresponding to the flip-flop circuits connected to the memory cell selection lines selecting the necessary memory cells to place the flip-flop circuits into normal operation. The control circuit outputs the first control signal to the first and second switch circuits corresponding to the flip-flop circuit connected to the memory cell selection line of the unnecessary memory cell, passing the data through the second switch circuit, so that the flip-flop circuit does not output the memory cell selection signal to the memory cell selection line.

For example, the flip-flop selection signal produced by means of the selection signal producing means including fuses smaller in number than the flip-flop circuits is decoded in the decoding means, so that the first or second control signal is outputted to the first and second switch circuits corresponding to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, the control circuit may be formed in a position which facilitates the laser blowing. This is effective in that the semiconductor memory is fabricated without difficulty.

In an eighth aspect of the present invention, a semiconductor memory comprises: (a) a memory cell array including a plurality of memory cells; (b) at least one spare memory cell; (c) a plurality of memory cell selection lines for transmitting a signal for selecting a memory cell from or into which data is to be read or written from the plurality of memory cells; (d) a spare memory cell selection line for transmitting the signal for selecting a spare memory cell into which data is to be written or from which data stored therein is to be read; (e) an address pointer including a plurality of flip-flop circuits each having an input terminal and an output terminal, a spare flip-flop circuit having a spare input terminal and a spare output terminal, a plurality of first switch circuits each having a first terminal, a second terminal and a control terminal, and a first spare switch circuit having a first spare terminal, a second spare terminal and a spare control terminal, the output terminals of the flip-flop circuits being connected to the first terminals of the first switch circuits, the spare output terminal of the spare flip-flop circuit being connected to the first spare terminal of the first spare switch circuit, the input terminals of the flip-flop circuits or the spare input terminal of the spare flip-flop circuit being connected to the second terminals of the first switch circuits or the second spare terminal of the first spare switch circuits, whereby the flip-flop circuits or the spare flip-flop circuit and the first switch circuits or the first spare switch circuit being connected in series alternately with each other to form a loop, the memory cell selection lines being connected to connections between the output terminals of the flip-flop circuits and the first terminals of the first switch circuits or to a connection between the spare output terminal of the spare flip-flop circuit and the first spare terminal of the first spare switch circuit; (f) a plurality of second switch circuits each including a first terminal, a second terminal and a control terminal, the first terminals being connected to the input terminals of the flip-flop circuits, the second terminals being connected to the second terminals of the first switch circuits connected to the output terminals of the flip-flop circuits; (g) a second spare switch circuit including a first spare terminal, a second spare terminal and a spare control terminal, the first spare terminal being connected to the spare input terminal of the spare flip-flop circuit, the second spare terminal being connected to the second spare terminal of the first spare switch circuit connected to the second spare terminal of the spare flip-flop circuit; (h) a control circuit including a plurality of control signal output terminals corresponding to the plurality of first and second switch circuits, respectively, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the first and second switch circuits, respectively, the control circuit controlling the first and second switch circuits by means of the first or second control signal outputted from the control signal output terminals to the control terminals to select a first state of turning off the first switch circuits and turning on the second switch circuits or a second state of turning on the first switch circuits and turning off the second switch circuits; and (i) a spare control circuit including spare control signal output terminals corresponding to the first and second spare switch circuits, respectively, the spare control signal output terminals being connected to the spare control terminals of the first and second spare switch circuits, the spare control circuit controlling the first and second spare switch circuits by means of a first or second control signal outputted to the spare control terminals to select a first state of turning on the first spare switch circuit and turning off the second spare switch circuit or a second state of turning off the first spare switch circuit and turning on the second spare switch circuit.

When a fault is generated in the memory cell array, the control circuit outputs the flip-flop selection signal for selecting necessary and unnecessary flip-flop circuits by means of the selection signal producing means and decodes the flip-flop selection signal in the decoding means to output the first or second control signal to the plurality of flip-flop circuits. The control circuit outputs the second control signal to the first and second switch circuits corresponding to the flip-flop circuits connected to the memory cell selection lines selecting the necessary memory cells to place the flip-flop circuits into normal operation. The control circuit outputs the first control signal to the flip-flop circuit connected to the memory cell selection line of the defective memory cell, putting the data through circuit into operation and passing the data inputted to the flip-flop circuit through, so that the flip-flop circuit does not output the memory cell selection signal to the memory cell selection line. The spare control circuit to be substituted for the memory cells selected by the flip-flop circuit outputs the first spare control signal to the first and second spare switch circuits corresponding to the spare flip-flop circuit connected to the spare memory cell selection line selecting the required spare memory cell, to place the spare flip-flop circuit into normal operation.

For example, the flip-flop selection signal produced by means of the selection signal producing means including fuses smaller in number than the flip-flop circuits is decoded in the decoding means, so that the first or second control signal is outputted to the first and second switch circuits corresponding to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

In a ninth aspect of the present invention, a semiconductor memory comprises: (a) a memory cell array including a plurality of memory cells; (b) a plurality of memory cell selection lines for transmitting a signal for selecting a memory cell from or into which data is to be read or written from the plurality of memory cells; (c) an address pointer including a plurality of flip-lop circuits each having an input terminal, an output terminal, a control terminal, a selection signal output terminal connected to the corresponding memory cell selection line, and a data through circuit connected to the input and output terminals, the plurality of flip-flop circuits being connected in series to form a loop; (d) a control circuit including a plurality of control signal output terminals corresponding to the flip-flop circuits, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the flip-flop circuits, respectively, the control circuit controlling the data through circuits by means of the first or second control signal outputted from the control terminals to select a data transmission path in the flip-flop circuits; and (e) a start address control circuit including at least one start address control signal output terminal connected to at least one of the flip-flop circuits for producing a start address control signal for specifying one arbitrary flip-flop circuit among the flip-flop circuits connected to the start address control signal output terminal to output the start address control signal from the start address control signal output terminal, the flip-flop circuit connected to the start address control signal output terminal including a start address control signal input terminal connected to the start address control signal output terminal, a state setting signal input terminal receiving a state setting signal, and a set/reset control circuit controlled by the start address control signal inputted to the start address control signal input terminal for setting a set or reset state of the flip-flop circuit in response to the state setting signal inputted to the state setting signal input terminal, each flip-flop circuit which is not connected to the start address control signal output terminal including a state setting signal input terminal receiving the state setting signal and set or reset in response to the state setting signal, wherein each of the flip-flop circuits enters a first state of passing data inputted from the input terminal directly to the output terminal by means of the data through circuit in response to the first control signal inputted to the control terminal, and enters a second state of outputting a signal for selecting the memory cells from the selection signal output terminal by means of the signal inputted from the input terminal without passing the data inputted to the input terminal directly to the output terminal by means of the data through circuit in response to the second control signal inputted to the control terminal.

When a fault is generated in the memory cell array and the defective memory cell is connected to the flip-flop circuit specifying the start address, the control circuit makes the flip-flop circuit inoperable. Instead, a flip-flop circuit specifying a new start address is set. The start address control circuit, in order to select one of the flip-flop circuits connected to the start address control signal output terminal, produces the start address control signal to control the start address by means of the start address control signal outputted from the start address control signal output terminal. One of the flip-flop circuits connected at the start address control signal input terminal thereof to the start address control signal output terminal of the start address control circuit and controlled by the start address control circuit is controlled by the first start address control signal, and the set/reset control circuit sets the flip-flop circuit to the set state in response to the state setting signal. This flip-flop circuit specifies the start address in the address pointer, and the memory controlled by the set flip-flop circuit serves as the start address. The start address control circuit provides for the redundancy for the start address.

For example, the flip-flop selection signal produced by means of the selection signal producing means including fuses smaller in number than the flip-flop circuits is decoded in the decoding means, so that the first or second control signal is outputted to the first and second switch circuits corresponding to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

Furthermore, when a fault is generated in the memory cell corresponding to the flip-flop circuit specifying the start address in the memory cell array, the start address control circuit easily changes the flip-flop circuits specifying the start address. The start address is easily specified. In a tenth aspect of the present invention, a semiconductor memory comprises: (a) a memory cell array including a plurality of memory cells; (b) at least one spare memory cell; (c) a plurality of memory cell selection lines for transmitting a signal for selecting a memory cell from or into which data is to be read or written from the plurality of memory cells; (d) a spare memory cell selection line for transmitting a signal for selecting a spare memory cell into which data is to be written or from which data stored therein is to be read; (e) a plurality of flip-flop circuits each including an input terminal, an output terminal, a control terminal, a selection signal output terminal connected to the corresponding memory cell selection line, and a data through circuit connected to the input and output terminals; (f) an address pointer including a spare flip-flop circuit having a spare input terminal, a spare output terminal, a spare control terminal, a spare selection signal output terminal connected to the corresponding spare memory cell selection line, and a spare data through circuit connected to the spare input and output terminals, the plurality of flip-flop circuits and the spare flip-flop circuit being connected in series to form a loop; (g) a control circuit including a plurality of control signal output terminals corresponding to the flip-flop circuits, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the flip-flop circuits, the control circuit controlling the data through circuits by means of the first or second control signal outputted from the control terminals to select a data transmission path in the flip-flop circuits; (h) a spare control circuit including a spare control signal output terminal corresponding to the spare flip-flop circuit, the spare control signal output terminal being connected to the spare control terminal of the spare flip-flop circuit, the spare control circuit controlling the spare data through circuit by means of a first or second spare control signal outputted from the spare control signal output terminal to select a data transmission path in the spare flip-flop circuit; and (i) a start address control circuit including at least one start address control signal output terminal connected to at least one of the flip-flop circuits and spare flip-flop circuit for producing a start address control signal for specifying one arbitrary flip-flop circuit among the flip-flop circuits and spare flip-flop circuit connected to the start address control signal output terminal to output the start address control signal from the start address control signal output terminal, each of the flip-flop circuit and spare flip-flop circuit connected to the start address control signal output terminal including a start address control signal input terminal connected to the start address control signal output terminal of the start address control circuit, a state setting signal input terminal receiving a state setting signal, and a set/reset control circuit controlled by the start address control signal inputted to the start address control signal input terminal for setting a set or reset state of the flip-flop circuit in response to the state setting signal, each of the flip-flop circuit and spare flip-flop circuit which is not connected to the start address control signal output terminal including a state setting signal input terminal receiving the state setting signal and set or reset in response to the state setting signal, wherein each of the flip-flop circuits enters a first state of passing data inputted from the input terminal directly to the output terminal by means of the data through circuit in response to the first control signal inputted to the control terminal, and enters a second state of outputting a signal for selecting the memory cells from the selection signal output terminal by means of the signal inputted from the input terminal without passing the data inputted to the input terminal directly to the output terminal by means of the data through circuit in response to the second control signal inputted to the control terminal, and wherein the spare flip-flop circuit enters a first state of outputting a signal for selecting the spare memory cell from the spare memory cell selection signal output terminal by means of a signal inputted from the spare input terminal without passing the data inputted from the spare input terminal directly to the spare output terminal by means of the spare data through circuit in response to the first spare control signal inputted to the spare control terminal, and enters a second state of passing the data inputted from the spare input terminal directly to the spare output terminal by means of the spare data through circuit in response to the second spare control signal inputted to the spare control terminal.

When a fault is generated in the memory cell array and the defective memory cell is connected to the flip-flop circuit specifying the start address, the control circuit makes the flip-flop circuit inoperable. Instead, a flip-flop circuit specifying a new start address is set by using a spare flip-flop circuit or flip-flop circuit corresponding to the undefective memory cell. The start address control circuit produces the start address control signal for selecting one of the flip-flop circuits and spare flip-flop circuit connected to the start address control signal output terminal, to control the start address by means of the start address control signal outputted from the start address control signal output terminal. One of the flip-flop circuits and spare flip-flop circuit connected at the start address control signal input terminal thereof to the start address control signal output terminal of the start address control circuit and controlled by the start address control circuit is controlled by the first start address control signal, and the set/reset control circuit sets the flip-flop circuit to the set state in response to the state setting signal. This flip-flop circuit specifies the start address in the address pointer, and the memory controlled by the set flip-flop circuit serves as the start address. The start address control circuit provides for the redundancy for the start address.

For example, the flip-flop selection signal produced by means of the selection signal producing means including fuses smaller in number than the flip-flop circuits is decoded in the decoding means, so that the first or second control signal is outputted to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

Furthermore, when a fault is generated in the memory cell corresponding to the flip-flop circuit specifying the start address in the memory cell array, the start address control circuit easily changes the flip-flop circuits specifying the start address. The start address is easily specified.

In an eleventh aspect of the present invention, a semiconductor memory comprises: (a) a memory cell array including a plurality of memory cells; (b) a plurality of memory cell selection lines for transmitting a signal for selecting a memory cell from or into which data is to be read or written from the plurality of memory cells; (c) an address pointer including a plurality of flip-lop circuits each having an input terminal and an output terminal, and a plurality of first switch circuits each having a first terminal, a second terminal and a control terminal, the input terminals of the flip-flop circuits being connected to the second terminals of the first switch circuits, the output terminals of the flip-flop circuits being connected to the first terminals of the first switch circuits, whereby the flip-flop circuits and the first switch circuits being connected in series alternately with each other to form a loop, the memory cell selection lines being connected to connections between the output terminals of the flip-flop circuits and the first terminals of the first switch circuits; (d) a plurality of second switch circuits each including a first terminal, a second terminal and a control terminal, the first terminals being connected to the input terminals of the flip-flop circuits, the second terminals being connected to the second terminals of the first switch circuits connected to the output terminals of the flip-flop circuits; (e) a control circuit including a plurality of control signal output terminals corresponding to the plurality of first and second switch circuits, respectively, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the first and second switch circuits, respectively, the control circuit controlling the first and second switch circuits by means of the first or second control signal outputted from the control signal output terminals to the control terminals to select a first state of turning off the first switch circuits and turning on the second switch circuits or a second state of turning on the first switch circuits and turning off the second switch circuits; and (f) a start address control circuit including at least one start address control signal output terminal connected to at least one of the flip-flop circuits for producing a start address control signal for specifying one arbitrary flip-flop circuit among the flip-flop circuits connected to the start address control signal output terminal to output the start address control signal from the start address control signal output terminal, the flip-flop circuit connected to the start address control signal output terminal including a start address control signal input terminal connected to the start address control signal output terminal, a state setting signal input terminal receiving a state setting signal, and a set/reset control circuit controlled by the start address control signal for setting a set or reset state of the flip-flop circuit in response to the state setting signal, each flip-flop circuit which is not connected to the start address control signal output terminal including a state setting signal input terminal receiving the state setting signal and set or reset in response to the state setting signal.

When a fault is generated in the memory cell array and the defective memory cell is connected to the flip-flop circuit specifying the start address, the control circuit makes the flip-flop circuit inoperable. Instead, a flip-flop circuit specifying a new start address is set. The start address control circuit, in order to select one of the flip-flop circuits connected to the start address control signal output terminal, produces the start address control signal to control the start address by means of the start address control signal outputted from the start address control signal output terminal. One of the flip-flop circuits connected at the start address control signal input terminal thereof to the start address control signal output terminal of the start address control circuit and controlled by the start address control circuit is controlled by the first start address control signal, and the set/reset control circuit sets the flip-flop circuit to the set state in response to the state setting signal. This flip-flop circuit specifics the start address in the address pointer, and the memory controlled by the set flip-flop circuit serves as the start address. The start address control circuit provides for the redundancy for the start address.

For example, the flip-flop selection signal produced by means of the selection signal producing means including fuses smaller in number than the flip-flop circuits is decoded in the decoding means, so that the first or second control signal is outputted to the first and second switch circuits corresponding to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

Furthermore, when a fault is generated in the memory cell corresponding to the flip-flop circuit specifying the start address in the memory cell array, the start address control circuit easily changes the flip-flop circuits specifying the start address. The start address is easily specified.

In a twelfth aspect of the present invention, a semiconductor memory comprises: (a) a memory cell array including a plurality of memory cells; (b) at least one spare memory cell; (c) a plurality of memory cell selection lines for transmitting a signal for selecting a memory cell from or into which data is to be read or written from the plurality of memory cells; (d) a spare memory cell selection line for transmitting a signal for selecting a spare memory cell into which data is to be written or from which data stored therein is to be read; (e) an address pointer including a plurality of flip-flop circuits each having an input terminal and an output terminal, a spare flip-flop circuit having a spare input terminal and a spare output terminal, a plurality of first switch circuits each having a first terminal, a second terminal and a control terminal, and a first spare switch circuit having a first spare terminal, a second spare terminal and a spare control terminal, the output terminals of the flip-flop circuits being connected to the first terminals of the first switch circuits, the spare output terminal of the spare flip-flop circuit being connected to the first spare terminal of the first spare switch circuit, the input terminals of the flip-flop circuits or the spare input terminal of the spare flip-flop circuit being connected to the second terminals of the first switch circuits or the second spare terminal of the first spare switch circuit, whereby the flip-flop circuits or the spare flip-flop circuit and the first switch circuits or the first spare switch circuit being connected in series alternately with each other to form a loop, the memory cell selection lines being connected to connections between the output terminals of the flip-flop circuits and the first terminals of the first switch circuits or to a connection between the spare output terminal of the spare flip-flop circuit and the first spare terminal of the first spare switch circuit; (f) a plurality of second switch circuits each having a first terminal, a second terminal and a control terminal, the first terminals being connected to the input terminals of the flip-flop circuits, the second terminals being connected to the second terminals of the first switch circuits connected to the output terminals of the flip-flop circuits; (g) a second spare switch circuit having a first spare terminal, a second spare terminal and a spare control terminal, the first spare terminal being connected to the spare input terminal of the spare flip-flop circuit, the second spare terminal being connected to the second spare terminal of the first spare switch circuit connected to the second spare terminal of the spare flip-flop circuit; (h) a control circuit including a plurality of control signal output terminals corresponding to plurality of the first and second switch circuits, respectively, selection signal producing means for producing a flip-flop selection signal for selecting an arbitrary flip-flop circuit from the plurality of flip-flop circuits, and decoding means for decoding the flip-flop selection signal to output a first or second control signal to the respective control signal output terminals, the control signal output terminals being connected to the control terminals of the first and second switch circuits, respectively, the control circuit controlling the first and second switch circuits by means of the first or second control signal outputted from the control signal output terminal terminals to the control terminals to select a first state of turning off the first switch circuits and turning on the second switch circuits or a second state of turning on the first switch circuits and turning off the second switch circuits; (i) a spare control circuit including spare control signal output terminals corresponding to the first and second spare switch circuits, respectively, the spare control signal output terminals being connected to the spare control terminals of the first and second spare switch circuits, the spare control circuit controlling the first and second spare switch circuits by means of a first or second control signal outputted to the spare control terminals to select a first state of turning on the first spare switch circuit and turning off the second spare switch circuit or a second state of turning off the first spare switch circuit and turning on the second spare switch circuit; and (j) a start address control circuit including at least one start address control signal output terminal connected to at least one of the flip-flop circuits and spare flip-flop circuit for producing a start address control signal for specifying one arbitrary flip-flop circuit among the flip-flop circuits connected to the start address control signal output terminal to output the start address control signal from the start address control signal output terminal, each of the flip-flop circuit and spare flip-flop circuit connected to the start address control signal output terminal including a start address control signal input terminal connected to the start address control signal output terminal of the start address control circuit, a state setting signal input terminal receiving a state setting signal, and a set/reset control circuit controlled by the start address control signal for setting a set or reset state of the flip-flop circuit in response to the state setting signal, each of the flip-flop circuit and spare flip-flop circuit which is not connected to the start address control signal output terminal including a state setting signal input terminal receiving the state setting signal and set or reset in response to the state setting signal.

When a fault is generated in the memory cell array and the defective memory cell is connected to the flip-flop circuit specifying the start address, the control circuit makes the flip-flop circuit inoperable. Instead, a flip-flop circuit specifying a new start address is set by using a spare flip-flop circuit or flip-flop circuit corresponding to the undefective memory cell. The start address control circuit produces the start address control signal for selecting one of the flip-flop circuits and spare flip-flop circuit connected to the start address control signal output terminal, to control the start address by means of the start address control signal outputted from the start address control signal output terminal. One of the flip-flop circuits and spare flip-flop circuit connected at the start address control signal input terminal thereof to the start address control signal output terminal of the start address control circuit and controlled by the start address control circuit is controlled by the first start address control signal, and the set/reset control circuit sets the flip-flop circuit to the set state in response to the state setting signal. This flip-flop circuit specifies the start address in the address pointer, and the memory controlled by the set flip-flop circuit serves as the start address. The start address control circuit provides for the redundancy for the start address.

For example, the flip-flop selection signal produced by means of the selection signal producing means including fuses smaller in number than the flip-flop circuits is decoded in the decoding means, so that the first or second control signal is outputted to the first and second switch circuits corresponding to the flip-flop circuits from the control signal output terminals. Therefore, the number of fuses which form the selecting signal producing means of the control circuit is reduced, and the area of the semiconductor memory is reduced. The control circuit may be formed in any location. When the flip-flop selection signal is determined which is to be outputted from the selection signal producing means by means of laser blowing, for example, the control circuit may be formed in a position which facilitates the laser blowing. This is effective in that the semiconductor memory is fabricated without difficulty.

Furthermore, when a fault is generated in the memory cell corresponding to the flip-flop circuit specifying the start address in the memory cell array, the start address control circuit easily changes the flip-flop circuits specifying the start address. The start address is easily specified.

A primary object of the present invention is to provide a semiconductor memory, particularly an FIFO memory including a shift register for selecting a row or a column in a memory cell array, which comprises a redundancy circuit wherein the number of fuses that have been provided for each row or column is reduced and wherein the position of the fuses is freely set.

Another object of the invention is to provide a semiconductor memory which comprises a redundancy circuit capable of providing redundancy in relation to a start address.

These and other objects, features, aspects and advantages of the present invention will become more apparent from the following detailed description of the present invention when taken in conjunction with the accompanying drawings.

DESCRIPTION OF THE PREFERRED EMBODIMENTS

First Schematic Structure

Figure 1:
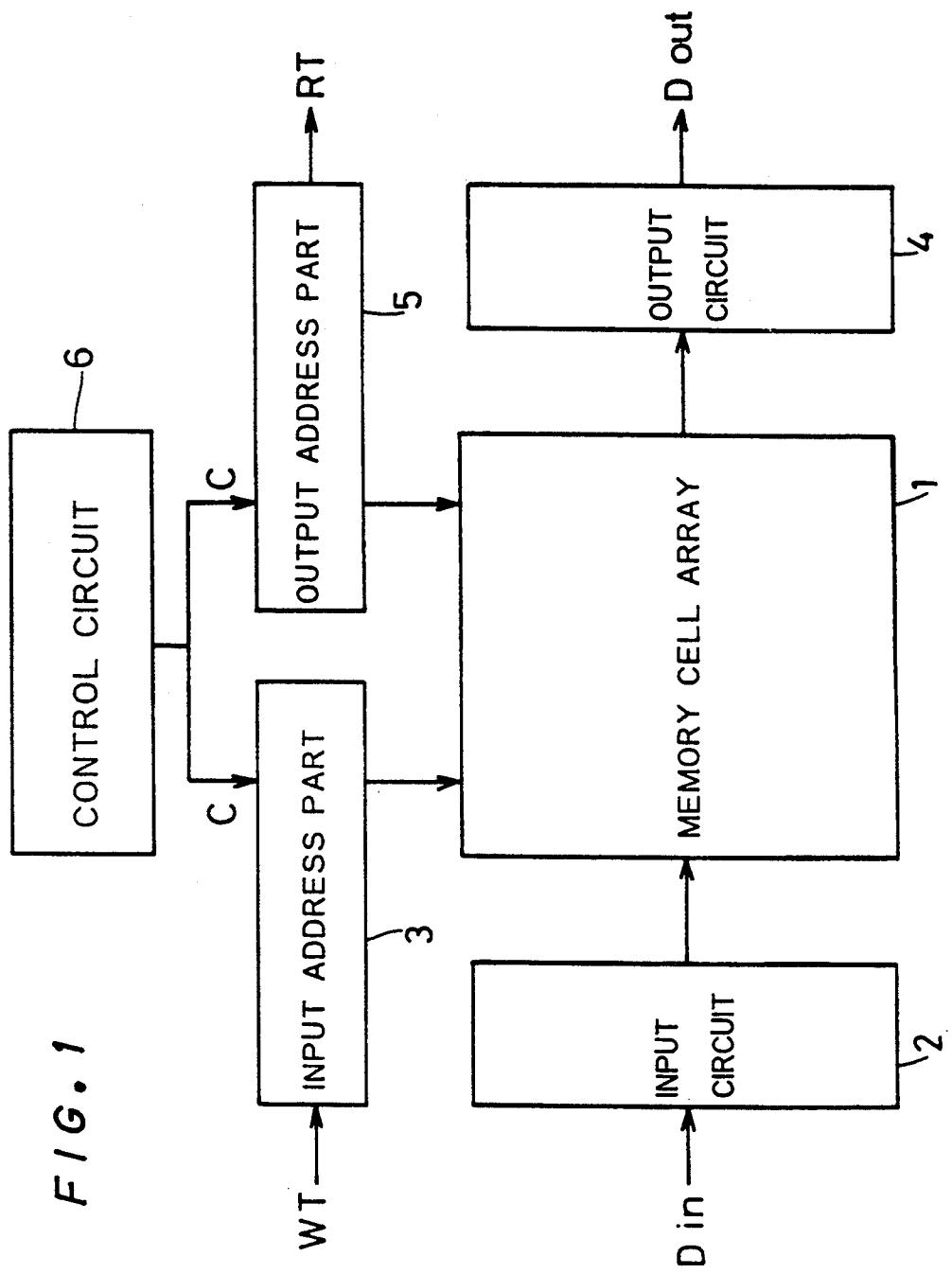
FIG. 1 is a schematic block diagram of a semiconductor memory according to the present invention.

A semiconductor memory according to the present invention will be described hereinafter with reference to the drawings. FIG. 1 is a block diagram showing the outline of an exemplary structure of the semiconductor memory according to the present invention. Reference numeral 1 designates a memory cell array including a plurality of memory cells arranged in matrix form having a plurality of rows and a plurality of columns. The memory cells may be those for use in DRAM, SRAM, EEPROM and the like. Reference numeral 2 designates an input circuit for writing input data Din into the memory cells of the memory cell array 1; 3 designates an input address part for selecting the memory cells into which the input circuit 2 writes the input data Din in synchronism with a dock signal WT; 4 designates an output circuit for reading the data written in the memory cells of the memory cell array 1; 5 designates an output address part for selecting the memory cells from which the output circuit 4 reads the data in synchronism with a dock signal RT; and 6 designates a control circuit for controlling the input and output address parts 3 and 5. Although the address parts are used herein for both input and output, the address part may be used for one of them.

The input and output address parts 3 and 5 each includes a plurality of flip-flop circuits connected in series in ring form. The input and output address parts 3 and 5 are operative to feed the data for selection of the memory cells sequentially to the next flip-flop circuit in synchronism with the clock signals RT and WT. Thus the data for selection of the memory cells in the address parts 3 and 5 travels round along the ring formed by the flip-flop circuits. The respective flip-flop circuits output a memory cell selection signal for selecting the memory cells as a function of the data for memory selection.

The semiconductor memory having such arrangement, however, is judged as a defective product if there is a defective memory cell in the memory cell array 1. To prevent such situation, spare memory cells for redundancy are provided in the memory cell array 1, and spare flip-flop circuits for selection of the spare memory cells are provided in the input and output address parts 3 and 5. A control signal C outputted from the control circuit 6 does not cause the flip-flop circuit which selects the defective memory cell to operate but instead causes the spare flip-flop circuit to operate to use the redundancy memory cells, to thereby prevent the whole semiconductor memory from being judged as the defective product.

First Preferred Embodiment

Figure 2:
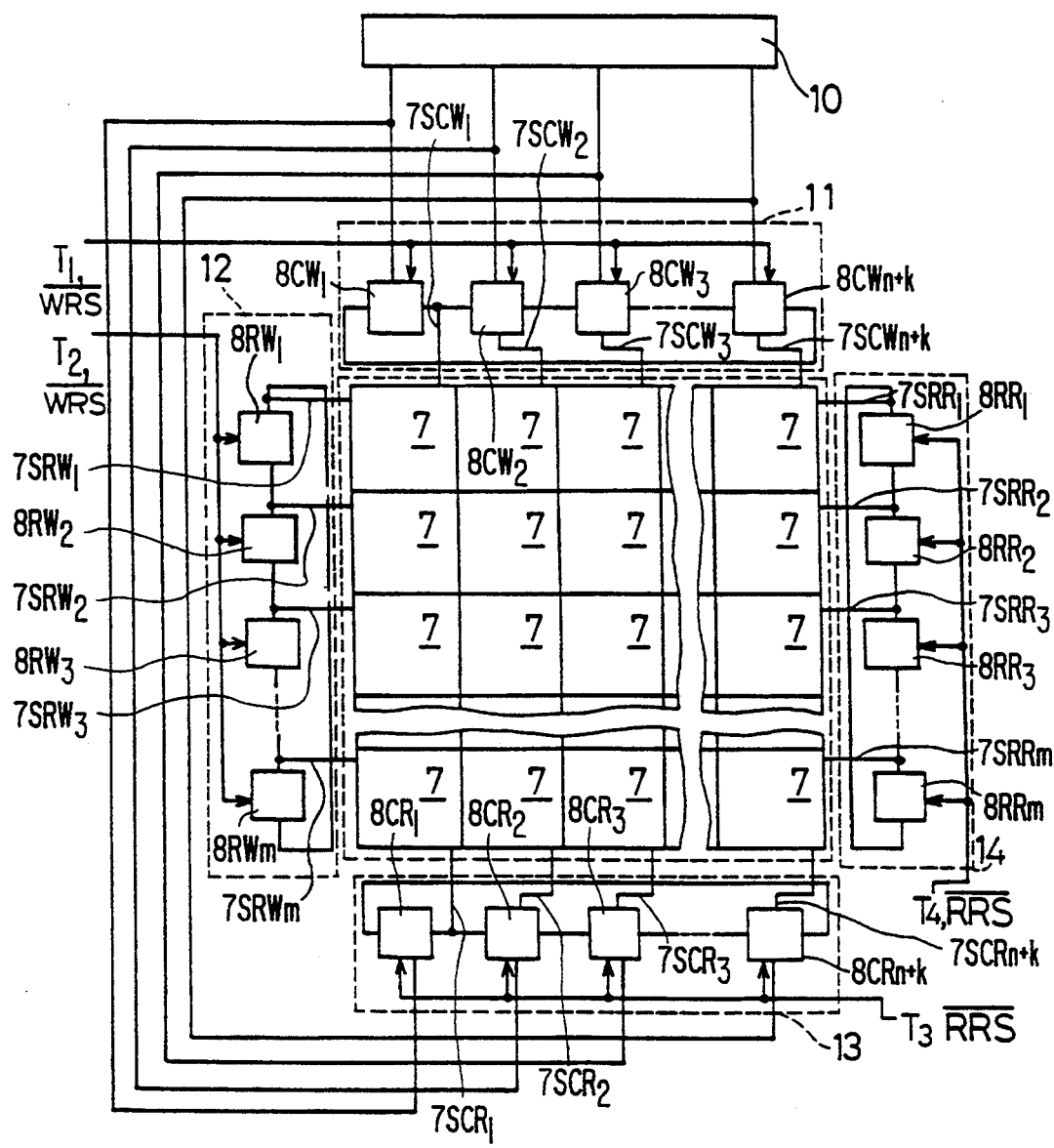
FIG. 2 is a partial block diagram of the semiconductor memory of a first preferred embodiment according to the present invention.

Referring to FIG. 2, a first preferred embodiment will be discussed below. FIG. 2 is a partial block diagram of the semiconductor memory of a first preferred embodiment according to the present invention. In FIG. 2, there is shown an arrangement corresponding to the memory cell array 1, input address part 3, output address part 5 and control circuit 6 of the semiconductor memory of FIG. 1. In FIG. 2, reference numeral 1 designates a memory cell array including $\{m \times (n+k)\}$ memory cells 7 arranged in matrix form having m rows and (n+k) columns. The (n+k) memory cells arranged in each row are connected to word lines provided in the corresponding row, and the m memory cells arranged in each column are connected to bit lines provided in the corresponding column. The plurality of memory cells arranged in n columns are regular memory cells, and the plurality of memory cells arranged in k columns are redundancy memory cells.

Reference characters $7SCW_1$ to $7SCW_{n+k}$ designate signal lines provided in corresponding relation to the respective columns of the memory cell array 1 and transmitting signals which control transfer gates connected between the bit lines and data input lines in the corresponding columns. The signal lines are column write memory cell selection lines for transmitting the signals for selecting the plurality of memory cells arranged in the corresponding columns in data write operation.

Reference characters $7SCR_1$ to $7SCR_{n+k}$ designate signal lines provided in corresponding relation to the respective columns of the memory cell array 1 and transmitting signals which control transfer gates connected between the bit lines and data output lines in the corresponding columns. The signal lines are column read memory cell selection lines for transmitting the signals for selecting the plurality of memory cells arranged in the corresponding columns in data read operation.

Reference characters $7SRW_1$ to $7SRW_m$ designate row write memory cell selection lines for transmitting the signals for energizing the word lines arranged in the corresponding rows in data write operation. The row write memory cell selection lines may be provided as part of the word lines.

Reference characters $7SRR_1$ to $7SRR_m$ designate row read memory cell selection lines for transmitting the signals for energizing the word lines arranged in the corresponding rows in data read operation. The row read memory cell selection lines may be provided as part of the word lines.

Reference numeral 11 designates a write bit address pointer forming the input address part which includes (n+k) in-series connected memory cell selecting portions or write bit pointer portions $8CW_1$ to $8CW_{n+k}$ provided in corresponding relation to the column write memory cell selection lines $7SCW_1$ to $7SCW_{n+k}$ and having column selection output nodes connected to the corresponding column write memory cell selection lines $7SCW_1$ to $7SCW_{n+k}$, respectively. The write bit pointer portion $8CW_1$ corresponding to the first column serving as a start position includes a flip-flop circuit, and each of the other write bit pointer portions $8CW_2$ to $8CW_{n+k}$ includes a flip-flop circuit having therein a data through circuit connected between the input and output nodes thereof for transmitting the information inputted to the input node as it is to the output node. The respective write bit pointer portions $8CW_1$ to $8CW_{n+k}$ of the write bit address pointer 11 are reset by a write reset signal $\overline{WRS}$. Then the write bit pointer portion $8CW_1$ outputs the signal for selection of the memory cells, at an "H" level potential herein, through the column write memory cell selection line $7SCW_1$, and the other write bit pointer portions $8CW_2$ to $8CW_{n+k}$ output the signals for non-selection of the memory cells, at an "L" level potential herein, through the column write memory cell selection lines $7SCW_2$ to $7SCW_{n+k}$. The respective write bit pointer portions $8CW_1$ to $8CW_{n+k}$ transmit the data for sequential selection of the column write memory cell selection lines to the next write bit pointer portion in synchronism with a write column clock signal $T_1$.

Reference numeral 12 designates a write word address pointer forming the input address part which includes m in-series connected memory cell selecting portions or write word pointer portions $8RW_1$ to $8RW_m$ provided in corresponding relation to the row write memory cell selection lines $7SRW_1$ to $7SRW_m$ and including flip-flop circuits having row selection output nodes connected to the corresponding row write memory cell selection lines $7SRW_1$ to $7SRW_m$, respectively. The respective write word pointer portions $8RW_1$ to $8RW_m$ of the write word address pointer 12 are reset by the write reset signal $\overline{WRS}$. Then the write word pointer portion $8RW_1$ outputs the signal for selection of the memory cells, at the "H" level potential herein, through the row write memory cell selection line $7SCW_1$, and the other write word pointer portions $8RW_2$ to $8RW_m$ output the signals for non-selection of the memory cells, at the "L" level potential herein, through the row write memory cell selection lines $7SRW_2$ to $7SRW_m$. The write word pointer portions $8RW_1$ to $8RW_m$ transmit the signal for sequential selection of the row write memory cell selection lines to the next write word pointer portion in synchronism with a write row clock signal $T_2$.

Reference numeral 13 designates a read bit address pointer forming the output address part which includes (n+k) in-series connected memory cell selecting portions or read bit pointer portions $8CR_1$ to $8CR_{n+k}$ provided in corresponding relation to the column read memory cell selection lines $7SCR_1$ to $7SCR_{n+k}$ and having column selection output nodes connected to the corresponding column read memory cell selection lines $7SCR_1$ to $7SCR_{n+k}$, respectively. The read bit pointer portion $8CR_1$ corresponding to the first column serving as a start position includes a flip-flop circuit, and each of the other read bit pointer portions $8CR_2$ to $8CR_{n+k}$ includes a flip-flop circuit having therein a data through circuit connected between the input and output nodes thereof for transmitting the information inputted to the input node as it is to the output node. The respective read bit pointer portions $8CR_1$ to $8CR_{n+k}$ of the read bit address pointer 13 are reset by a read reset signal $\overline{RRS}$. Then the read bit pointer portion $8CR_1$ outputs the signal for selection of the memory cells, at the "H" level potential herein, through the column read memory cell selection line $7SCR_1$, and the other read bit pointer portions $8CR_2$ to $8CR_{n+k}$ output the signals for non-selection of the memory cells, at the "L" level potential herein, through the column read memory cell selection lines $7SCR_2$ to $7SCR_{n+k}$. The respective read bit pointer portions $8CR_1$ to $8CR_{n+k}$ transmit the data for sequential selection of the column read memory cell selection lines to the next read bit pointer portion in synchronism with a read column clock signal $T_3$.

Reference numeral 14 designates a read word address pointer forming the output address part which includes m in-series connected memory cell selecting portions or read word pointer portions $8RR_1$ to $8RR_m$ provided in corresponding relation to the row read memory cell selection lines $7SRR_1$ to $7SRR_m$ and including flip-flop circuits having row selection output nodes connected to the corresponding row read memory cell selection lines $7SRR_1$ to $7SRR_m$, respectively. The respective read word pointer portions $8RR_1$ to $8RR_m$ of the read word address pointer 14 are reset by the read reset signal $\overline{RRS}$. Then the read word pointer portion $8RR_1$, outputs the signal for selection of the memory cells, at the "H" level potential herein, through the row read memory cell selection line $7SRR_1$, and the other read word pointer portions $8RR_2$ to $8RR_m$ output the signals for non-selection of the memory cells, at the "L" level potential herein, through the row read memory cell selection lines $7SRR_2$ to $7SRR_m$. The read word pointer portions $8RR_1$ to $8RR_m$ transmit the signal for sequential selection of the row read memory cell selection lines to the next read bit pointer portion in synchronism with a read row clock signal $T_4$. It should be noted that the write word address pointer 12 may be adapted to function also as the read word address pointer 14. In this case, the write bit address pointer 12 is controlled in the read operation by the read reset signal $\overline{RRS}$ and the read clock signal $T_4$ in place of the write reset signal $\overline{WRS}$ and the write clock signal $T_2$.

Reference numeral 10 designates a control circuit for outputting a control signal which controls the write bit pointer portions $8CW_1$ to $8CW_{n+k}$ of the write bit address pointer 11 and the read bit pointer portions $8CR_1$ to $8CR_{n+k}$ of the read bit address pointer 13. The operation of the control circuit 10 where there are no defective regular memory cells in the second to n-th columns will be described below. The control circuit 10 places in normal operation the flip-flop circuits of the write bit pointer portions $8CW_1$ to $8CW_n$ of the write bit address pointer 11 and the read bit pointer portions $8CR_1$ to $8CR_n$ of the read bit address pointer 13 in the first to n-th columns, and outputs to the pointer portions a control signal C which does not permit the data through circuits to operate, at the "H" level potential herein. The control circuit 10 also causes the write bit pointer portions $8CW_{n+1}$ to $8CW_{n+k}$ of the write bit address pointer 11 and the read bit pointer portions $8CR_{n+1}$ to $8CR_{n+k}$ of the read bit address pointer 13 in the (n+1)-th to (n+k)-th columns to output signals for non-selection of the bit lines, at the "L" level potential herein, from the column selection output nodes of the flip-flop circuits through the memory cell selection lines $7SCW_{n+1}$ to $7SCW_{n+k}$, and outputs the control signal C which places the data through circuits into operation or which permits electrical conduction between the input and output nodes, at the "L" level potential herein, to the pointer portions.

The operation of the control circuit 10 where there is a defective regular memory cell in the second to n-th columns will be described below. The control circuit 10 causes the write bit pointer portion of the write bit address pointer 11 and the read bit pointer portion of the read bit address pointer 13 in the column including the defective memory cell to output the signal for non-selection of the bit lines, at the "L" level potential herein, from the column selection output nodes of the flip-flop circuits through the memory cell selection lines, and outputs the control signal C which places the data through circuits into operation or which permits electrical conduction between the input and output nodes, at the "L" level potential herein, to the pointer portions. The control circuit 10 also places in normal operation the flip-flop circuits of the write bit pointer portions of the write bit address pointer 11 and the read bit pointer portions of the read bit address pointer 13 in the columns which do not include the defective memory cell, and outputs the control signal C which does not permit the data through circuits to operate, at the "H" level potential herein, to the pointer portions. Furthermore, the control circuit 10 places in operation the flip-flop circuits of the write bit pointer portion of the write bit address pointer 11 and the read bit pointer portion of the read bit address pointer 13 in one of the (n+1)-th to (n+k)-th columns including the redundancy memory cells which is substituted for the column including the defective memory cell, and outputs the control signal C which does not permit the data through circuits to operate, at the "H" level potential herein, to the pointer portions. The control circuit 10 also causes the write bit pointer portions of the write bit address pointer 11 and the read bit pointer portions of the read bit address pointer 13 in the columns including the redundancy memory cells which are not substituted for the regular memory cell column to output the signal for non-selection of the bit lines, at the "L" level potential herein, from the column selection output nodes of the flip-flop circuits, and outputs the control signal C which places the data through circuits into operation or which permits electrical conduction between the input and output nodes, at the "L" level potential herein, to the pointer portions.

Description will now be given on the detailed structure of the control circuit 10, the write bit pointer portions 8CW₁ to 8CW$_{n+k}$ of the write address pointer 11, the write word pointer portions 8RW₁ to 8RW$_m$ of the write word address pointer 12, the read bit pointer portions 8CR₁ to 8CR$_{n+k}$ of the read bit address pointer 13, and the read word pointer portions 8RR₁ to 8RR$_m$ of the read word address pointer 14.

Figure 3:
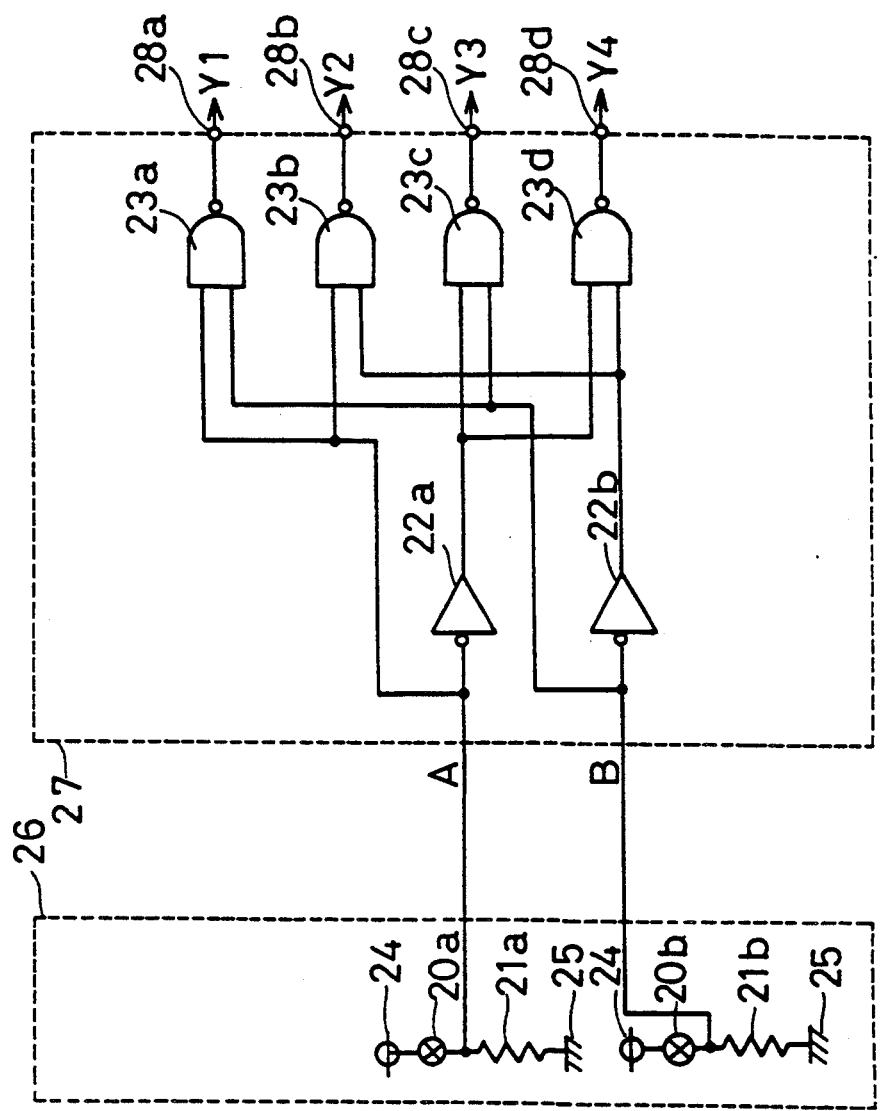
FIG. 3 is a circuit diagram of a control circuit for the semiconductor memory of FIG. 2.

Referring to FIG. 3, the control circuit 10 of FIG. 2 in the first preferred embodiment will be discussed hereinafter. In FIG. 3, reference numeral 24 designates a power supply; 25 designates ground; and 26 designates a programmable signal generator for generating the signal for memory cell selection. The signal generator 26 includes a plurality of fuses 20a, 20b connected at their first ends to the power supply 24, and a plurality of resistors 21a, 21b connected at their first ends to the second ends of the fuses 20a, 20b and grounded at their second ends. Reference numeral 27 designates a decoder portion including a plurality of inverters 22a, 22b and a plurality of NAND gates 23a to 23d. On receipt of the signals generated by the signal generator 26, the decoder portion 27 decodes the signals by means of the inverters 22a, 22b and the NAND gates 23a to 23d to output the control signal C. First ends of the resistors 21a, 21b are connected to the inputs of the inverters 22a, 22b, respectively. The output of the inverter 22a is connected to first inputs of the NAND gates 23c, 23d, and the output of the inverter 22b is connected to second inputs of the NAND gates 23b, 23d. First inputs of the NAND gates 23a, 23b are connected to the first end of the resistor 21a, and second inputs of the NAND gates 23a, 23c are connected to the first input of the resistor 21b. The outputs of the NAND gates 23a to 23d are connected to control signal output terminals 28a to 28d which output signals Y1 to Y4 as the control signal C, respectively. The signal at the "L" or "H" level potential is outputted to the first ends of the resistors 21a and 21b depending on whether or not the fuses 20a and 20b are cut off by means of laser blowing or the like. In order to selectively render the flip-flop circuits connected to the control circuit 10 inoperable, the fuses 20a, 20b connected to the inverters 22a, 22b are selectively cut off, whereby one of the outputs of the NAND gates 23a to 23d is permitted to become "L", as shown in Table 1, in the combination of the logical levels of signals A and B outputted at the first ends of the resistors 21a, 21b. In this circuit, the decoder portion 27 outputs the decoding signal which makes one of the plurality of flip-flop circuits inoperable by means of the combination of the flip-flop selection signals outputted from the signal generator 26. However, changes in circuit structure of the decoder portion permits the output of the decoding signal which makes some of the plurality of flip-flop circuits inoperable.

TABLE 1

| B | A | Y0 | Y1 | Y2 | Y3 |
|---|---|----|----|----|----|
| L | L | L  | H  | H  | H  |
| L | H | H  | L  | H  | H  |
| H | L | H  | H  | L  | H  |
| H | H | H  | H  | H  | L  |

In the semiconductor memory of FIG. 2, (n+k) outputs Y1 to Yn+k are required since the memory cells are arranged in m rows in (n+k) columns. For example, the output signals Y1 to Yn of the control circuit 10 are inputted to the write bit pointer portions 8CW₁ to 8CW$_n$ of the write bit address pointer 11 and to the read bit pointer portions 8CR₁ to 8CR$_n$ of the read bit address pointer 13, respectively. The output signals Yn+1 to Yn+k of the control circuit 10 are inputted to the write bit pointer portions 8CW$_{n+1}$ to 8CW$_{n+k}$ and to the read bit pointer portions 8CR$_{n+1}$ to 8CR$_{n+k}$, respectively. It is supposed that n=3 and k=1 in the control circuit of FIG. 3.

The fuses required for decoding, in the decoder portion 27, the output signals from the signal generator 26 which generates the flip-flop selection signal may be smaller in number than the flip-flop circuits. For example, where n=3 and k=1, two fuses 21a, 21b are sufficient. This enables the area for providing the fuses to be largely reduced if the pointer portions and accordingly the flip-flop circuits increase in number. The signal generator 26 may be provided in an arbitrary position independently of the position of the memory cell array 1. Thus the provision of the signal generator 26 in a position for ease of laser blowing or the like facilitates the fabrication of the semiconductor memory.

Figure 4:
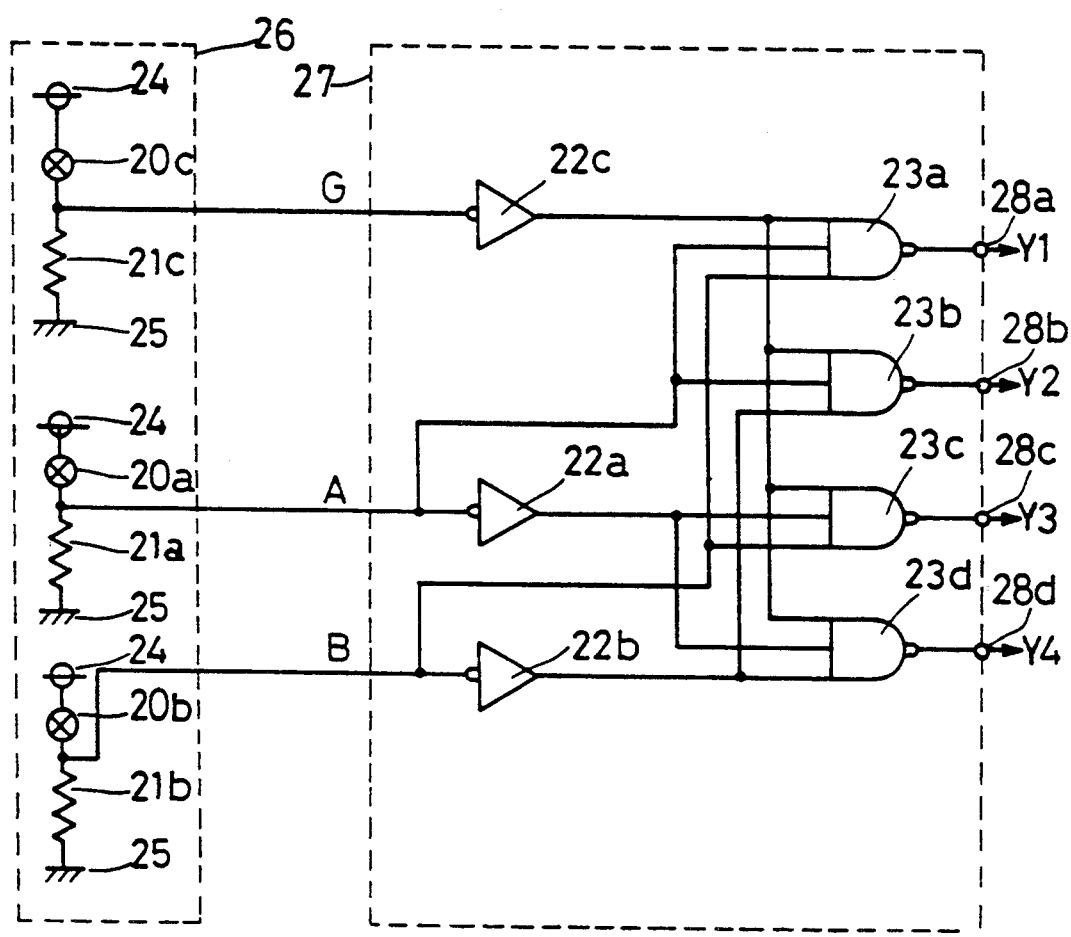
FIG. 4 is a circuit diagram of another control circuit for the semiconductor memory of FIG. 2.

In order to enable the use of all memory cells, a fuse 20c and a resistor 21c are additionally provided to add an output signal from the signal generator 26, as shown in FIG. 4. In FIG. 4, reference numeral 24 designates a power supply; 25 designates ground; 26 designates a programmable signal generator for generating the signal for memory cell selection. The signal generator 26 includes a plurality of fuses 20a to 20c connected at their first ends to the power supply 24 and a plurality of resistors 21a to 21c grounded at their second ends. Reference numeral 27 designates a decoder portion including a plurality of inverters 22a to 22c and the plurality of NAND gates 23a to 23d. On receipt of the signals generated in the signal generator 26, the decoder portion 27 decodes the signals by means of the inverters 22a to 22c and the NAND gates 23a to 23d to output the control signal C. First ends of the resistors 21a to 21c are connected to the inputs of the inverters 22a to 22c, respectively. The output of the inverter 22a is connected to second inputs of the NAND gates 23c, 23d. The output of the inverter 22b is connected to third inputs of the NAND gates 23b, 23d. The output of the inverter 22c is connected to first inputs of the NAND gates 23a to 23d. Second inputs of the NAND gates 23a, 23b are connected to the first end of the resistor 21a. Third inputs of the NAND gates 23a, 23c are connected to the first end of the resistor 21b. The outputs of the NAND gates 23a to 23d are connected to the control signal output terminals 28a to 28d which output the signals Y1 to Y4 as the control signal C, respectively. The signal at the "L" or "H" level potential is outputted to the first ends of the resistors 21a to 21c depending on whether or not the fuses 20a to 20c are cut off by means of laser blowing or the like.

In order to selectively render the flip-flop circuits connected to the control circuit 10 inoperable, the fuse 20c connected to the inverter 22c is cut off and the fuses 20a, 20b connected to the inverters 22a, 22b are selectively cut off, whereby one of the outputs of the NAND gates 23a to 23d is permitted to become "L", as shown in Table 2, in the combination of the logical levels of the signals A and B outputted at the first ends of the resistors 21a, 21b. No operation is required to render all memory cells operative.

TABLE 2

| G | B | A | Y0 | Y1 | Y2 | Y3 |
|---|---|---|----|----|----|----|
| H | X | X | H  | H  | H  | H  |
| L | L | L | L  | H  | H  | H  |

TABLE 2-continued

| G | B | A | Y0 | Y1 | Y2 | Y3 |
|---|---|---|----|----|----|----|
| L | L | H | H  | L  | H  | H  |
| L | H | L | H  | H  | L  | H  |
| L | H | H | H  | H  | H  | L  |

X: "H" or "L"

Figure 5:
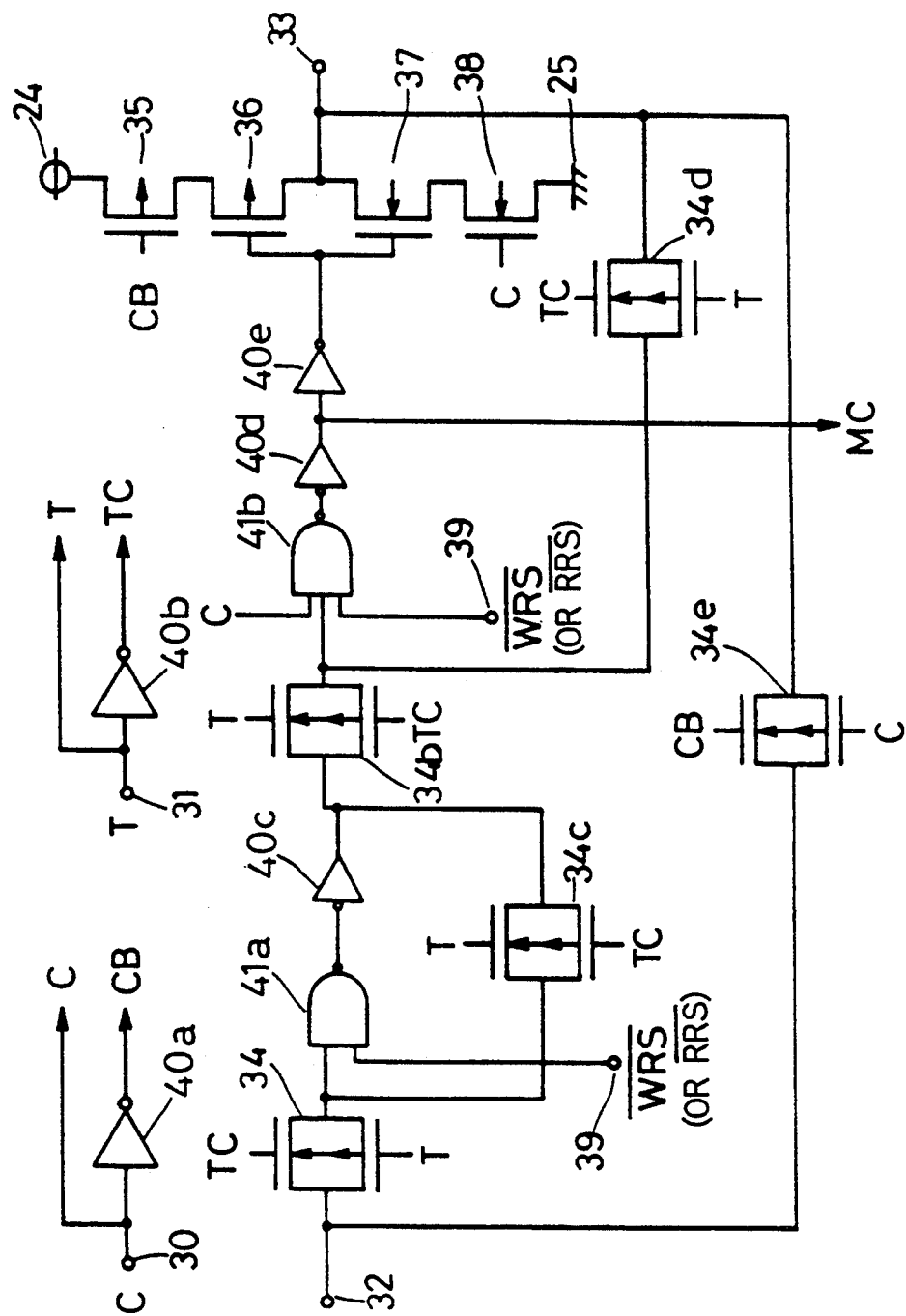
FIG. 5 is a circuit diagram of a flip-flop circuit including a data through circuit for the semiconductor memory of FIG. 2.

Referring now to FIG. 5, description will be given on the circuit structure of the flip-flop circuits for use in the write bit pointer portions $8CW_2$ to $8CW_{n+k}$ of the write bit address pointer 11 and the read bit pointer portions $8CR_2$ to $8CR_{n+k}$ of the read bit address pointer 13. In FIG. 5, reference numeral designates a control terminal receiving the control signal C from the control circuit 10 of FIG. 2; 31 designates a clock signal input terminal which receives the clock signal $T_1$ of FIG. 2 for the write bit pointer portions $8CW_2$ to $8CW_{n+k}$ and receives the clock signal $T_3$ for the read bit pointer portions $8CR_2$ to $8CR_{n+k}$. The clock signals $T_1$ and $T_3$ are referred to as a clock signal T hereinafter.

Reference numeral 32 designates an input terminal receiving the output signal from a slave latch circuit included in the preceding flip-flop circuit; 33 designates an output terminal outputting an output signal to an input terminal of a master latch circuit included in the succeeding flip-flop circuit; and 34a to 34e designate transmission gates including PMOS transistors and NMOS transistors. The transmission gate 34a is connected at its first end to the input terminal 32 and turns on/off in synchronism with the logically inverted signal of the clock signal T. The transmission gate 34b is provided between the master latch circuit and the slave latch circuit and turns on/off in synchronism with the clock signal T. The transmission gate 34d is connected at its first end to the output terminal 33 and connected at its second end to a second end of the transmission gate 34b, and turns on/off in synchronism with the logically inverted signal of the clock signal T. The transmission gate 34c is connected at its first end to a second end of the transmission gate 34a and connected at its second end to a first end of the transmission gate 34b, and turns on/off in synchronism with the clock signal T. Reference numeral 35 designates a PMOS transistor having a source electrode connected to the power supply 24 and a gate electrode receiving the logically inverted signal CB of the control signal; 38 designates an NMOS transistor having a grounded source electrode and a gate electrode receiving the control signal C; 36 and 37 designate PMOS and NMOS transistors connected in series between the transistors 35 and 38 and having the gate electrodes connected in common to form an inverter; 39 designates a reset signal input terminal receiving the reset signal $\overline{WRS}$ or $\overline{RRS}$ of FIG. 2; 40a to 40e designate inverters; and 41a, 41b designate NAND gates. A first input of the NAND gate 41a is connected to a second end of the transmission gate 34a, and a second input thereof is connected to the reset signal input terminal 39. The input of the inverter 40c is connected to the output of the NAND gate 41a. A first input of the NAND gate 41b is connected to a second end of the transmission gate 34b, and a second input thereof is connected to the reset signal input terminal 39, while a third input thereof receives the control signal C. The output of the NAND gate 41b is connected to the input of the inverter 40d. The output of the inverter 40d is connected to the input of the inverter 40e. The output of the inverter 40c is connected to gate electrodes of the MOS transistors 36, 37. Drain electrodes of the MOS transistors 36, 37 are connected to the output terminal 33. The inverter 40d outputs a memory cell selection signal MC. The input of the inverter 40b is connected to the dock signal input terminal 31.

The control signal C inputted to the control terminal 30 is separated into the signals C and CB, the control signal C being transmitted as it is to the respective portions, the signal CB being obtained by inverting the control signal C in the inverter 40a. The control signal C is inputted to the gate of the MOS transistor 38 and to the transmission gate 34e and the NAND gate 41b. The signal CB is inputted to the gate of the MOS transistor 35 and to the transmission gate 34e. The clock signal T inputted from the clock signal input terminal 31 is separated into the dock signal T and an inverted clock signal TC, the signal T being transmitted as it is to the respective portions, the signal TC being obtained by inverting the clock signal T in the inverter 40b. The clock signal T and the inverted clock signal TC are inputted to the transmission gates 34a to 34d.

Now described is the operation when the control signal C is "H" and the reset signals $\overline{WRS}$ and $\overline{RRS}$ are "H". Since the control signal C is "H", the transmission gate 34e is off. Since the reset signals $\overline{WRS}$ and $\overline{RRS}$ are "H", the NAND gate 41a carries out the same operation as the inverter in response to the signal inputted to its first input. Since the control signal C is "H" and the reset signals WRS and RRS are "H", the NAND gate 41b also carries out the same operation as the inverter. Since the control signal C is "H", the MOS transistors 35, 38 are on, and the inverter including the MOS transistors 36, 37 is connected between the power supply 24 and the ground 25 to be rendered operable. Thus the flip, flop circuit carries out the normal operation.

Data inputted to the input terminal 32 is transmitted from the master latch circuit including the NAND gate 41a, the inverter 40c and the transmission gate 34c to the slave latch circuit including the inverters 40d, 40e, the NAND gate 41b, the MOS transistors 36, 37 and the transmission gate 34d in synchronism with the clock signal T inputted to the transmission gates 34a to 34d. Then the data is outputted from the output terminal 33. Data latched by the slave latch circuit is outputted as the memory cell selection signal MC.

Then described is the operation when the control signal C is "L" and the reset signals $\overline{WRS}$ and $\overline{RRS}$ are "H". Since the control signal C is "L", the transmission gate 34e is on. Since the reset signals $\overline{WRS}$ and $\overline{RRS}$ are "H", the NAND gate 41a carries out the same operation as the inverter in response to the signal inputted to its first input. Since the control signal C is "L" and the reset signals $\overline{WRS}$ and $\overline{RRS}$ are "H", the NAND gate 41b also carries out the same operation as the inverter in response to the signal inputted to its first input. However, since the control signal C is "L", the MOS transistors 35, 38 are off, and the inverter including the MOS transistors 36, 37 is disconnected from the power supply. Then the flip-flop circuit does not carry out the normal operation. The signal inputted to the input terminal 32 passes through the transmission gate 34e and is directly transmitted to the next flip-flop circuit. Data latched by the master latch circuit in the flip-flop circuit is transmitted to the slave latch circuit in synchronism with the clock signal T. In the slave latch circuit, the memory cell selection signal MC is fixed to "L" by the control signal C inputted to the NAND gate 41b. The transmission gate 34e serves as the data through circuit connected between the input terminal 32 and the output terminal 33.

When the flip-flop circuit does not carries out the normal operation, the inverter including the MOS transistors 36, 37 does not operate, so that data is not held in and not outputted from the slave latch circuit. Thus the flip-flop circuit includes a flip-flop operation shut-off means which does not permit the operation of the flip-flop circuit. The input terminal 32 and output terminal 33 of the flip-flop circuit need not be open for disconnection of the master and slave latch circuits of the respective write and read bit pointer portions $8CW_{n+1}$ to $8CW_{n+k}$ and $8CR_{n+1}$ to $8CR_{n+k}$ of the write and read bit address pointers 11 and 13. In addition, such arrangement provides a stable circuit operation, no abnormal current flow in the inverters and NAND gates of the respective flip-flop circuits, and a small amount of power consumption.

Figure 6:
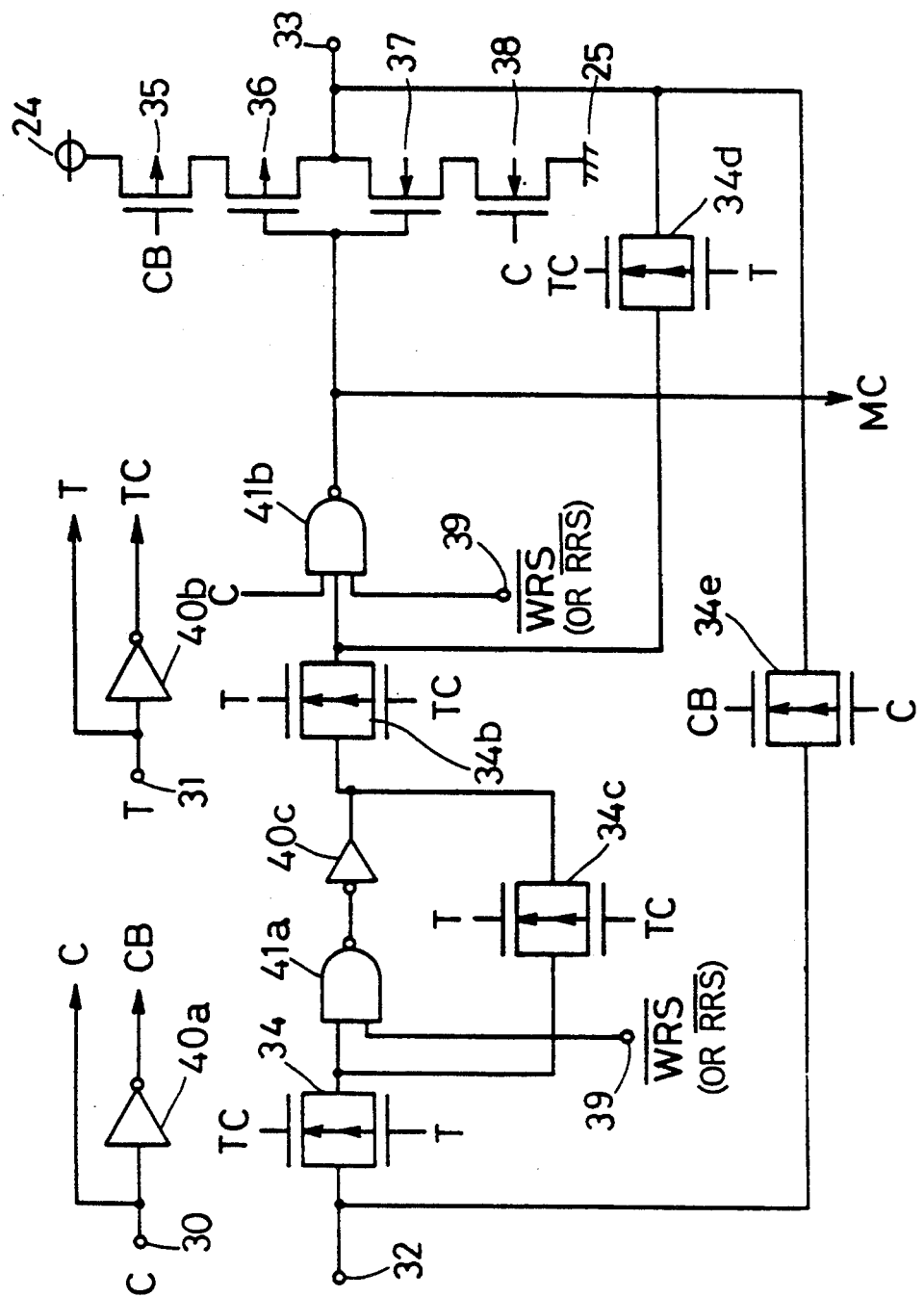
FIG. 6 is a circuit diagram of another flip-flop circuit including a data through circuit for the semiconductor memory of the first preferred embodiment.

Although the flip-flop circuit including the data through circuit of FIG. 5 outputs the memory cell selection signal MC at the "H" level, the signal for memory cell selection may be set to the "L" level potential. In this case, since the memory cell selection signal MC at the "L" level is outputted, the circuit shown in FIG. 6 does not include the inverters 40d and 40e of FIG. 5.

Figure 7:
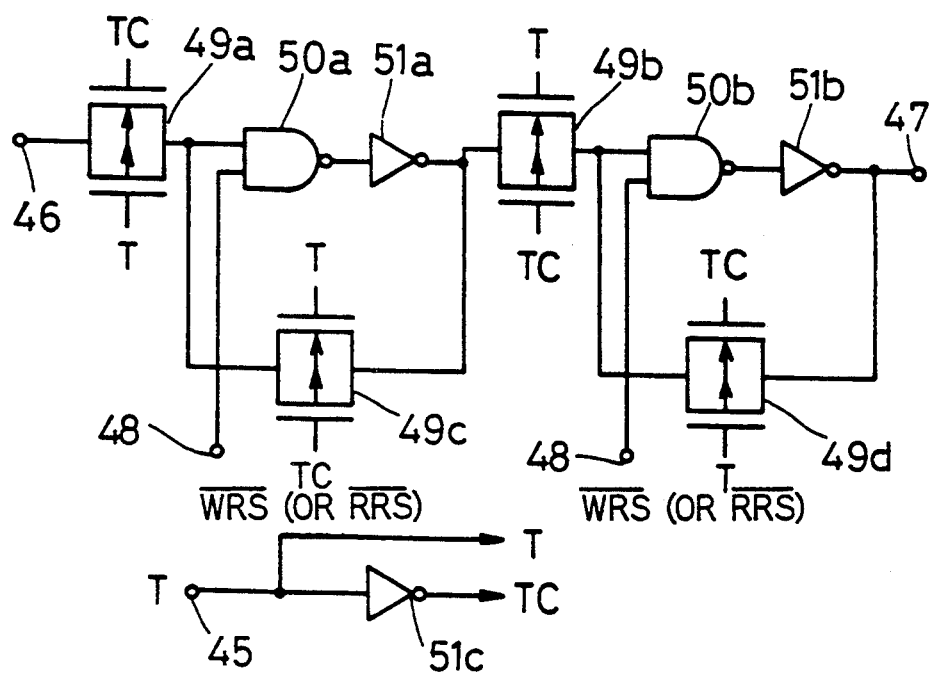
FIGS. 7 and 8 are circuit diagrams of flip-flop circuits for the semiconductor memory of FIG. 2.

Referring to FIG. 7, description will be given on the flip-flop circuits for use in the write word pointer portions $8RW_2$ to $8RW_m$ of the write word address pointer 12 and the read word pointer portions $8RR_2$ to $8RR_m$ of the read word address pointer 14. In FIG. 7, reference numeral 45 designates a clock signal input terminal which receives the clock signal $T_2$ of FIG. 2 for the write word pointer portions $8RW_2$ to $8RW_m$ and receives the clock signal $T_4$ for the read word pointer portions $8RR_2$ to $8RR_m$. The clock signals $T_2$ and $T_4$ are referred to as a clock signal T hereinafter.

In FIG. 7, reference numeral 46 designates an input terminal receiving the output signal from a slave latch circuit included in the preceding flip-flop circuit; 47 designates an output terminal outputting an output signal to an input terminal of a master latch circuit included in the succeeding flip-flop circuit; and 49a to 49d designate transmission gates including PMOS transistors and NMOS transistors. The transmission gate 49a is connected at its first end to the input terminal 46 and turns on/off in synchronism with the logically inverted signal of the clock signal T. The transmission gate 49b is provided between the master latch circuit and the slave latch circuit and turns on/off in synchronism with the clock signal T. The transmission gate 49d is connected at its first end to the output terminal 47 and connected at its second end to a second end of the transmission gate 49b, and turns on/off in synchronism with the logically inverted signal of the clock signal T. The transmission gate 49c is connected at its first end to the transmission gate 49a and connected at its second end to a first end of the transmission gate 49b, and turns on/off in synchronism with the clock signal T. Reference numeral 48 designates a reset signal input terminal receiving the reset signal $\overline{WRS}$ or $\overline{RRS}$ of FIG. 2; 51a to 51c designate inverters; and 50a, 50b designate NAND gates. A first input of the NAND gate 50a is connected to a second end of the transmission gate 49a, and a second input thereof is connected to the reset signal input terminal 48. The input of the inverter 51a is connected to the output of the NAND gate 50a. A first input of the NAND gate 50b is connected to a second end of the transmission gate 49b, and a second input thereof is connected to the reset signal input terminal 48. The input of the inverter 51b is connected to the output of the NAND gate 50b. The input of the inverter 51c is connected to the clock signal input terminal 45.

The clock signal T inputted from the clock signal input terminal 45 is separated into the clock signal T and the inverted clock signal TC, the signal T being transmitted as it is to the respective portions, the signal TC being obtained by inverting the clock signal T in the inverter 51b. The clock signal T and the inverted clock signal TC are inputted to the transmission gates 49a and 49b.

When the reset signals $\overline{WRS}$ and $\overline{RRS}$ are "H", the NAND gate 50a carries out the same operation as the inverter in response to the signal inputted to its first input. Data inputted from the input terminal 42 is transmitted to the master latch circuit including the NAND gate 50a connected to the input terminal 42 through the transmission gate 44a, the inverter 51a, and the transmission gate 49b in synchronism with the inputted clock signal T. Then the data in the master latch circuit is transmitted to the slave latch circuit including the NAND gate 50b, the inverter 51b, and the transmission gate 49d, and is in turn outputted from the output terminal 47. The data outputted from the output terminal 47 is inputted to the input terminal of the next flip-flop circuit. When the reset signals $\overline{WRS}$ and $\overline{RRS}$ are "L", the outputs of the NAND gates 50a and 50b are "H". Then the data held in the master and slave latch circuits is entirely cleared to "L", and the flip-flop circuit enters a second reset state.

Figure 8:
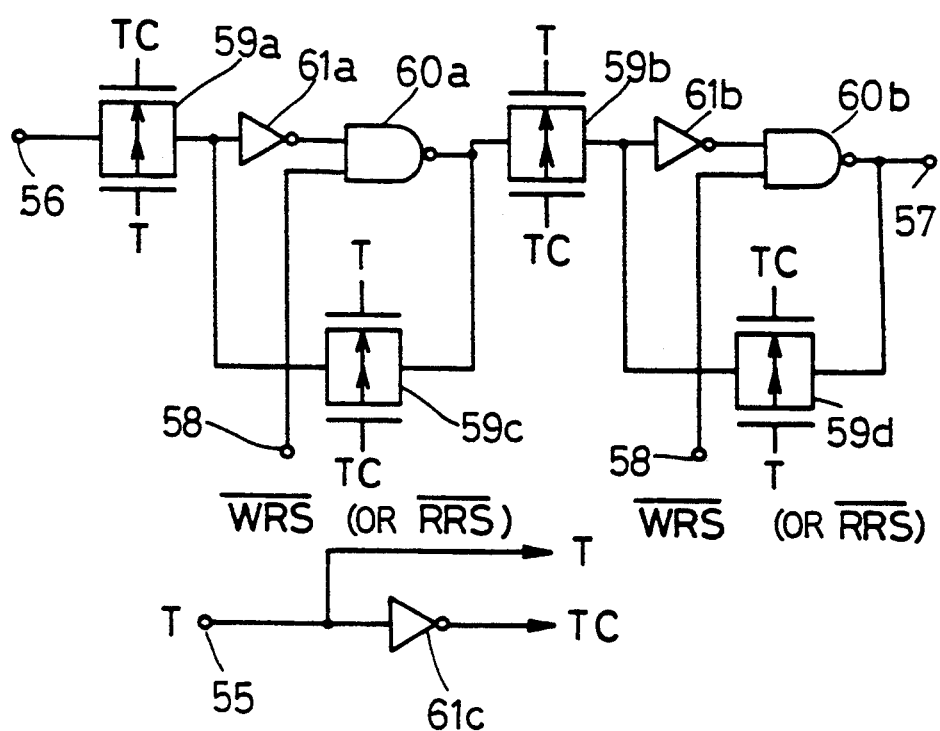

Referring to FIG. 8, description will be given on the flip-flop circuits for use in the write bit pointer portion $8CW_1$ of the write bit address pointer 11, the write word pointer portion $8RW_1$ of the write word address pointer 12, the read bit pointer portion $8CR_1$ of the read bit address pointer 13, and the read word pointer portion $8RR_1$ of the read word address pointer 14. These flip-flop circuits, on receipt of the reset signals $\overline{WRS}$ and $\overline{RRS}$, produce data in the master latch circuit and the slave latch circuit to serve as a start address, so that they have different structure from other flip-flop circuits.

In FIG. 8, reference numeral 55 designates a clock signal input terminal receiving the clock signal of FIG. 2. The inputted clock signal T is the signal $T_1$ for the write bit pointer portion $8CW_1$, the signal $T_2$ for the write word pointer portion $8RW_1$, the signal $T_3$ for the read bit pointer portion $8CR_1$, and the signal $T_4$ for the read word pointer portion $8RR_1$. Reference numeral 56 is an input terminal receiving the output signal of the slave latch circuit of the preceding flip-flop circuit; 57 designates an output terminal outputting an output signal to the input terminal of the master latch circuit of the succeeding flip-flop circuit; 58 designates a reset signal input terminal receiving the reset signal $\overline{WRS}$ or $\overline{RRS}$ of FIG. 2; and 59a to 59d designate transmission gates including PMOS and NMOS transistors. The transmission gate 59a is connected at its first end to the input terminal 56 and turns on/off in synchronism with the logically inverted signal of the clock signal T. The transmission gate 59b is provided between the master latch circuit and the slave latch circuit and turns on/off in synchronism with the clock signal T. The transmission gate 59d is connected at its first end to the output terminal 57 and connected at its second end to a second end of the transmission gate 59b, and turns on/off in synchronism with the logically inverted signal of the clock signal T. The transmission gate 59c is connected at its first end to the transmission gate 59a and connected at its second end to a first end of the transmission gate 59b, and turns on/off in synchronism with the clock signal T. Reference characters 61a to 61c designate inverters; and 60a, 60b designate NAND gates. The input of the inverter 61c is connected to the clock signal input terminal 55, and the output thereof is connected to the input of the NAND gate 60a. A first input of the NAND gate 60a is connected to the output of the inverter 61a, and a second input thereof is connected to the reset signal input terminal 58. The inverter 61b is connected at its first input to the second end of the transmission gate 59b and connected at its second input to the reset signal input terminal 58.

The clock signal T inputted from the clock signal input terminal 51 is separated into the clock signal T and the inverted clock signal TC, the signal T being transmitted as it is to the respective portions, the signal TC being obtained by inverting the clock signal T in the inverter 61b. The clock signal T and the inverted clock signal TC are inputted to the gates of the MOS transistors of the transmission gates 59a to 59d.

The operation of the flip-flop circuits will be discussed below. On receiving the reset signals $\overline{WRS}$ and $\overline{RRS}$ at the "L" level, with the clock signal T being "L", data at the "H" level is applied to and held in the master latch circuit including the inverter 61a, the NAND gate 60a, and the transmission gate 59c. The slave latch circuit including the NAND gate 60b, the inverter 61b and the transmission gate 59b enters a first reset state in which the data at the "H" level is held.

When the reset signals $\overline{WRS}$ and $\overline{RRS}$ turn to the "H" level, data at the "H" level is transmitted from the master latch circuit to the slave latch circuit in synchronism with the clock signal T to be held therein. The slave latch circuit then outputs the memory cell selection signal to the memory cell selection line connected to the output terminal 57 and outputs data for selection of the memory cell selection line to the succeeding flip-flop circuit. The flip-flop circuit having such arrangement is connected in series in the first position of the address part for the purpose of determining the first flip-flop circuit for outputting data of the address part immediately after reset.

Description will be given hereinafter on the operation of the semiconductor memory of the first preferred embodiment.

The write operation where there is no defective regular memory cell in the memory cell array 1 will be now described below. For selection of the regular memory cells, it is necessary to place the write bit pointer portions $8CW_1$ to $8CW_n$ into normal operation. For this purpose, the control circuit 10 outputs the control signal C at the "H" level potential to the write bit pointer portions $8CW_1$ to $8CW_n$. At the same time, for non-selection of the redundancy memory cells, it is necessary to place into operation the data through circuits included in the write bit pointer portions $8CW_{n+1}$ to $8CW_{n+k}$ while the write bit pointer portions $8CW_{n+1}$ to $8CW_{+k}$ do not function as the flip-flop circuits. For this purpose, the control circuit 10 outputs the control signal C at the "L" level potential to the write bit pointer portions $8CW_{n+1}$ to $8CW_{n+k}$.

Under the foregoing establishments, when the reset signal $\overline{WRS}$ is inputted to the write bit address pointer 11, the write bit pointer portion $8CW_1$ is reset to enter the first reset state. The write bit pointer portion $8CW_1$ produces and holds data for memory cell selection and outputs the signal for memory cell selection through the memory cell selection line $7SCW_1$. Simultaneously with the input of the reset signal $\overline{WRS}$, the write bit pointer portions $8CW_2$ to $8CW_n$, if having data for memory cell selection, are reset to enter the second reset state, and the data thereof are erased. Similarly, when the reset signal $\overline{WRS}$ is inputted to the write word address pointer 12, the write word pointer portion $8RW_1$ is reset to enter the first reset state. The write word pointer portion $8RW_1$, produces and holds data for memory cell selection and outputs the signal for memory cell selection through the memory cell selection line $7SRW_1$. Simultaneously with the input of the reset signal $\overline{WRS}$, the write word pointer portions $8RW_2$ to $8RW_m$, if having data for memory cell selection, are reset to enter the second reset state, and the data thereof are erased. Then data is written only into the memory cell corresponding to both the memory cell selection line $7SCW_1$ connected to the write bit pointer portion $8CW_1$ and the memory cell selection line $7SRW_1$ connected to the write word pointer portion $8RW_1$.

The data transmitted to the memory cell array 1 from the input circuit 2 of FIG. 1, as is not shown in FIG. 2, is written into the memory cell selected by the write bit pointer portion of the write bit address pointer 11 and the write word pointer portion of the write word address pointer 12 which form the input address part 3. When the write bit address pointer 11 includes the flip-flop circuits, for example, of FIGS. 5 and 7, the data is shifted to the next write bit pointer portion $8CW_2$ as the clock signal $T_1$ proceeds two cycles. The memory cell selection line $7SCW_2$ outputs the signal for memory cell selection, and the data is written into the memory cell selected by the memory cell selection lines $7SCW_2$ and $7SRW_1$ at the intersection thereof. As the cycles of the clock signal $T_1$ proceed, the data is shifted sequentially to the succeeding write bit pointer portions, and the data is sequentially written into the n memory cells in the first row as the columns are shifted. The write bit pointer portion $8CW_{n+1}$, in turn, is designed by the control signal C from the control circuit 10 not to operate as the flip-flop circuit but to operate the data through circuit. Therefore the data is not held in the write bit pointer portion $8CW_{n+1}$ but is transmitted to the next write bit pointer portion $8CW_{n+2}$ through the data through circuit. The write bit pointer portion $8CW_{n+2}$ is also designed by the control signal C from the control circuit 10 not to operate as the flip-flop circuit but to operate the data through circuit. The data is not held in the write bit pointer portion $8CW_{n+2}$ but is transmitted as it is to the next write bit pointer portion $8CW_{n+3}$. The data passes through the write bit pointer portions $8CW_{n+1}$ to $8CW_{n+k}$ without the write operation. As a result, the data is transmitted from the write bit pointer portion $8CW_n$ directly to the write bit pointer portion $8CW_1$ through the data through circuits of the write bit pointer portions $8CW_{n+1}$ to $8CW_{n+k}$.

Normally, the clock signal $T_2$ proceeds as the data makes a round in the write bit address pointer 11, and then the data is shifted to the next write word pointer portion $8RW_2$ in the write word address pointer 12. The same operation as executed in the memory cells in the first row is repeated in the memory cells in the second to last rows. The number of times the data travels round in the write bit address pointer 11 until the data of the write word address pointer 12 is shifted to the next write word pointer portion is arbitrarily selected by the setting of the clock signals $T_1$ and $T_2$. The data of the write bit pointer portion of the write bit address pointer 11 may be adapted to be provided sequentially each time the data travels round in the write word address pointer 12. The write operation of data into the memory cells arranged in m rows in n columns is achieved in this manner.

The read operation of data from the memory cells where there is no defective regular memory cell will be now described below. For selection of the regular memory cells, it is necessary to place the read bit pointer portions $8CR_1$ to $8CR_n$ into normal operation. For this purpose, the control circuit !0 outputs the control signal C at the "H" level potential to the read bit pointer portions $8CR_1$ to $8CR_n$. At the same time, for non-selection of the redundancy memory cells, it is necessary to inhibit the flip-flop operation of the read bit pointer portions $8CR_{n+1}$ to $8CR_{n+k}$ and to place the data through circuits into operation. For this purpose, the control circuit 10 outputs the control signal C at the "L" level potential to the read bit pointer portions $8CR_{n+1}$ to $8CR_{n+k}$.

Under the foregoing establishments, when the reset signal $\overline{RRS}$ is inputted to the read bit address pointer 13, the read bit pointer portion $8CR_1$ is reset to enter the first reset state. The read bit pointer portion $8CR_1$ produces and holds data for memory cell selection and outputs the signal for memory cell selection through the memory cell selection line $7SCR_1$. Simultaneously with the input of the reset signal $\overline{RRS}$, the read bit pointer portions $8CR_2$ to $8CR_n$, if having data for memory cell selection, are reset to enter the second reset state, and the data thereof are erased. Similarly, when the reset signal $\overline{RRS}$ is inputted to the read word address pointer 14, the read word pointer portion $8RR_1$ is reset to enter the first reset state. The read word pointer portion $8RR_1$ produces and holds data for memory cell selection and outputs the signal for memory cell selection through the memory cell selection line $7SRR_1$. Simultaneously with the input of the reset signal $\overline{RRS}$, the read word pointer portions $8RR_2$ to $8RR_m$, if having data for memory cell selection, are reset to enter the second reset state, and the data thereof are erased. Then data is read only from the memory cell corresponding to both the memory cell selection line $7SCR_1$ of the read bit pointer portion $8CR_1$ and the memory cell selection line $7SRR_1$ of the read word pointer portion $8RR_1$. Data which is read is transmitted to the output circuit 4 of FIG. 1 from the memory cell of the memory cell array 1 which is selected by the read bit address pointer 13 and the read word address pointer 14 that form the output address part 5, as is not shown in FIG. 2. When the read bit address pointer 13 includes the flip-flop circuits, for example, of FIGS. 5 and 7, the data is shifted to the next read bit pointer portion $8CR_2$ as the clock signal $T_3$ proceeds two cycles. The memory cell selection line $7SCR_2$ outputs the signal for memory cell selection, and the data is read from the memory cell corresponding to the memory cell selection lines $7SCR_2$ and $7SRR_1$. As the cycles of the clock signal $T_3$ proceed, the data is shifted sequentially to the succeeding read bit pointer portions, and the data is sequentially read from the n memory cells in the first row as the columns are shifted. The read bit pointer portion $8CR_{n+1}$, in turn, is designed by the control signal C from the control circuit 10 not to operate as the flip-flop circuit but to operate the data through circuit. Therefore the data is not held in the read bit pointer portion $8CR_{n+1}$ but is transmitted to the next read bit pointer portion $8CR_{n+2}$ through the data through circuit. The read bit pointer portion $8CR_{n+2}$ is also designed by the control signal C from the control circuit 10 not to operate as the flip-flop circuit but to operate the data through circuit. The data is not held in the read bit pointer portion $8CR_{n+2}$ but is transmitted as it is to the next read bit pointer portion $8CR_{n+3}$. The data passes through the read bit pointer portions $8CR_{n+1}$ to $8CR_{n+k}$ without the read operation. As a result, the data is transmitted from the read bit pointer portion $8CR_n$ directly to the read bit pointer portion $8CR_1$ through the data through circuits of the read bit pointer portions $8CR_{n+1}$ to $8CR_{n+k}$.

Normally, the clock signal $T_4$ proceeds as the data makes a round in the read bit address pointer 13, and then the data is shifted to the next read word pointer portion $8RR_2$ in the read word address pointer 14. The same operation as executed in the memory cells in the first row is repeated in the memory cells in the second to last rows. The number of times the data travels round in the read bit address pointer 13 until the data of the mad word address pointer 14 is shifted to the next read word pointer portion is arbitrarily selected by the setting of the clock signals $T_3$ and $T_4$. The data of the read bit pointer portion of the read bit address pointer 13 may be adapted to be provided sequentially each time the data travels round in the read word address pointer 14. The read operation of data from the memory cells arranged in m rows in n columns is achieved in this manner.

Since the memory cells are of two-port type, the write and read operations are independently carried out. Setting to read the written data is achieved by the setting of the timings of the clock signals $T_1$ to $T_4$.

The write operation where there is a defective regular memory cell in the memory cell array 1 will be now described below. For the purpose of simplification, the memory cell array 1 is assumed to have m rows and four columns, the fourth column being the redundancy memory cell column. It is assumed that the fault is caused, for example, in a memory cell 7 in the third column. For selection of the undefective memory cell columns, it is necessary to place the write bit pointer portions $8CW_1$, $8CW_2$ and $8CW_4$ into normal operation. For this purpose, the control circuit 10 outputs the control signal C at the "H" level potential to the write bit pointer portions $8CW_1$, $8CW_2$ and $8CW_4$. At the same time, for non-selection of the third defective memory cell column, it is necessary to inhibit the flip-flop operation of the write bit pointer portion $8CW_3$ and to place the data through circuit thereof into operation. For this purpose, the control circuit 10 outputs the control signal C at the "L" level potential to the write bit pointer portion $8CW_3$.

Under the foregoing establishments, when the reset signal $\overline{WRS}$ is inputted to the write bit address pointer 11, the write bit pointer portion $8CW_1$ is reset, to produce and hold data for memory cell selection and to output the signal for memory cell selection through the memory cell selection line $7SCW_1$. Simultaneously with the input of the reset signal $\overline{WRS}$, the write bit pointer portions $8CW_2$ to $8CW_4$, if having data for memory cell selection, are reset and the data thereof are erased. Similarly, when the reset signal $\overline{WRS}$ is inputted to the write word address pointer 12, the write word pointer portion $8RW_1$ is reset, to produce and hold data for memory cell selection and to output the signal for memory cell selection through the memory cell selection line $7SRW_1$. Simultaneously with the input of the reset signal $\overline{WRS}$, the write word pointer portions $8RW_2$ to $8RW_m$, if having data for memory cell selection, are reset and the data thereof are erased. Then data is written only into the memory cell corresponding to both the memory cell selection line $7SCW_1$ of the write bit pointer portion $8CW_1$ and the memory cell selection line $7SRW_1$ of the write word pointer portion $8RW_1$. The data is shifted to the next write bit pointer portion $8CW_2$ in synchronism with the clock signal $T_1$, and the data is written into the memory cell corresponding to both the memory cell selection lines $7SCW_2$ and $7SRW_1$. The write bit pointer portion $8CW_3$, in turn, is designed by the control signal from the control circuit 10 not to operate as the flip-flop circuit but to operate the data through circuit. Therefore the data for memory cell selection is not held in the write bit pointer portion $8CW_3$ but is transmitted to the next write bit pointer portion $8CW_4$. The write bit pointer portion $8CW_4$, which is that for redundancy memory cell selection, is designed by the control signal C from the control circuit 10 to carry out the normal flip-flop circuit operation. Therefore the data for memory cell selection is held in the write bit pointer portion $8CW_4$ and the memory cell selection line $7SCW_4$ outputs the signal for selection of the memory cells 7. The data passes through the write bit pointer portion $8CW_3$ without the write operation, so that the defective memory cell is not selected. Normally, the clock signal $T_2$ proceeds as the data makes a round in the write bit address pointer 11, and then the data is shifted to the next write word pointer portion $8RW_2$ in the write word address pointer 12. The same operation as executed in the memory cells in the first row is repeated in the memory cells in the second to last rows. The write operation of data into the memory cells arranged in m rows in three columns in the memory cell array 1 is achieved in this manner.

The read operation of data from the memory cells where there is a defective regular memory cell will be now described below. The memory cell array 1 is assumed to have the same structure as that in the write operation. For selection of the undefective memory cell columns, it is necessary to place the read bit pointer portions $8CR_1$, $8CR_2$ and $8CR_4$ into normal operation. For this purpose, the control circuit 10 outputs the control signal C at the "H" level potential to the read bit pointer portions $8CR_1$, $8CR_2$ and $8CR_4$. At the same time, for non-selection of the third defective memory cell column, it is necessary to inhibit the flip-flop operation of the read bit pointer portion $8CR_3$ and to place the data through circuit thereof into operation. For this purpose, the control circuit 10 outputs the control signal C at the "L" level potential to the read bit pointer portion $8CR_3$.

Under the foregoing establishments, when the reset signal $\overline{RRS}$ is inputted to the read bit address pointer 13 and the read word address pointer 14, the read bit pointer portion $8CR_1$ and the read word pointer portion $8RR_1$ enter the first reset state, and the read bit pointer portions $8CR_2$ to $8CR_4$ and the read word pointer portions $8RR_2$ to $8RR_4$ enter the second reset state. Then data is read only from the memory cell corresponding to both the memory cell selection line $7SCR_1$ of the read bit pointer portion $8CR_1$ and the memory cell selection line $7SRR_1$ of the read word pointer portion $8RR_1$. When the read bit address pointer 13 includes the flip-flop circuits, for example, of FIGS. 5 and 7, the data is shifted to the next read bit pointer portion $8CR_2$ as the clock signal $T_3$ proceeds two cycles, and the memory cell selection line $7SCR_2$ outputs the signal for memory cell selection. Then the data is read from the memory cell corresponding to both the memory cell selection lines $7SCR_2$ and $7SRR_1$. The read bit pointer portion $8CR_3$, in turn, is designed by the control signal C from the control circuit 10 not to operate as the flip-flop circuit but to operate the data through circuit. Therefore the data is not held in the read bit pointer portion $8CR_3$ but is transmitted to the next read bit pointer portion $8CR_4$. The read bit pointer portion $8CR_4$, which is that for redundancy memory cell selection, is designed by the control signal C from the control circuit 10 to carry out the normal flip-flop circuit operation. Therefore the data for memory cell selection is held in the read bit pointer portion $8CR_4$ and the memory cell selection line $7SCR_4$ outputs the data for selection of the memory cells 7. The three memory cells 7 in the first row are sequentially selected to read data therefrom as the columns are shifted. The data passes through the read bit pointer portion $8CR_3$ without the read operation, so that the defective memory cell is not selected.

The control circuit 10 has a structure as shown in FIG. 3 when the memory cell array 1 has four columns including the redundancy circuit column. The output signals Y1 to Y4 of the control circuit 10 corresponding to the control signal C are assumed to be inputted to the write bit pointer portions $8CW_1$ to $8CW_4$ and to the read bit pointer portions $8CR_1$ to $8CR_4$, respectively. At this time, the fuse 20a of the signal generator 26 in the control circuit of FIG. 3 is cut off to set the output signal Y3 to "L", the fuse 20b left uncut, when the defective memory cell lies in the third column.

Second Preferred Embodiment

Figure 10:
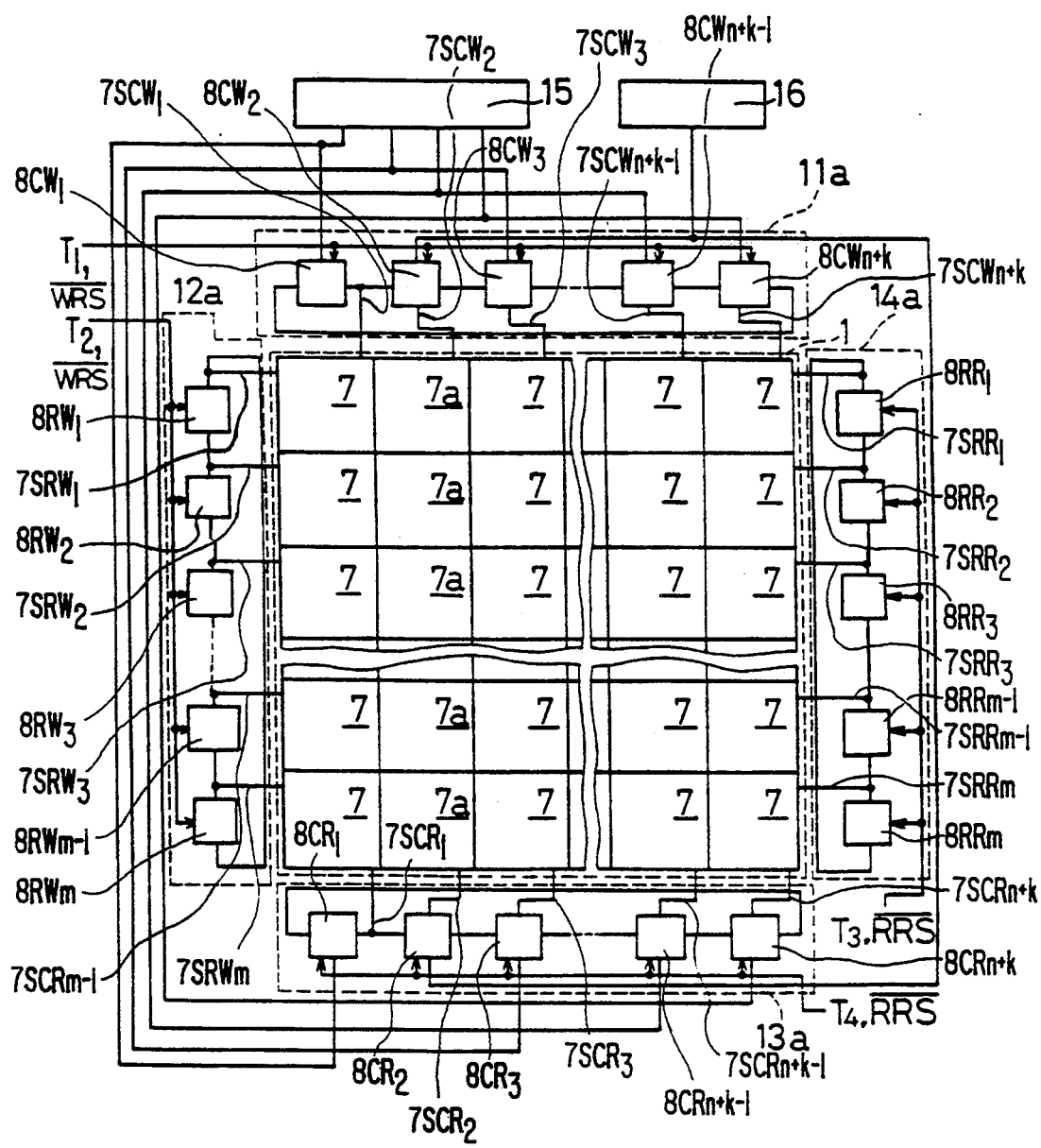
FIG. 10 is a partial block diagram of the semiconductor memory of a second preferred embodiment according to the present invention.

A second preferred embodiment of the present invention will now be discussed hereinafter with reference to FIG. 10. FIG. 10 is a partial block diagram of the semiconductor memory of the second preferred embodiment according to the present invention. In FIG. 10, there is shown an arrangement corresponding to the memory cell array 1, input address part 3, output address part 5 and control circuit 6 of the semiconductor memory of FIG. 1. In general, a memory cell array includes $\{m \times (n+k)\}$ memory cells arranged in matrix form having m rows and $(n+k)$ columns. The $(n+k)$ memory cells arranged in each row are connected to word lines provided in the corresponding row, and the m memory cells arranged in each column are connected to bit lines provided in the corresponding column. The plurality of memory cells arranged in n columns are regular memory cells, and the plurality of memory cells arranged in k columns are redundancy memory cells.

In FIG. 10, reference numeral 1 designates a memory cell array including $(m \times n)$ memory cells 7 and $(m \times k)$ spare memory cells 7a which are arranged in matrix form having m rows and $(n+k)$ columns. Reference characters $7SCW_1$ to $7SCW_{n+k}$ designate signal lines provided in corresponding relation to the respective columns of the memory cell array 1 and transmitting signals which control transfer gates connected between the bit lines and data input lines in the corresponding columns. The signal lines are column write memory cell selection lines for transmitting the signals for selecting the plurality of memory cells arranged in the corresponding columns in the data write operation. The column write memory cell selection lines are of two types: memory cell selection lines connected to the regular memory cells 7, for example 7SCW$_1$; and spare memory cell selection lines connected to the spare memory cells 7a, for example 7SCW$_2$.

Reference characters 7SCR$_1$ to 7SCR$_{n+k}$ designate signal lines provided in corresponding relation to the respective columns of the memory cell array 1 and transmitting signals which control transfer gates connected between the bit lines and data output lines in the corresponding columns. The signal lines are column read memory cell selection lines for transmitting the signals for selecting the plurality of memory cells arranged in the corresponding columns in data read operation. The column read memory cell selection lines are of two types: memory cell selection lines connected to the regular memory cells 7, for example 7SCR$_1$; and spare memory cell selection lines connected to the spare memory cells 7a, for example 7SCR$_2$.

Reference characters 7SRW$_1$ to 7SRW$_m$ designate row write memory cell selection lines provided in corresponding relation to the respective rows of the memory cell array 1 and transmitting the signals for energizing the word lines arranged in the corresponding rows in data write operation. The row write memory cell selection lines may be provided as part of the word lines.

Reference characters 7SRR$_1$ to 7SRR$_m$ designate row read memory cell selection lines provided in corresponding relation the respective rows of the memory cell array 1 and transmitting the signals for energizing the word lines arranged in the corresponding rows in data read operation. The row read memory cell selection lines may be provided as part of the word lines.

Reference character 11a designates a write bit address pointer forming the input address part which includes in-series connected write bit pointer portions 8CW$_1$ to 8CW$_{n+k}$ in the same manner as the write bit address pointer 11 of FIG. 2. In the second preferred embodiment, the write bit pointer portion 8CW$_2$ is a spare memory cell selecting portion for selecting the spare memory cells 7a.

Reference character 12a designates a write word address pointer forming the input address part which has the same function as the write word address pointer 12 of FIG. 2.

Reference character 13a designates a read bit address pointer forming the output address part which includes in-series connected read bit pointer portions 8CR$_1$ to 8CR$_{n+k}$ in the same manner as the read bit address pointer 13 of FIG. 2. In the second preferred embodiment, the read bit pointer portion 8CR$_2$ is a spare memory cell selecting portion for selecting the spare memory cells 7a.

Reference character 14a designates a read word address pointer forming the output address part which has the same function as the read word address pointer 14 of FIG. 2.

Reference numeral 15 designates a control circuit for outputting a control signal which controls some of the write and read bit pointer portions 8CW$_1$ to 8CW$_{n+k}$ and 8CR$_1$ to 8CR$_{n+k}$ of the write and read bit address pointers 11a and 13a which select the regular memory cells. When there are no defective regular memory cells, the control circuit 15 places in normal operation the flip-flop circuits of the write and read bit pointer portions which select the regular memory cells in the first to (n+k)-th columns, and outputs the control signal C, at the "H" level potential herein, which does not permit the operation of the data through circuits.

The operation of the control circuit 15 where there is a defective regular memory cell in the second to n-th columns will be described below. The control circuit 15 causes the write bit pointer portion of the write bit address pointer 11a and the read bit pointer portion of the read bit address pointer 13a in the column including the defective memory cell to output the signal for non-selection of the bit lines, at the "L" level potential herein, from the column selection output nodes of the flip-flop circuits through the memory cell selection lines, and outputs the control signal C which places the data through circuits into operation or which permits electrical conduction between the input and output nodes, at the "L" level potential herein, to the pointer portions. The control circuit 15 also places in normal operation the flip-flop circuits of the write bit pointer portions of the write bit address pointer 11a and the read bit pointer portions of the read bit address pointer 13a in the columns which do not include the defective memory cell, and outputs the control signal C which does not permit the data through circuits to operate, at the "H" level potential herein, to the pointer portions.

Reference numeral 16 designates a spare control circuit for outputting a control signal which controls some of the write and read bit pointer portions 8CW$_1$ to 8CW$_{n+k}$ and 8CR$_1$ to 8CR$_{n+k}$ of the write and read bit address pointers 11a and 13a which select the spare memory cells for redundancy. The operation of the spare control circuit 16 when there are no defective regular memory cells in the second to (n+k)-th columns will be described below. The spare control circuit 16 causes the pointer portions which select the spare memory cells, for example the write bit pointer portion 8CW$_2$ and the read bit pointer portion 8CR$_2$, in the second to (n+k)-th columns to output the signal for non-selection of the bit lines, at the "L" level potential herein, from the column selection output nodes through the memory cell selection lines 7SCW$_2$ to 7SCW$_{n+k}$, and outputs the control signal C, at the "L" level potential herein, which places the data through circuits into operation or which permits electrical conduction between the input and output nodes to the pointer portions.

The operation of the spare control circuit 16 where there is a defective regular memory cell in the second to (n+k)-th columns will be described below. The spare control circuit 16 places into operation the flip-flop circuits of the write and read bit pointer portions of the write and read bit address pointers 11a and 13a in the column substituted for the column including the defective memory cell among the second to (n+k)-th columns including the spare memory cells 7a, and outputs the control signal C, at the "H" level potential herein, which does not permit the data through circuits to operate to the pointer portions. The spare control circuit 16 also causes the write and read bit pointer portions of the write and read bit address pointers 11a and 13a in the columns which are not substituted for the regular memory cell columns among the second to (n+k)-th columns including the spare memory cells for redundancy to output the signal for non-selection of the bit lines, at the "L" level potential herein, from the column selection output nodes of the flip-flop circuits, and outputs the control signal C, at the "L" level potential herein, which places the data through circuits into operation or which permits electrical conduction between the input and output nodes to the pointer portions.

The detailed structure of the write bit pointer portions $8CW_1$ to $8CW_{n+k}$ of the write bit address pointer $11a$, the write word pointer portions $8RW_1$ to $8RW_m$ of the write word address pointer $12a$, the read bit pointer portions $8CR_1$ to $8CR_{n+k}$ of the read bit address pointer $13a$, and the read word pointer portions $8RR_1$ to $8RR_m$ of the read word address pointer $14a$ of the second preferred embodiment is identical with that described in the first preferred embodiment. In the second preferred embodiment, however, the control circuit 15 and the spare control circuit 16 are provided. The second preferred embodiment differs from the first preferred embodiment in the connection of the control circuits 15 and 16 to the respective pointer portions. Since the control circuit 15 must be designed to output the control signal for selecting all memory cells when there are no defective regular memory cells, the control circuit 15 is not permitted to have the circuit structure of FIG. 3 which constantly outputs the "L" level potential to one of the bit pointer portions, but employs the circuit structure of FIG. 4 which may output the "H" level potential to all of the bit pointer portions.

The detailed circuit structure of the spare control circuit 16 varies depending on the number of columns k in which the spare memory cells are arranged, but is conceptually identical with that of the control circuit 10 of FIG. 2. A structure of the spare control circuit 16 having one control signal line extending to the outside is, for example, shown in FIG. 11. The circuit of FIG. 11 including a fuse 6:5, a resistor 66 and an inverter 67 is a programmable signal producing means for producing a signal for memory cell selection, the fuse 65 being connected at its first end to the power supply 24, the resistor 66 being grounded. The produced signal is outputted through the inverter 67 from an output terminal 68. In order that the write bit pointer portion $8CW_2$ outputs the "H" level potential for spare memory cell selection, the fuse 65 is cut off so that a first end of the resistor 66 is at the ground potential, whereby the "H" level potential is outputted from the inverter 67. For output of a plurality of control signals from the spare control circuit 16, the structure thereof should be conceptually identical with the structure of FIG. 4, that is, the circuit structure which may output the "H" level potential at the same time.

Description will be given hereinafter on the operation of the semiconductor memory of the second preferred embodiment.

The write operation where there is no defective regular memory cell 7 in the memory cell array i will be now described below. It is assumed that the spare memory cells are only the memory cells selected by the write bit pointer portion $8CW_2$ and the read bit pointer portion $8CR_2$ in the memory cell array 1. For selection of the regular memory cells 7, it is necessary to place the write bit pointer portions $8CW_1$, and $8CW_3$ to $8CW_{n+1}$ into normal flip-flop operation. For this purpose, the control circuit 15 outputs the control signal C at the "H" level potential to the write bit pointer portions $8CW_1$, and $8CW_3$ to $8CW_{n+1}$. At the same time, for non-selection of the redundancy spare memory cells $7a$, it is necessary to inhibit the operation of the flip-flop circuit of the write bit pointer portion $8CW_2$ and to place the data through circuit of the write bit pointer portion $8CW_2$ into operation. For this purpose, the spare control circuit 16 outputs the control signal C at the "L" level potential to the write bit pointer portions $8CW_2$.

Under the foregoing establishments, when the reset signal $\overline{WRS}$ is inputted to the write bit address pointer $11a$, the write bit pointer portion $8CW_1$ is reset to enter the first reset state. The write bit pointer portion $8CW_1$ produces and holds data for selection of the memory cells 7 and outputs the signal for selection of the memory cells 7 through the memory cell selection line $7SCW_1$. Simultaneously with the input of the reset signal $\overline{WRS}$, the write bit pointer portions $8CW_2$ to $8CW_n$, if having data for selection of the memory cells 7, are reset to enter the second reset state, and the data thereof are erased. Similarly, when the reset signal $\overline{WRS}$ is inputted to the write word address pointer $12a$, the write word pointer portion $8RW_1$ is reset to enter the first reset state. The write word pointer portion $8RW_1$ produces and holds data for memory cell selection and outputs the signal for memory cell selection through the memory cell selection line $7SRW_1$. Simultaneously with the input of the reset signal $\overline{WRS}$, the write word pointer portions $8RW_2$ to $8RW_m$, if having data for memory cell selection, are reset to enter the second reset state, and the data thereof are erased. Then data is written only into the memory cell selected by both the memory cell selection line $7SCW_1$ of the write bit pointer portion $8CW_1$ and the memory cell selection line $7SRW_1$ of the write word pointer portion $8RW_1$.

The data transmitted to the memory cell array 1 from the input circuit 2 of FIG. 1, as is not shown in FIG. 10, is written into the memory cell selected by the address pointers $11a$ and $12a$ which form the input address part 3.

When the write bit address pointer $11a$ includes the flip-flop circuits, for example, of FIGS. 5 and 7, the data for memory selection is transmitted to the next write bit pointer portion $8CW_2$ as the clock signal $T_1$ proceeds two cycles. The write bit pointer portion $8CW_2$ is designed by the control signal from the control circuit 16 not to operate as the flip-flop circuit but to operate the data through circuit. Therefore the data is not held in the write bit pointer portion $8CW_2$ but is transmitted to the next write bit pointer portion $8CW_3$ through the data through circuit of the write bit pointer portion $8CW_2$. Hence the signal for memory cell selection is not outputted from the memory cell selection line $7SCW_2$ and the data is not written into the memory cell corresponding to both the memory cell selections lines $7SCW_2$ and $7SRW_1$. The write bit pointer portion $8CW_3$ is designed by the control signal C from the control circuit 15 to operate as the flip-flop circuit but not to operate the data through circuit. The data is held in the write bit pointer portion $8CW_3$, and the write bit pointer portion $8CW_3$ outputs the signal for memory cell selection through the memory cell selection line $7SCW_3$. The data is written into the memory cell corresponding to both the memory cell selection lines $7SCW_3$ and $7SRW_1$. As the cycles of the clock signal $T_1$ proceed, the data is shifted sequentially to the succeeding write bit pointer portions, and the data is sequentially written into the n memory cells in the first row as the columns are shifted. The data passes through the write bit pointer portion $8CW_2$ without the write operation. As a result, the data is transmitted from the write bit pointer portion $8CW_1$ directly to the write bit pointer portion $8CW_3$ through the data through circuit of the write bit pointer portions $8CW_2$. The data is not written into the spare memory cells $7a$.

Normally, the clock signal $T_2$ proceeds as the data makes a round in the write bit address pointer 11a, and then the data is shifted to the next write word pointer portion 8RW$_2$ in the write word address pointer 12a. The same operation as executed in the memory cells in the first row is repeated in the memory cells in the second to last rows. The write operation of data into the memory cells arranged in m rows in n columns is achieved in this manner.

The read operation of data from the memory cells where there is no defective regular memory cell will be now described below. As assumed above in relation to the write operation for the purpose of simplification, the read bit pointer portion 8CW$_2$ is the memory cell selecting portion for selection of the spare memory cells. For selection of the regular memory cells, it is necessary to place the read bit pointer portions 8CR$_1$, and 8CR$_3$ to 8CR$_{n+1}$ into normal operation. For this purpose, the control circuit 15 outputs the control signal C at the "H" level potential to the read bit pointer portions 8CR$_1$, and 8CR$_3$ to 8CR$_{n+k}$. At the same time, for non-selection of the redundancy spare memory cells 7a, it is necessary to inhibit the flip-flop operation of the read bit pointer portion 8CR$_2$ and to place the data through circuit into operation. For this purpose, the control circuit 16 outputs the control signal C at the "L" level potential to the read bit pointer portion 8CR$_2$.

Under the foregoing establishments, when the reset signal $\overline{RRS}$ is inputted to the read bit address pointer 13a and the read word address pointer 14a, the read bit pointer portion 8CR$_1$ and the read word pointer portion 8RR$_1$ enter the first reset state, and the read bit pointer portions 8CR$_2$ to 8CR$_n$ and the read word pointer portions 8RR$_2$ to 8RR$_m$ enter the second reset state. Data is read from the memory cell corresponding to both the memory cell selection line 7SCR$_1$ of the read bit pointer portion 8CR$_1$ and the memory cell selection line 7SRR$_1$ of the read word pointer portion 8RR$_1$. Data which is read is transmitted to the output circuit 4 from the memory cell of the memory cell array 1 which is selected by the read bit address pointer 13a and the read word address pointer 14a which form the output address part 5 of FIG. 1, as is not shown in FIG. 10. When the read bit address pointer 13a includes the flip-flop circuits, for example, of FIGS. 5 and 7, the data is transmitted to the next read bit pointer portion 8CR$_2$ as the clock signal $T_3$ proceeds two cycles. The read bit pointer portion 8CR$_2$ is designed by the control signal from the control circuit 16 not to operate as the flip-flop circuit but to operate the data through circuit. Therefore the data is not held in the read bit pointer portion 8CR$_2$ but is transmitted to the next read bit pointer portion 8CR$_3$ as it is. Thus the spare memory cell selection line 7SCR$_2$ does not output the signal for selection of the spare memory cells 7a, the data is not read from the memory cell corresponding to both the memory cell selection lines 7SCR$_2$ and 7SRR$_1$. The read bit pointer portion 8CR$_3$ is designed by the control signal C from the control circuit 15 to operate as the flip-flop circuit operation but not to operate the data through circuit. The data is held in the read bit pointer portion 8CR$_3$ and the memory cell selection line 7SCR$_3$ outputs the signal for memory cell selection. The data is read from the memory cell corresponding to both the memory cell selection lines 7SCR$_3$ and 7SRR$_1$. As the cycles of the clock signal $T_3$ proceed, the data is sequentially read from the successive read bit pointer portions. The data passes through the read bit pointer portion 8CR$_2$ without the read operation. As a result, the data is transmitted from the read bit pointer portion 8CR$_1$ directly to the read bit pointer portion 8CR$_3$ through the data through circuit of the read bit pointer portions 8CR$_2$. The data is not read from the spare memory cells 7a.

Normally, the clock signal $T_4$ proceeds as the data makes a round in the read bit address pointer 13a, and then the data is shifted to the next read word pointer portion 8RR$_2$ in the read word address pointer 14a. The same operation as executed in the memory cells in the first row is repeated in the memory cells in the second to last rows. The read operation of data from the memory cells arranged in m rows in three columns is achieved in this manner.

The write operation where there is a defective regular memory cell in the memory cell array 1 will be now described below. For the purpose of simplification, the memory cell array 1 is assumed to have m rows and five columns, the second column being the redundancy memory cell column. It is assumed that the fault is caused, for example, in a memory cell 7 in the third column. For selection of the undefective memory cell columns, it is necessary to place the write bit pointer portions 8CW$_1$, 8CW$_2$, 8CW$_4$ and 8CW$_5$ into normal operation. For this purpose, the control circuit 15 outputs the control signal C at the "H" level potential to the write bit pointer portions 8CW$_1$, 8CW$_4$ and 8CW$_5$. At the same time, for non-selection of the memory cells in the third column having the defective memory cell, it is necessary to inhibit the flip-flop operation of the write bit pointer portion 8CW$_3$ and to place the data through circuit into operation. For this purpose, the control circuit 15 outputs the control signal C at the "L" level potential to the write bit pointer portion 8CW$_3$. The spare control circuit 16 outputs the control signal C at the "H" level potential to the write bit pointer portion 8CW$_2$.

Under the foregoing establishments, when the reset signal $\overline{WRS}$ is inputted to the write bit address pointer 11a and the write word address pointer 12a, the data is written into the memory cell corresponding to both the memory cell selection line 7SCW$_1$ of the write bit pointer portion 8CW$_1$ and the memory cell selection line 7SRW$_1$ of the write word pointer portion 8RW$_1$. The data is shifted to the next write bit pointer portion 8CW$_2$ as the clock signal $T_1$ proceeds two cycles. The write bit pointer portion 8CW$_2$ for selection of the spare memory cells 7a for redundancy, however, is designed to operate as the flip-flop circuit by the control signal C from the spare control circuit 16. Therefore the spare memory cell selection line 7SCW$_2$ outputs the signal for selection of the spare memory cells 7a, and data is written into the spare memory cell 7a selected by both the spare memory cell selection lines 7SCW$_2$ and 7SRW$_1$. The write bit pointer portion 8CW$_3$, in turn, is designed by the control signal C from the control circuit 15 not to operate as the flip-flop circuit but to operate the data through circuit. Therefore the data is not held in the write bit pointer portion 8CW$_3$ but is transmitted to the next write bit pointer portion 8CW$_4$. The data for memory cell selection is held in the write bit pointer portion 8CW$_4$, and the memory cell selection line 7SC$_4$ outputs the signal for memory cell selection. The data passes through the write bit pointer portion 8CW$_3$ without the write operation, so that the defective memory cell is not selected.

The read operation of data from the memory cells where there is a defective regular memory cell will be now described below. For the purpose of simplification, the memory cell array 1 is assumed to have m rows and five columns, the second column being the redundancy memory cell column. It is assumed that the fault is caused, for example, in a memory cell 7 in the third column. For selection of the undefective memory cell columns, it is necessary to place the read bit pointer portions $8CR_1$, $8CR_2$, $8CR_4$ and $8CR_5$ into normal operation. For this purpose, the control circuit 15 outputs the control signal C at the "H" level potential to the read bit pointer portions $8CR_1$, $8CR_4$ and $8CR_5$. At the same time, for non-selection of the memory cells in the third column having the defective memory cell, it is necessary to inhibit the flip-flop operation of the read bit pointer portion $8CR_3$ and to place the data through circuit into operation. For this purpose, the control circuit 10 outputs the control signal C at the "L" level potential to the read bit pointer portion $8CR_3$. The spare control circuit 16 outputs the control signal C at the "H" level potential to the read bit pointer portion $8CR_2$.

Under the foregoing establishments, when the reset signal $\overline{RRS}$ is inputted to the read bit address pointer 13a and the read word address pointer 14a, the read bit pointer portion $8CR_1$ and the read word pointer portion $8RR_1$ enter the first reset state, and the read bit pointer portions $8CR_2$ to $8CR_4$ and the read word pointer portions $8RR_2$ to $8RR_m$ enter the second reset state. Then data is read only from the memory cell corresponding to both the memory cell selection line $7SCR_1$ of the read bit pointer portion $8CR_1$ and the memory cell selection line $7SRR_1$ of the read word pointer portion $8RR_1$. The data is shifted to the next read bit pointer portion $8CR_2$ as the clock signal $T_3$ proceeds two cycles. The read bit pointer portion $8CR_2$ for selection of the spare memory cells 7a for redundancy, however, is designed to operate as the flip-flop circuit by the control signal C from the spare control circuit 16. Therefore the memory cell selection line $7SCR_2$ outputs the signal for selection of the spare memory cell 7a. Then the data is read from the spare memory cell 7a selected by both the memory cell selection lines $7SCR_2$ and $7SRR_1$. The read bit pointer portion $8CR_3$, in turn, is designed by the control signal C from the control circuit 15 not to operate as the flip-flop circuit but to operate the data through circuit. Therefore the data is not held in the read bit pointer portion $8CR_3$ but is transmitted to the next read bit pointer portion $8CR_4$. The data for memory cell selection is held in the read bit pointer portion $8CR_4$, and the memory cell selection line $7SCR_4$ outputs the signal for memory cell selection. The data passes through the read bit pointer portion $8CW_3$ without the read operation, so that the defective memory cell is not selected.

The control circuit 15 has a structure as shown in FIG. 3 when the memory cell array 1 has four regular memory cell columns. The output signals Y1 to Y4 of the control circuit 15 corresponding to the control signal C are assumed to be inputted to the write bit pointer portions $8CW_1$, and $8CW_3$ to $8CW_5$ and to the read bit pointer portions $8CR_1$, and $8CW_3$ to $8CR_4$, respectively. At this time, the fuse 20b of the signal generator 26 in the control circuit of FIG. 3 is cut off to set the output signal Y3 to "L", the fuse 20a left uncut, when the defective memory cell lies in the third column.

Second Schematic Structure

Figure 9:
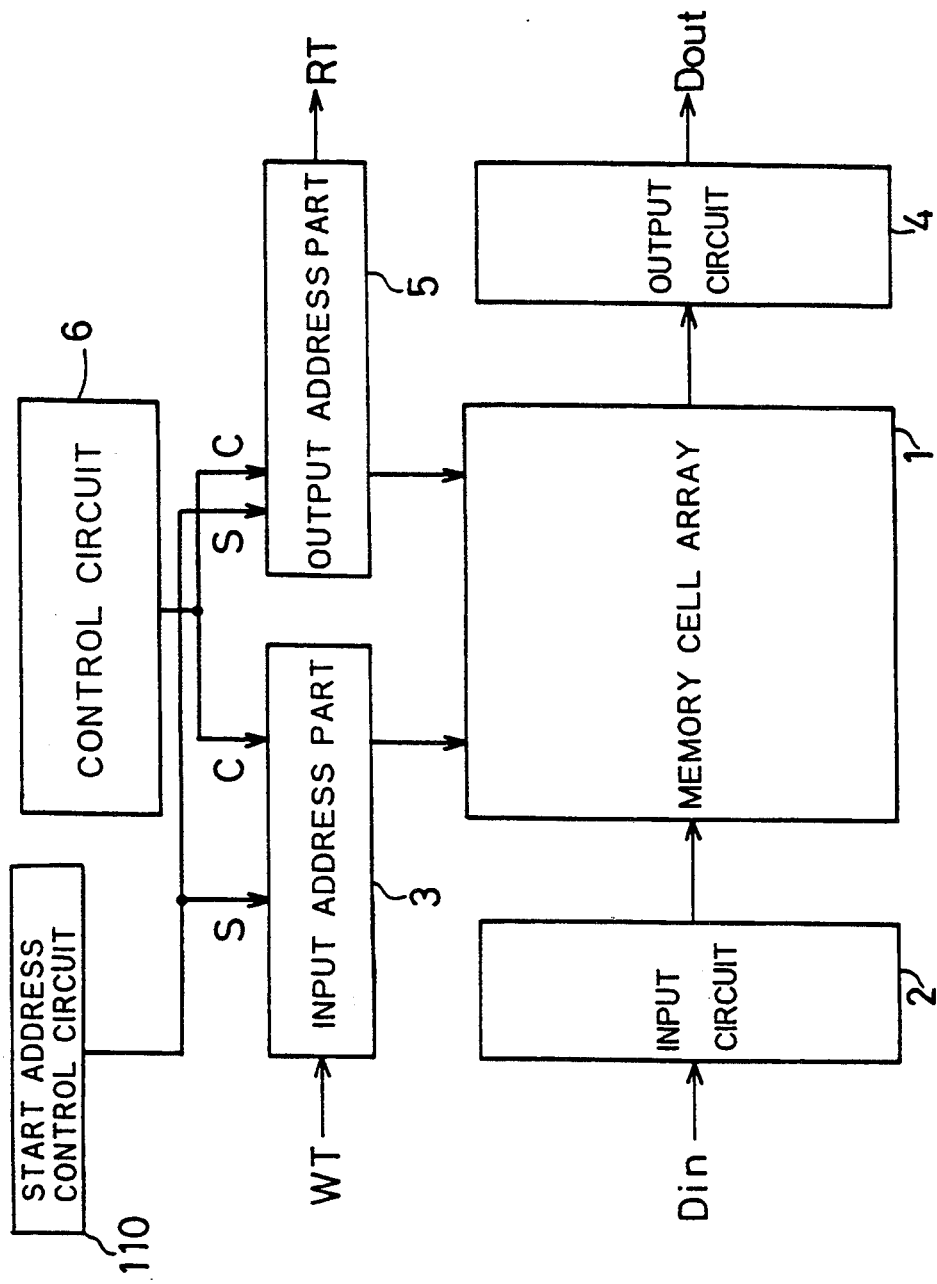
FIG. 9 is a schematic block diagram of a semiconductor memory according to the present invention.

FIG. 9 is a block diagram showing the outline of another exemplary structure of the semiconductor memory according to the present invention. Reference numeral 110 designates a start address control circuit for outputting a start address control signal S to set a start address for the input and output address parts 3 and 5. Like reference numerals and characters in FIG. 9 are used to designate parts identical or corresponding to those in FIG. 1.

When the address parts are used, it is necessary to previously set the first flip-flop circuit which outputs the memory cell selection signal after the first reset state, that is, the start position at the time of reset. However, a problem is encountered when a fault is caused in the memory cell of the bit line controlled by the flip-flop circuit at the default start position. To prevent the production of defective products, this flip-flop circuit must be disabled, resulting in the absence of the flip-flop circuit which specifies the start position of the address parts. To solve the problem, the respective flip-flop circuits are adapted to have a function controlled by the start address control circuit and setting the first and second reset states, whereby, if a fault is caused in the memory for the bit line controlled by the flip-flop circuit at the default start position, another flip-flop circuit is adapted to have a function to set the first reset state, preventing the production of the defective products.

Third Preferred Embodiment

Figure 12:
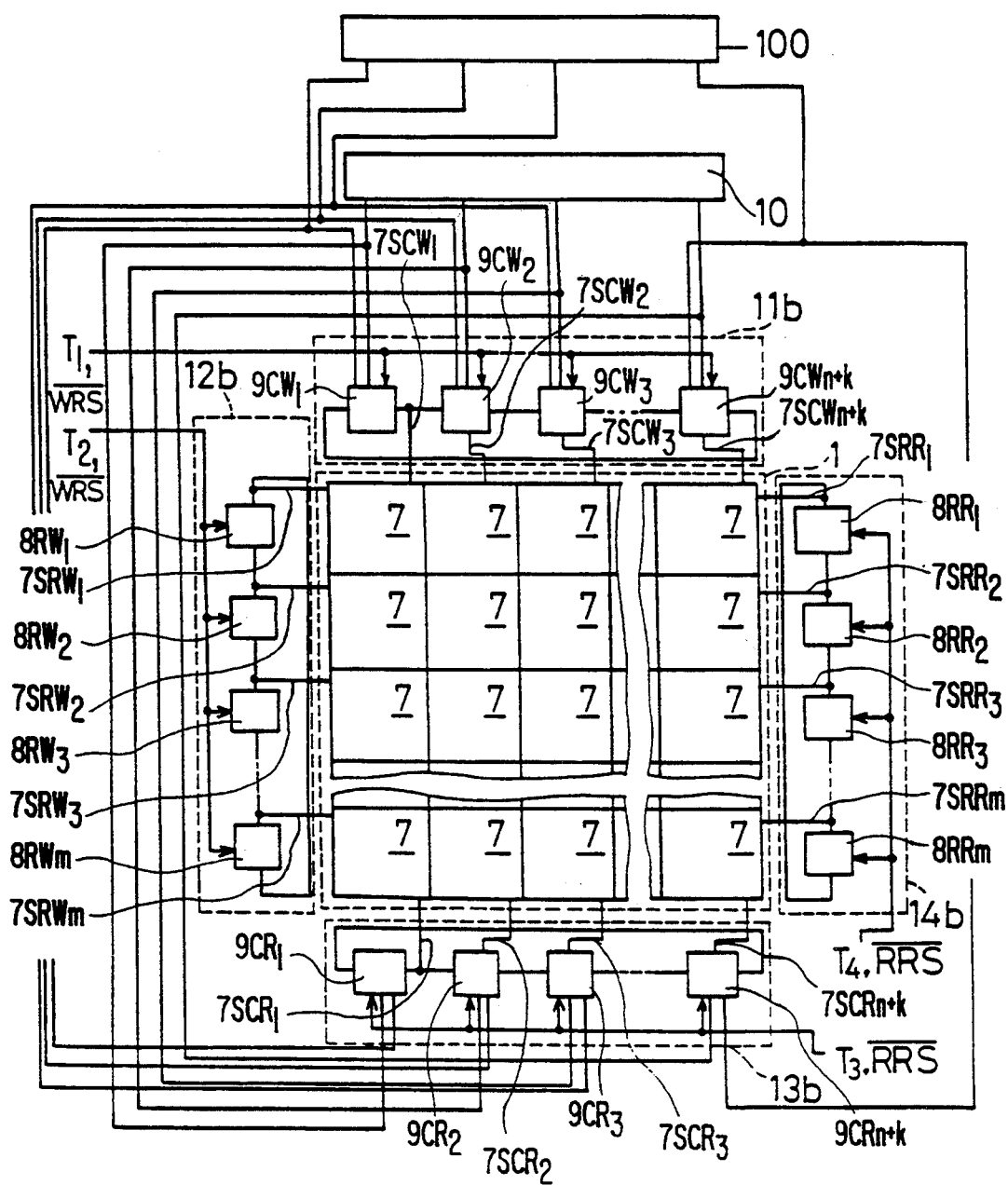
FIG. 12 is a partial block diagram of the semiconductor memory of a third preferred embodiment according to the present invention.

Referring to FIG. 12, a third preferred embodiment according to the present invention will be described hereinafter. FIG. 12 is a partial block diagram of the semiconductor memory of the third preferred embodiment according to the present invention. In FIG. 12, there is shown an arrangement corresponding to the memory cell array 1, the input and output address parts 3 and 5, the control circuit 6, and the start address control circuit 110 of FIG. 9.

In FIG. 12, reference character 11b designates a write bit address pointer forming the input address part which includes (n+k) in-series connected memory cell selecting portions or write bit pointer portions $9CW_1$ to $9CW_{n+k}$ provided in corresponding relation to the column write memory cell selection lines $7SCW_1$ to $7SCW_{n+k}$ and having column selection output nodes connected to the corresponding column write memory cell selection lines $7SCW_1$ to $7SCW_{n+k}$, respectively. Each of the write bit pointer portions $9CW_1$ to $9CW_{n+k}$ includes a flip-flop circuit having therein a data through circuit connected between the input and output nodes thereof for transmitting the information inputted to the input node as it is to the output node. The write bit pointer portion corresponding to the column at the start position is set by the start address control signal S.

The respective write bit pointer portions $9CW_1$ to $9CW_{n+k}$ of the write bit address pointer 11b are reset by the write reset signal $\overline{WRS}$. Then the write bit pointer portion at the start position outputs the signal for selection of the memory cells, at the "H" level potential herein, through the column write memory cell selection line, and the other write bit pointer portions output the signals for non-selection of the memory cells, at the "L" level potential herein, through the column write memory cell selection lines. The respective write bit pointer portions $9CW_1$ to $9CW_{n+k}$ sequentially transmit the signal for selection of the column write memory cell selection lines to the next write bit pointer portion in synchronism with the write column clock signal $T_1$.

Reference character 12b designates a write word address pointer identical with the write word address pointer 12 of FIG. 2.

Reference character 13a designates a read bit address pointer forming the output address part which includes (n+k) in-series connected memory cell selecting portions or read bit pointer portions $9CR_1$ to $9CR_{n+k}$ provided in corresponding relation to the column read memory cell selection lines $7SCR_1$ to $7SCR_{n+k}$ and having column selection output nodes connected to the corresponding column read memory cell selection lines $7SCR_1$ to $7SCR_{n+k}$, respectively. Each of the read bit pointer portions $9CR_1$ to $9CR_{n+k}$ includes a flip-flop circuit having therein a data through circuit connected between the input and output nodes thereof for transmitting the information inputted to the input node as it is to the output node. The read bit pointer portion corresponding to the column at the start position includes a flip-flop circuit which is set by the start address control signal S. The respective read bit pointer portions $9CR_1$ to $9CR_{n+k}$ of the read bit address pointer 13b are reset by the read reset signal $\overline{RRS}$. Then the read bit pointer portion at the start position outputs the signal for selection of the memory cells, at the "H" level potential herein, through the column read memory cell selection line, and the other read bit pointer portions output the signals for non-selection of the memory cells, at the "L" level potential herein, through the column read memory cell selection lines. The respective read bit pointer portions $9CR_1$ to $9CR_{n+k}$ sequentially transmit the data for selection of the column read memory cell selection lines to the next read bit pointer portion in synchronism with the read column clock signal $T_3$.

Reference character 14b designates a read word address pointer identical with the read word address pointer 14 of FIG. 2.

Reference numeral 10 designates a control circuit for outputting a control signal which controls the write bit pointer portions $9CW_1$ to $9CW_{n+k}$ of the write bit address pointer 11b and the read bit pointer portions $9CR_1$ to $9CR_{n+k}$ of the read bit address pointer 13b. The operation of the control circuit 10 where there are no defective regular memory cells in the second to n-th columns will be described below. The control circuit 10 places in normal operation the flip-flop circuits of the write bit pointer portions $9CW_1$ to $9CW_n$ of the write bit address pointer 11b and the read bit pointer portions $9CR_1$ to $9CR_n$ of the read bit address pointer 13b in the first to n-th columns, and outputs to the pointer portions the control signal C which does not permit the data through circuits to operate, at the "H" level potential herein. The control circuit 10 also causes the write bit pointer portions $9CW_{n+1}$ to $9CW_{n+k}$ of the write bit address pointer 11b and the read bit pointer portions $9CR_{n+1}$ to $9CR_{n+k}$, of the read bit address pointer 13b in the (n+1)-th to (n+k)-th columns to output signals for non-selection of the bit lines, at the "L" level potential herein, from the column selection output nodes of the flip-flop circuits through the memory cell selection liens $7SCW_{n+1}$ to $7SCW_{n+k}$, and outputs the control signal C which places the data through circuits into operation or which permits electrical conduction between the input and output nodes, at the "L" level potential herein, to the pointer portions.

The operation of the control circuit 10 where there is a defective regular memory cell in the first to n-th columns will be described below. The control circuit 10 causes the write bit pointer portions of the write bit address pointer 11b and the read bit pointer portions of the read bit address pointer 13b in the column including the defective memory cell to output the signal for non-selection of the bit lines, at the "L" level potential herein, from the column selection output nodes of the flip-flop circuits through the memory cell selection lines, and outputs the control signal C which places the data through circuits into operation or which permits electrical conduction between the input and output nodes, at the "L" level potential herein, to the pointer portions. The control circuit 10 also places in normal operation the flip-flop circuits of the write bit pointer portions of the write bit address pointer 11b and the read bit pointer portions of the read bit address pointer 13b in the columns which do not include the defective memory cell, and outputs the control signal C which does not permit the data through circuits to operate, at the "H" level potential herein, to the pointer portions. Furthermore, the control circuit 10 places in operation the flip-flop circuits of the write bit pointer portion of the write bit address pointer 11b and the read bit pointer portion of the read bit address pointer 13b in one of the (n+1)-th to (n+k)-th columns including the redundancy memory cells which is substituted for the column including the defective memory cell, and outputs the control signal C which does not permit the data through circuits to operate, at the "H" level potential herein, to the pointer portions. The control circuit 10 also causes the write bit pointer portions of the write bit address pointer 11b and the read bit pointer portions of the read bit address pointer 13b in the columns including the redundancy memory cells which are not substituted for the regular memory cell column to output the signal for non-selection of the bit lines, at the "L" level potential herein, from the column selection output nodes of the flip-flop circuits, and outputs the control signal C which places the data through circuits into operation or which permits electrical conduction between the input and output nodes, at the "L" level potential herein, to the pointer portions.

Reference numeral 100 designates a start address control circuit for outputting the start address control signal S which controls the write bit pointer portions $9CW_1$ to $9CW_{n+k}$ of the write bit address pointer 11b and the read bit pointer portions $9CR_1$ to $9CR_{n+k}$ of the read bit address pointer 13b to set the start position. The staff address control circuit 100 outputs the staff address control signal S at the "H" level potential herein to the write bit pointer portions $9CW_1$ to $9CW_n$ of the write bit address pointer 11b and the read bit pointer portions $9CR_1$ to $9CR_n$ of the read bit address pointer 13b in the first to n-th columns so that they enter the first reset state when reset, and outputs the control signal C at the "L" level potential to the other bit pointer portions so that they enter the second reset state when reset.

Description will now be given on the detailed structure of the control circuit 10, the start address control circuit 100, the write bit pointer portions $9CW_1$ to $9CW_{n+k}$ of the write address pointer 11b, the write word pointer portions $8RW_1$ to $8RW_m$ of the write word address pointer 12b, the read bit pointer portions $9CR_1$ to $9CR_{n+k}$ of the read bit address pointer 13b, and the read word pointer portions $8RR_1$ to $8RR_m$ of the read word address pointer 14b.

The detailed structure of the control circuit 10, the write word pointer portions $8RW_1$ to $8RW_m$ of the write word address pointer 12b, and the read word pointer portions $8RR_1$ to $8RR_m$ of the read word address pointer 14b in the third preferred embodiment is identical with that of the control circuit 10, the write word pointer portions $8RW_1$ to $8RW_m$ of the write word address pointer 12, and the read word pointer portions $8RR_1$ to $8RR_m$ of the read word address pointer 14 in the first preferred embodiment.

The start address control circuit 100 may be of conceptually the same structure as the control circuit 10 of FIG. 3. Specifically, for selection of one bit pointer portion, the "H" level potential should be outputted to one of the bit pointer portions $9CW_1$ to $9CW_{n+k}$, and $9CR_1$ to $9CR_{n+k}$. Accordingly, the NAND gates 23a to 23d may be replaced with AND gates.

Figure 13:
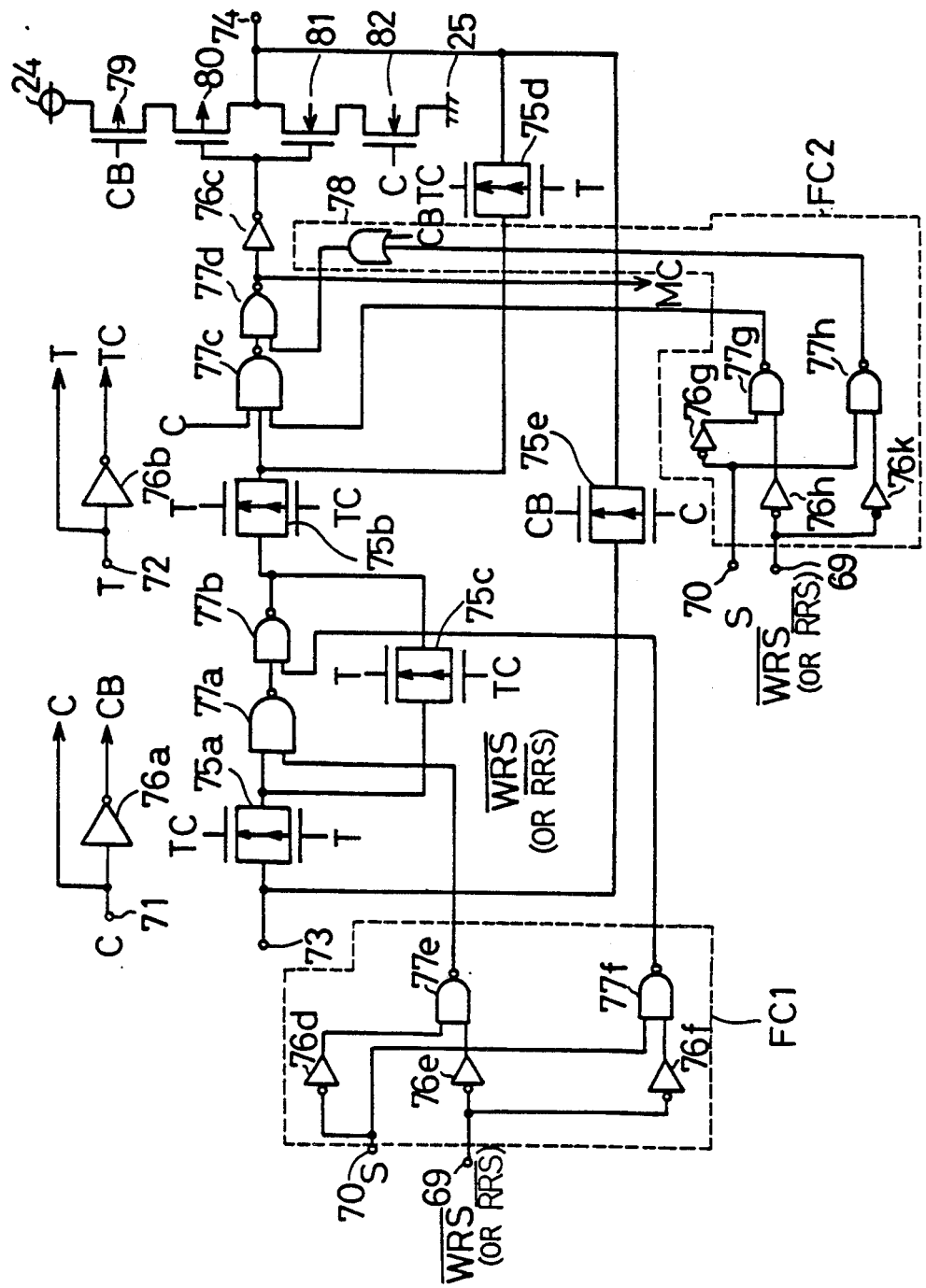
FIG. 13 is a circuit diagram of a flip-flop circuit including a data through circuit for the semiconductor memory of FIG. 12.

Referring now to FIG. 13, description will be given on the circuit structure of the flip-flop circuits for use in the write bit point portions $9CW_1$ to $9CW_{n+k}$ of the write bit address pointer 11b and the read bit pointer portions $9CR_1$ to $9CR_{n+k}$ of the read bit address pointer 13b. In FIG. 13, reference numeral 69 designates a reset signal input terminal receiving the reset signal $\overline{WRS}$ or $\overline{RRS}$ of FIG. 12; 70 designates a control input terminal receiving the control signal S for setting the first and second reset states; 71 designates a control terminal receiving the control signal C from the control circuit 10 of FIG. 12; 72 designates a clock signal input terminal which receives the dock signal $T_1$ of FIG. 12 for the write bit pointer portions $9CW_2$ to $9CW_{n+k}$ and receives the clock signal $T_3$ for the read bit pointer portions $9CR_2$ to $9CR_{n+k}$. The clock signals $T_1$ and $T_3$ arc referred to as a clock signal T hereinafter.

Reference numeral 73 designates an input terminal receiving the output signal from a slave latch circuit included in the preceding flip-flop circuit; 74 designates an output terminal outputting an output signal to an input terminal of a master latch circuit included in the succeeding flip-flop circuit; and 75a to 75e designate transmission gates including PMOS transistors and NMOS transistors. The transmission gate 75a is connected at its first end to the input terminal 73 and turns on/off in synchronism with the logically inverted signal of the clock signal T. The transmission gate 75b is provided between the master latch circuit and the slave latch circuit and turns on/off in synchronism with the clock signal T. The transmission gate 75d is connected at its first end to the output terminal 74 and turns on/off in synchronism with the logically inverted signal of the clock signal T. The transmission gate 75c is connected at its first end to the transmission gate 75a and connected at its second end to a first end of the transmission gate 75b, and turns on/off in synchronism with the clock signal T. Reference numeral 79 designates a PMOS transistor having a source electrode connected to the power supply 24 and a gate electrode receiving the logically inverted signal CB of the control signal; 82 designates an NMOS transistor having a grounded source electrode and a gate electrode receiving the control signal C; 80 and 81 designate PMOS and NMOS transistors connected in series between the transistors 79 and 82 and having the gate electrodes connected in common to form an inverter; 76a to 76k designate inverters; and 77a to 77h designate NAND gates. A first input of the NAND gate 77a is connected to a second end of the transmission gate 75a, and a second input thereof receives an output signal from a set/reset control circuit FC1. A first input of the NAND gate 77b is connected to the output of the NAND gate 77a, and a second input thereof receives the output signal from the set/reset control circuit FC1. A first input of the NAND gate 77c is connected to a second end of the transmission gate 75b, and a second input thereof receives an output signal from a set/reset control circuit FC2, while a third input thereof receives the control signal C. A first input of the NAND gate 77d is connected to the output of the NAND gate 77c, and a second input thereof receives the output signal from the set/reset control circuit FC2. The input of the inverter 76c is connected to the output of the NAND gate 77d. The input of the inverter 76a is connected to the control signal input terminal 71. The input of the inverter 76b is connected to the clock signal input terminal 72.

The control signal C inputted to the control terminal 71 is separated into the signals C and CB, the control signal C being transmitted as it is to the respective portions, the signal CB being obtained by inverting the control signal C in the inverter 76a. The control signal C is inputted to the gate of the MOS transistor 82 and to the NAND gate 77c. The signal CB is inputted to the gate of the MOS transistor 79. The clock signal T inputted from the clock signal input terminal 72 is separated into the clock signal T and the inverted clock signal TC, the signal T being transmitted as it is to the respective portions, the signal TC being obtained by inverting the clock signal T in the inverter 76b. The clock signal T and the inverted clock signal TC are inputted to the transmission gates 75a to 75d.

The set/reset control circuit FC1 includes three inverters 76d to 76f and two NAND gates 77e, 77f. The set/reset control circuit FC2 includes three inverters 76g, 76h, 76k, two NAND gates 77g, 77h, and an OR gate 78. The structure of the flip-flop circuit of FIG. 13 is substantially the same as that of the flip-flop circuit of FIG. 5. The differences therebetween are that the inverter 40c of FIG. 5 connected at the output to the transmission gate 34b is replaced with the NAND gate 77b of FIG. 13 for changing the operation of the flip-flop circuit by means of the set/reset control circuits FC1 and FC2, and that the inverter 40d of FIG. 5 connected to the output of the NAND gate 40e is replaced with the NAND gate 77d of FIG. 13.

The operation of the set/reset control circuit FC1 and FC2 will be discussed below. When the start address control signal S from the start address control circuit 100 of FIG. 12 is "L", the inverter 76d receiving the control signal S in the set/reset control circuit FC1 outputs the "H" level. When the reset signal $\overline{WRS}$ or $\overline{RRS}$ at the "L" level is inputted, the inverter 76e inverts the reset signal $\overline{WRS}$ or $\overline{RRS}$, which is inputted to the NAND gate 77e that also receives the output of the inverter 76d at the "H" level. Thus the "H" level is inputted to both of the inputs of the NAND gate 77e, which in turn outputs the "L" level. The NAND gate 77a connected to the transmission gate 75a and receiving the output of the NAND gate 77e outputs the "H" level independently of the signal inputted to the input terminal 73. On the other hand, when the reset signal $\overline{WRS}$ or $\overline{RRS}$ at the "L" level is inputted, the inverter 76f inverts the reset signal $\overline{WRS}$ or $\overline{RRS}$, which is inputted to the NAND gate 77f which directly receives the start address control signal S. Thus the "H" and "L" levels are inputted to the inputs of the NAND gate 77f, which in turn outputs the "H" level. At this time, the NAND, ID gate 77b connected at the output to the transmission gate 75b, on receiving the outputs of the NAND gates 77a and 77f, outputs the "L" level.

In the set/reset control circuit FC2, the inverter 76g which receives the control signal S at the "L" level outputs the "H" level. When the reset signal $\overline{WRS}$ or $\overline{RRS}$ at the "L" level is inputted, the inverter 76h inverts the reset signal $\overline{WRS}$ or $\overline{RRS}$, which is inputted to the NAND gate 77g which also receives the output of the inverter 76g at the "H" level. Thus the "H" level is inputted to both of the inputs of the NAND gate 77g, which in turn outputs the "L" level. The NAND gate 77c connected to the transmission gate 75b and receiving the output of the NAND gate 77g outputs the "H" level. On the other hand, when the reset signal $\overline{WRS}$ or $\overline{RRS}$ at the "L" level is inputted, the inverter 76k inverts the reset signal $\overline{WRS}$ or $\overline{RRS}$, which is inputted to the NAND gate 77h which directly receives the start address control signal S. Thus the "H" and "L" levels are inputted to the inputs of the NAND gate 77h, which in turn outputs the "H" level. This signal is inputted to the NAND gate 77d through the OR gate 78. At this time, the NAND gate 77d connected to the output of the NAND gate 77c, on receiving the output signals from the NAND gate 77c and OR gate 78, outputs the "L" level.

Specifically, when the reset signal $\overline{WRS}$ or $\overline{RRS}$ arc inputted while the control signal S is "L", the set/reset control circuits FC1 and Fc2 set the master and slave latch circuits to the second reset state.

When the start address control signal S is "H", the inverter 75d receiving the start address control signal S in the set/reset control circuit FC1 outputs the "L" level. When the reset signal $\overline{WRS}$ or $\overline{RRS}$ at the "L" level is inputted, the inverter 76e inverts the reset signal $\overline{WRS}$ or $\overline{RRS}$, which is inputted to the NAND gate 77e which also receives the output of the inverter 76d at the "L" level. Thus the "H" and "L" levels arc inputted to the inputs of the NAND gate 77e, which in turn outputs the "H" level. The NAND gate 77a which receives the output of the NAND gate 77e at its second input connected to the transmission gate 75a inverts the signal inputted to its first input to output the inverted signal. On the other hand, when the reset signal $\overline{WRS}$ or $\overline{RRS}$ at the "H" level is inputted, the inverter 76f inverts the reset signal $\overline{WRS}$ or $\overline{RRS}$, which is inputted to the NAND gate 77f which directly receives the start address control signal S. Thus the "H" level is inputted to both of the inputs of the NAND gate 77f, which in turn outputs the "L" level. The NAND gate 77b connected at its output to the transmission gate 75b outputs the "H" level.

In the set/reset control circuit FC2, the inverter 76g which receives the start address control signal S at the "H" level outputs the "L" level. When the reset signal $\overline{WRS}$ or $\overline{RRS}$ at the "H" level is inputted, the inverter 76h inverts the reset signal $\overline{WRS}$ or $\overline{RRS}$, which is inputted to the NAND gate 77g which also receives the output of the inverter 76g at the "L" level. Thus the "L" level is inputted to both of the inputs of the NAND gate 77g, which in turn outputs the "H" level. The NAND gate 77c which receives the output of the NAND gate 77g at its second input connected to the transmission gate 75b inverts the signal inputted to its first input to output the inverted signal. On the other hand, when the reset signal $\overline{WRS}$ or $\overline{RRS}$ at the "L" level is inputted, the inverter 76k inverts the reset signal $\overline{WRS}$ or $\overline{RRS}$, which is inputted to the NAND gate 77h which directly receives the start address control signal S. Thus the "H" level is inputted to both of the inputs of the NAND gate 77h, which in turn outputs the "L" level. This output is inputted to the NAND gate 77c connected to the transmission gate 75b, and then the NAND gate 77c outputs the "H" level. The output of the inverter 77h is inputted to the NAND gate 77d through the OR gate 78. The NAND gate 77d connected to the output of the NAND gate 77c outputs the "H" level.

Specifically, when the reset signal $\overline{WRS}$ or $\overline{RRS}$ are inputted while the control signal S is "H", the set/reset control circuits FC1 and FC2 set the master and slave latch circuits to the first reset state.

The OR gate 78 is provided to output the output signal MC at the "L" level when the logically inverted signal CB of the control signal C is "H", that is, when the data through circuit of the flip-flop circuit is operated.

For example, the start address is supposed to be set to the write bit pointer portion $9CW_1$ of the write bit address pointer 11b and to the read bit pointer portion $9CR_1$ of the read bit address pointer 13b. The reset signal $\overline{WRS}$ or $\overline{RRS}$ causes the write bit pointer portion $9CW_1$ and the read bit pointer portion $9CR_1$ to enter the first reset state, and causes the other write bit pointer portions and read bit pointer portions to enter the second reset state.

Description will be given hereinafter on the operation of the semiconductor memory of the third preferred embodiment.

The write and read operations where no fault is caused in the regular memory cells 7 in the first to n-th columns in the third preferred embodiment are identical with those of the semiconductor memory of FIG. 2 in the first preferred embodiment.

The write and read operations where a fault is caused in the regular memory cells 7 in the second to n-th columns in the third preferred embodiment are also identical with those of the semiconductor memory of FIG. 2 in the first preferred embodiment.

The write operation where there is a defective regular memory cell which determines the start address in the memory cell array 1 will be now described below. For the purpose of simplification, the memory cell array 1 is assumed to have m rows and four columns, the fourth column being the redundancy memory cell column. The fault is caused in a memory cell 7 in the first column. For selection of the undefective memory cell columns, it is necessary to place the write bit pointer portions $9CW_2$ to $9CW_4$ into normal operation. For this purpose, the control circuit 10 outputs the control signal C at the "H" level potential to the write bit pointer portions $9CW_2$ to $9CW_4$. At the same time, for non-selection of the memory cells in the first column having the defective memory cell, it is necessary to inhibit the flip-flop operation of the write bit pointer portion $9CW_1$ and to place the data through circuit into operation.

For this purpose, the control circuit 10 outputs the control signal C at the "L" level potential to the write bit pointer portion $9CW_1$. When the reset signal is inputted, it is required to set the write and read bit pointer portions which determine the start address of the write and read bit address pointers 11b and 13b. For example, when the reset signal $\overline{WRS}$ or $\overline{RRS}$ is inputted, in order to cause the write bit pointer portion $9CW_2$ and the read bit pointer portion $9CR_2$ to serve as the start address, the start address control circuit 100 outputs the start address control signal at the "H" level potential to the write bit pointer portion $9CW_2$ and the read bit pointer portion $9CR_2$.

Under the foregoing establishments, when the reset signal $\overline{\text{WRS}}$ is inputted to the write bit address pointer 11b, the write bit pointer portion 9CW$_2$ and the write word pointer portion 8RW$_1$ enter the first reset state, and the write bit pointer portions 9CW$_3$, 9CW$_4$ and the write word pointer portions 8RW$_2$ to 8RW$_m$ enter the second reset state. Then data is written into the memory cell corresponding to both the memory cell selection line 7SCW$_2$ of the write bit pointer portion 9CW$_2$ and the memory cell selection line 7SRW$_1$ of the write word pointer portion 8RW$_1$.

The data transmitted to the memory cell array 1 from the input circuit 2 of FIG. 9, as is not shown in FIG. 12, is written into the memory cell in the memory cell array 1 which is selected by the write bit address pointer lib and the write word address pointer 12b which form the input address part 3. When the write bit address pointer 11b includes the flip-flop circuits, for example, of FIG. 13, the data is shifted to the next write bit pointer portion 9CW$_3$ as the dock signal T$_1$ proceeds two cycles. The memory cell selection line 7SCW$_3$ outputs the signal for memory cell selection, and the data is written into the memory cell corresponding to the memory cell selection lines 7SCW$_3$ and 7SRW$_1$. The data is transmitted as it is to the next write bit pointer portion 9CW$_4$. The write bit pointer portion 9CW$_4$ for redundancy memory cell selection, however, is designed to operate as the flip-flop circuit by the control signal C from the control circuit 10. Therefore the data is held in the write bit pointer portion 9CW$_4$, and the memory cell selection line 7SCW$_4$ outputs the signal for memory cell selection. The data passes through the write bit pointer portion 9CW$_1$ without the write operation, so that the defective memory cell is not selected.

The read operation of data from the memory cells where there is a defective regular memory cell will be now described below. For the purpose of simplification, the memory cell array 1 is assumed to have m rows and four columns, the fourth column being the redundancy memory cell column. The fault is caused in a memory cell 7 in the first column. For selection of the undefective memory cell columns, it is necessary to place the mad bit pointer portions 9CR$_2$ to 9CR$_4$ into normal operation. For this purpose, the control circuit 10 outputs the control signal C at the "H" level potential to the mad bit pointer portions 9CR$_2$ to 9CR$_4$. At the same time, for non-selection of the memory cells in the first column having the defective memory cell, it is necessary to inhibit the flip-flop operation of the read bit pointer portion 9CR$_1$ and to place the data through circuit into operation. For this purpose, the control circuit 10 outputs the control signal C at the "L" level potential to the read bit pointer portion 9CR$_1$. Furthermore, it is necessary to set the write bit pointer portion and the read bit pointer portion for determining the start address of the write bit address pointer 11b and the read bit address pointer 13b, when the reset signal is inputted. For example, in order to cause the write bit pointer portion 9CW$_2$ and the read bit pointer portion 9CR$_2$ to serve as the start address when the reset signal $\overline{\text{WRS}}$ or $\overline{\text{RRS}}$ is inputted, the start address control circuit 100 outputs the start address control signal at the "H" level potential to the write bit pointer portion 9CW$_2$ and the read bit pointer portion 9CR$_2$.

Under the foregoing establishments, when the reset signal $\overline{\text{RRS}}$ is inputted to the read bit address pointer 13b and the read word address pointer 14b, the read bit pointer portion 9CR$_1$ and the read word pointer portion 8RR$_1$ enter the first reset state, and the read bit pointer portions 9CR$_3$, 9CR$_4$ and the read word pointer portions 8RR$_2$ to 8RR$_m$ enter the second reset state. Then data is read from the memory cell corresponding to both the memory cell selection line 7SCR$_2$ of the read bit pointer portion 9CR$_2$ and the memory cell selection line 7SRR$_1$ of the read word pointer portion 8RR$_1$. The data is shifted to the next read bit pointer portion 9CR$_3$ in synchronism with the clock signal T$_1$, and the memory cell selection line 7SCR$_3$ outputs the signal for memory cell selection. Then the data is read from the memory cell corresponding to both the memory cell selection lines 7SCR$_3$ and 7SRR$_1$. The read bit pointer portion 9CR$_4$ is designed to operate as the flip-flop circuit by the control signal C from the control circuit 10. Therefore the data for memory cell selection is held in the read bit pointer portion 9CR$_4$, and the memory cell selection line 7SCR$_4$ outputs the data for memory cell selection. The four memory cells in the first row are sequentially selected to read data therefrom as the columns are shifted. As the data, after travelling round in the address part, comes to the read bit pointer portion 9CR$_1$, the read bit pointer portion 9CR$_1$ does not hold the data since it is designed by the control signal C from the control circuit 10 not to operate as the flip-flop circuit but to operate the data through circuit. The data is transmitted as it is to the next read bit pointer portion 9CR$_2$. The data passes through the read bit pointer portion 9CR$_1$ without the read operation, so that the defective memory cell is not selected.

The control circuit 10 has a structure as shown in FIG. 3 when the memory cell array 1 has four columns including the redundancy circuit column. The output signals Y1 to Y4 of the control circuit 10 corresponding to the control signal C are assumed to be inputted to the write bit pointer portions 9CW$_1$ to 9CW$_4$ and to the read bit pointer portions 9CR$_1$ to 9CR$_4$, respectively. At this time, the fuses 20a and 20b of the signal generator 26 in the control circuit of FIG. 3 are cut off to set the output signal Y1 to "L" when the defective memory cell lies in the first column.

The start address control circuit 100 has a structure as shown in FIG. 4 when the memory cell array 1 has four columns including the redundancy circuit column. The output signals Y1 to Y4 of the start address control circuit 100 corresponding to the control signal C are assumed to be inputted to the write bit pointer portions 9CW$_1$ to 9CW$_4$ and to the read bit pointer portions 9CR$_1$ to 9CR$_4$, respectively. At this time, the fuses 20a and 20c of the signal generator 26 in the control circuit of FIG. 4 are cut off to set the output signal Y1 to "L", the fuse 20b left uncut, when the defective memory cell lies in the first column.

Fourth Preferred Embodiment

Figure 14:
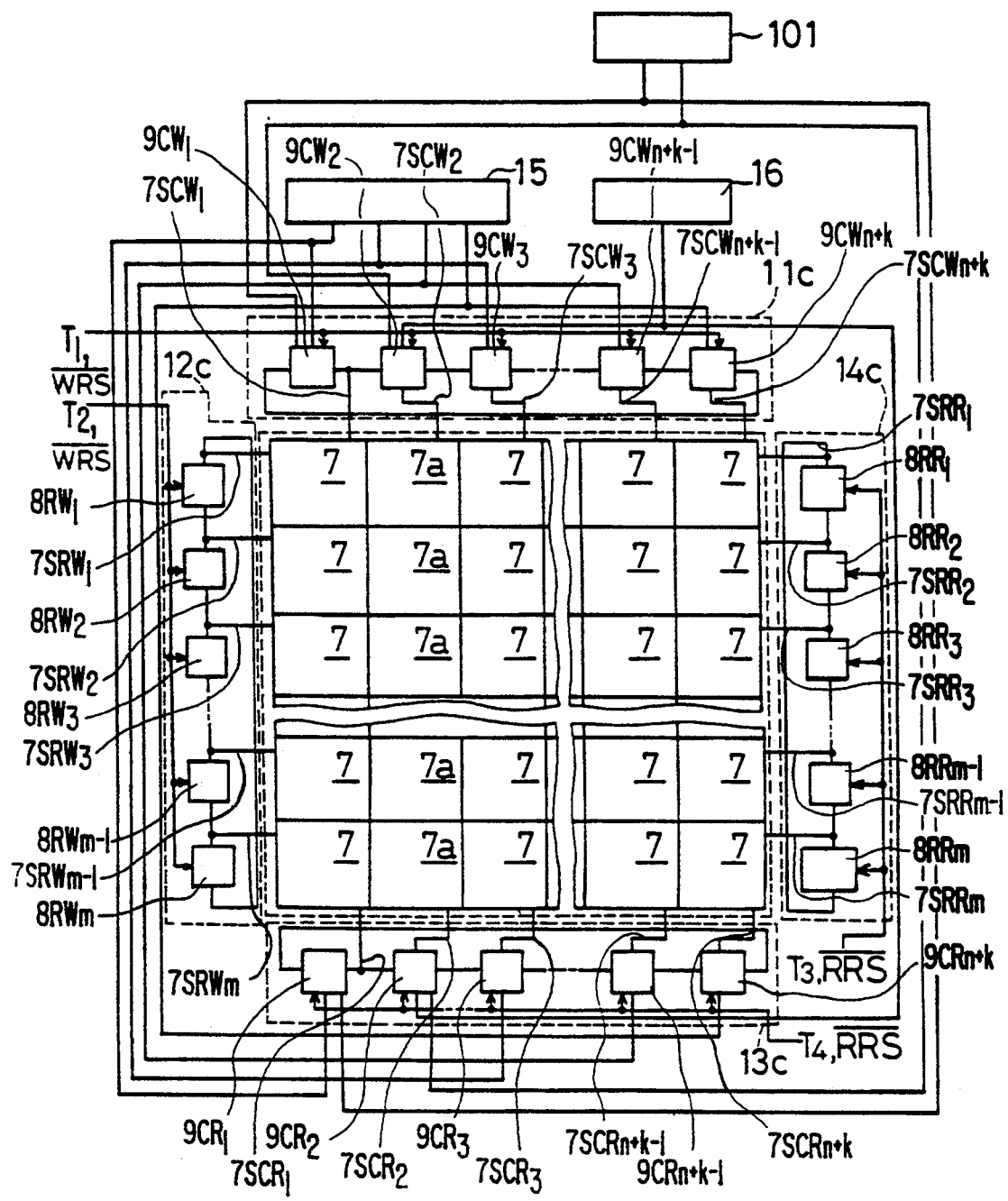
FIG. 14 is a partial block diagram of the semiconductor memory of a fourth preferred embodiment according to the present invention.

A fourth preferred embodiment according to the present invention will be discussed hereinafter with reference to FIG. 14. FIG. 14 is a partial block diagram of the semiconductor memory of the fourth preferred embodiment according to the present invention. In FIG. 14, there is shown an arrangement corresponding to the memory cell array 1, input address part 3, output address part 5, control circuit 6 and start address control circuit 110 of the semiconductor memory of FIG. 11. Reference numeral 1 designates a memory cell array of the same structure as that shown in FIG. 9. Reference characters 7SCW$_1$ to 7SCW$_{n+k}$, 7SCR$_1$ to 7SCR$_{n+k}$, 7SRW$_1$ to 7SRW$_m$, and 7SRR$_1$ to 7SRR$_m$ are memory cell selection lines identical with those of FIG. 9.

Reference character 11c designates a write bit address pointer forming the input address part which includes (n+k) in-series connected memory cell selecting portions or write bit pointer portions $9CW_1$ to $9CW_{n+k}$ provided in corresponding relation to the column write memory cell selection lines $7SCW_1$ to $7SCW_{n+k}$ and having column selection output nodes connected to the corresponding column write memory cell selection lines $7SCW_1$ to $7SCW_{n+k}$, respectively. The write bit pointer portion $9CW_1$ or $9CW_2$ corresponding to the first column serving as the start position includes the flip-flop circuit of FIG. 13, and each of the other write bit pointer portions $9CW_3$ to $9CW_{n+k}$ includes the flip-flop circuit of FIG. 5 having therein a data through circuit connected between the input and output nodes thereof for transmitting the information inputted to the input node as it is to the output node. In the fourth preferred embodiment, for example, the write bit pointer portion $9CW_2$ is a memory cell selecting portion for selecting the spare memory cells 7a. The start address is set by the write bit pointer portions $9CW_1$ and $9CW_2$ controlled by the start address control circuit 101. The respective write bit pointer portions $9CW_1$ to $9CW_{n+k}$ of the write bit address pointer 11c arc reset by the write reset signal $\overline{WRS}$. Then the write bit pointer portion $9CW_1$ outputs the signal for selection of the memory cells, at the "H" level potential herein, through the column write memory cell selection line $7SCW_1$, and the other write bit pointer portions $9CW_2$ to $9CW_{n+k}$ output the signals for non-selection of the memory cells, at the "L" level potential herein, through the column write memory cell selection lines $7SCW_2$ to $7SCW_{n+k}$. The respective write bit pointer portions $9CW_1$ to $9CW_{n+k}$ transmit the data for sequential selection of the column write memory cell selection lines to the next write bit pointer portion in synchronism with the write column clock signal $T_1$.

Reference character 12c designates a write word address pointer forming the input address part, which has the same function as the write word address pointer 12 of FIG. 2.

Reference character 13c designates a read bit address pointer forming the output address part which includes (n+k) in-series connected memory cell selecting portions or read bit pointer portions $9CR_1$ to $9CR_{n+k}$ provided in corresponding relation to the column read memory cell selection lines $7SCR_1$ to $7SCR_{n+k}$ and having column selection output nodes connected to the corresponding column read memory cell selection lines $7SCR_1$ to $7SCR_{n+k}$, respectively. The read bit pointer portion $9CR_1$ or $9CR_2$ corresponding to the first column serving as the start position includes the flip-flop circuit of FIG. 13, and each of the other read bit pointer portions $9CR_3$ to $9CR_{n+k}$ includes a flip-flop circuit having therein a data through circuit connected between the input and output nodes thereof for transmitting the information inputted to the input node as it is to the output node. In the fourth preferred embodiment, for example, the read bit pointer portion $9CR_2$ is a memory cell selecting portion for selecting the spare memory cells 7a. The start address control circuit 101 controls the read bit pointer portions $9CR_1$ and $9CR_2$. The respective read bit pointer portions $9CR_1$ to $9CR_{n+k}$ of the read bit address pointer 13c are reset by the read reset signal $\overline{RRS}$. Then the read bit pointer portion $9CR_1$ outputs the signal for selection of the memory cells, at the "H" level potential herein, through the column read memory cell selection line $7SCR_1$, and the other read bit pointer portions $9CR_2$ to $9CR_{n+k}$ output the signals for non-selection of the memory cells, at the "L" level potential herein, through the column read memory cell selection lines $7SCR_2$ to $7SCR_{n+k}$. The respective read bit pointer portions $9CR_1$ to $9CR_{n+k}$ transmit the data for sequential selection of the column read memory cell selection lines to the next read bit pointer portion in synchronism with the read column dock signal $T_3$.

Reference character 14c designates a read word address pointer forming the output address part, which has the same function as the read word address pointer 14 of FIG. 2.

Reference numeral 15 designates a control circuit for outputting a control signal which controls some of the write and read bit pointer portions $9CW_1$ to $9CW_{n+k}$ and $9CR_1$ to $9CR_{n+k}$ of the write and read bit address pointers 11c and 13c which select the regular memory cells. When there are no defective regular memory cells in the first to (n+k)-th columns, the control circuit 15 places into normal operation the flip-flop circuits of the write and read bit pointer portions which select the regular memory cells in the first to (n+k)-th columns, and outputs the control signal C, at the "H" level potential herein, which does not permit the operation of the data through circuits.

The operation of the control circuit 15 where there is a defective regular memory cell in the first to (n+k)-th columns will be described below. The control circuit 15 causes the write bit pointer portion of the write bit address pointer 11c and the read bit pointer portion of the read bit address pointer 13c in the column including the defective memory cell to output the signal for non-selection of the bit lines, at the "L" level potential herein, from the column selection output nodes of the flip-flop circuits through the memory cell selection lines, and outputs the control signal C which places the data through circuits into operation or which permits electrical conduction between the input and output nodes, at the "L" level potential herein, to the pointer portions. The control circuit 15 also places into normal operation the flip-flop circuits of the write bit pointer portions of the write bit address pointer 11c and the read bit pointer portions of the read bit address pointer 13c in the columns which do not include the defective memory cell, and outputs the control signal C which does not permit the data through circuits to operate, at the "H" level potential herein, to the pointer portions.

Reference numeral 16 designates a spare control circuit for outputting the control signal which controls some of the write and read bit pointer portions $9CW_1$ to $9CW_{n+k}$ and $9CR_1$ to $9CR_{n+k}$ of the write and read bit address pointers 11c and 13c which select the spare memory cells for redundancy. The operation of the spare control circuit 16 when there are no defective regular memory cells in the first to (n+k)-th columns will be described below. The spare control circuit 16 causes the pointer portions which select the spare memory cells, for example the write and read bit pointer portions $9CW_2$ and $9CR_2$ in the first to (n+k)-th columns to output the signal for non-selection of the bit lines, at the "L" level potential herein, from the column selection output nodes through the memory cell selection lines $7SCW_2$ and $7SCR_2$, and outputs the control signal C, at the "L" level potential herein, which places the data through circuits into operation or which permits electrical conduction between the input and output nodes to the pointer portions.

The operation of the spare control circuit 15 where there is a defective regular memory cell in the first to (n+k)-th columns will be described below. The spare control circuit 15 places into operation the flip-flop circuits of the write and mad bit pointer portions of the write bit address pointers 11c and 13c in the column, for example the second column, including the redundancy spare memory cells 7a, and outputs the control signal C, at the "H" level potential herein, which does not permit the data through circuits to operate to the pointer portions. The spare control circuit 15 also causes the write and read bit pointer portions of the write and mad bit address pointer 11c and 13c in the columns which arc not substituted for the regular memory cell columns among the first to (n+k)-th columns including the spare memory cells for redundancy to output the signal for non-selection of the bit lines, at the "L" level potential herein, from the column selection output nodes of the flip-flop circuits, and outputs the control signal C, at the "L" level potential herein, which places the data through circuits into operation or which permits electrical conduction between the input and output nodes to the pointer portions.

Reference numeral 101 designates a start address control circuit for outputting the start address control signal S which controls the write bit pointer portions $9CW_1$ and $9CW_2$ of the write bit address pointer 11c and the read bit pointer portions $9CR_1$ and $9CR_2$ of the mad bit address pointer 13c to determine the start address. At the time of reset, the start address control circuit 101 outputs the start address control signal S at the "H" level potential to one of the write bit pointer portion $9CW_1$ or $9CW_2$ of the write bit address pointer 11c and the read bit pointer portion $9CR_1$ or $9CR_2$ of the read bit address pointer 13c in the first or second column so that its flip-flop circuit enters the first reset state, and outputs the start address control signal S at the "L" level potential to the other bit pointer portion.

The detailed structure of the write bit pointer portions $9CW_1$ to $9CW_{n+k}$ of the write bit address pointer 11c, the write word pointer portions $8RW_1$ to $8RW_m$ of the write word address pointer 12c, the read bit pointer portions $9CR_1$ to $9CR_{n+k}$ of the read bit address pointer 13c, and the read word pointer portions $8RR_1$ to $8RR_m$ of the read word address pointer 14c in the fourth preferred embodiment is identical with that of the first preferred embodiment. The fourth preferred embodiment differs from the first preferred embodiment in that the control circuit 15 and the spare control circuit 16 are provided in the fourth preferred embodiment and in the connection of the control circuits 15 and 16 to the respective pointer portions. The control circuit 15, which must be adapted to output the control signal for selecting all of the memory cells where there is no defective regular memory cell, is not permitted to have the circuit structure of FIG. 3 which constantly outputs the "L" level potential to one of the bit pointer portions. Thus the control circuit 15 employs the circuit structure which may output the "H" level potential to all of the bit pointer portions as shown in FIG. 4.

The detailed structure of the spare control circuit 16 varies depending on the number of columns k in which the spare memory cells are arranged, but is conceptually identical with that of the control circuit 16 of FIG. 9.

The start address control circuit 101 may be of conceptually the same structure as the control circuit 10 of FIG. 3. In general, the "H" level potential should be outputted for selection of respective one of the write bit pointer portions $9CW_1$ to $9CW_{n+k}$ and the read bit pointer portions $9CR_1$ to $9CR_{n+1}$. In the fourth preferred embodiment, the write bit pointer portion $9CW_1$ or $9CW_2$ and the read bit pointer portion $9CR_1$ or $9CR_2$ are selected.

Description will be given hereinafter on the operation of the semiconductor memory of the fourth preferred embodiment.

The write and read operations where there is no defective regular memory cell 7 in the memory cell array 1 are identical with those of the semiconductor memory of FIG. 9. The operation where no fault is caused in the memory cells 7 in the first column selected by the write and read bit pointer portions $9CW_1$ and $9CR_1$ which determine the start address is identical with the operation where the fault is caused in a memory cell in the second to (n+k)-th columns of FIG. 9.

The write operation where the fault is caused in a regular memory cell selected by the write bit pointer portion $9CW_1$ which determines the start address in the memory cell array 1 will be now described below. For the purpose of simplification, the memory cell array 1 is assumed to have m rows and four columns, the second column being the redundancy memory cell column. The fault is caused in a memory cell 7 in the first column. For selection of the undefective memory cell columns, it is necessary to place the write bit pointer portions $9CW_2$ to $9CW_4$ into normal operation. For this purpose, the control circuit 15 outputs the control signal C at the "H" level potential to the write bit pointer portions $9CW_3$ and $9CW_4$, and the control circuit 16 outputs the control signal C at the "H" level potential to the write bit pointer portion $9CW_2$. At the same time, for non-selection of the memory cells in the first column having the defective memory cell, it is necessary to inhibit the flip-flop operation of the write bit pointer portion $9CW_1$ and to place the data through circuit into operation. For this purpose, the control circuit 15 outputs the control signal C at the "L" level potential to the write bit pointer portion $9CW_1$. In addition, anccd exists for setting the write and read bit pointer portions which determine the start address of the write and read bit address pointers 11c and 13c when the reset signal is inputted. For example, when the reset signal $\overline{WRS}$ or $\overline{RRS}$ is inputted, in order to cause the write bit pointer portion $9CW_2$ and the read bit pointer portion $9CR_2$ to serve as the start address, the start address control circuit 101 outputs the start address control signal at the "H" level potential to the write bit pointer portion $9CW_2$ and the read bit pointer portion $9CR_2$.

Under the foregoing establishments, when the reset signal $\overline{WRS}$ is inputted to the write bit address pointer 11c, the write bit pointer portion $9CW_1$ does not operate as the flip-flop circuit. The write bit pointer portion $9CW_2$ is reset to enter the first reset state, to produce and hold data for memory cell selection and to output the signal for memory cell selection through the memory cell selection line $7SCW_2$. Simultaneously with the input of the reset signal $\overline{WRS}$, the write bit pointer portions $9CW_3$ and $9CW_4$, if having data for memory cell selection, are reset to enter the second reset state so that the data thereof are erased. Similarly, the write word pointer portion $8RW_1$ of the write word address pointer 12c enter the first reset state and the write word portions $8RW_2$ to $8RW_m$ enter the second reset state in response to the reset signal $\overline{WRS}$. Then data is written into the memory cell corresponding to both the memory cell selection line $7SCW_2$ of the write bit pointer portion $9CW_2$ and the memory cell selection line $7SRW_1$ of the write word pointer portion $8RW_1$. The data is shifted to the next write bit pointer portion $9CW_3$ in synchronism with the clock signal $T_1$, and the memory cell selection line $7SCW_3$ outputs the signal for memory cell selection. The data is written into the memory cell corresponding to both the memory cell selection lines $7SCW_3$ and $7SRW_1$. The data is transmitted to the next write bit pointer portion $9CW_4$. The write bit pointer portion $9CW_4$ holds the data for memory cell selection, and the memory cell selection line $7SCW_4$ outputs the signal for memory cell selection. The data passes through the write bit pointer portion $9CW_1$ without the write operation, so that the defective memory cell is not selected.

The read operation of data from the memory cells where there is a defective regular memory cell will be now described below. For the purpose of simplification, the memory cell array 1 is assumed to have m rows and four columns, the fourth column being the redundancy memory cell column. It is assumed that the fault is caused in a memory cell 7, for example, in the first column. For selection of the undefective memory cell columns, it is necessary to place the read bit pointer portions $9CR_2$ to $9CR_4$ into normal operation. For this purpose, the control circuit 15 outputs the control signal C at the "H" level potential to the read bit pointer portions $9CR_3$ and $9CR_4$, and the spare control circuit 16 outputs the "H" level potential to the read bit pointer portion $9CR_2$. At the same time, for non-selection of the memory cells in the first column having the defective memory cell, it is necessary to inhibit the flip-flop operation of the read bit pointer portion $9CR_1$ and to place the data through circuit into operation. For this purpose, the control circuit 15 outputs the control signal C at the "L" level potential to the read bit pointer portion $9CR_1$. In addition, a need exists for setting the write and read bit pointer portions which determine the start address of the write and read bit address pointers 11c and 13c when the reset signal is inputted. For example, when the reset signal $\overline{WRS}$ or $\overline{RRS}$ is inputted, in order to cause the write bit pointer portion $9CW_2$ and the read bit pointer portion $9CR_2$ to serve as the start address, the start address control circuit 101 outputs the start address control signal at the "H" level potential to the write bit pointer portion $9CW_2$ and the read bit pointer portion $9CR_2$.

Under the foregoing establishments, when the reset signal $\overline{RRS}$ is inputted to the read bit address pointer 13c, the read bit pointer portion $9CR_1$ does not operate as the flip-flop circuit. The read bit pointer portion $9CR_2$ and the read word pointer portion $8RR_1$ enter the first reset state, and the read bit pointer portions $9CR_3$, $9CR_4$ and the read word pointer portions $8RR_2$ to $8RR_m$ enter the second reset state. Then data is read from the memory cell corresponding to both the memory cell selection line $7SCR_2$ of the read bit pointer portion $9CR_2$ and the memory cell selection line $7SRR_1$ of the read word pointer portion $8RR_1$. The data is shifted to the next read bit pointer portion $9CR_3$ in synchronism with the clock signal $T_1$, and the memory cell selection line $7SCR_3$ outputs the signal for memory cell selection. Then the data is read from the memory cell corresponding to both the memory cell selection lines $SCR_3$ and $7SRR_1$. The three memory cells 7 in the first row are sequentially selected to read data therefrom as the columns are shifted. The read bit pointer portion $9CR_1$, in turn, is designed by the control signal C from the control circuit 15 not to operate as the flip-flop circuit but to operate the data through circuit. Therefore the data is not held in the mad bit pointer portion $9CR_1$ but is transmitted to the next mad bit pointer portion $9CR_2$ as it is. The data passes through the mad bit pointer portion $9CR_1$ without the mad operation, so that the defective memory cell is not selected.

The control circuit 15 has a structure as shown in FIG. 3 when the memory cell array 1 has four columns including the redundancy circuit column. The output signals Y1 to Y4 of the control circuit 15 corresponding to the control signal C are assumed to be inputted to the write bit pointer portions $9CW_1$ to $9CW_4$ and to the read bit pointer portions $9CR_1$ to $9CR_4$, respectively. At this time, the fuses 20a and 20b of the signal generator 26 in the control circuit of FIG. 3 are cut off to set the output signal Y1 to "L" when the defective memory cell lies in the first column.

Figure 15:
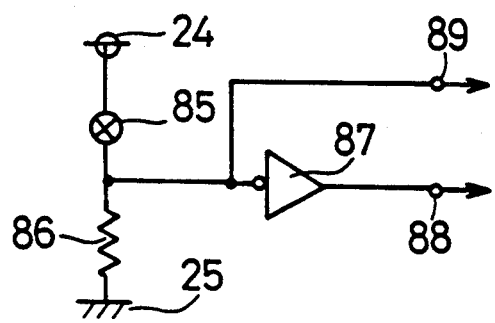
FIG. 15 is a circuit diagram of a start address control circuit for the semiconductor memory of FIG. 14.

The start address control circuit 101 has a structure as shown in FIG. 15 when the memory cell array 1 has four columns including the redundancy circuit column. The output signals of the start address control circuit 101 are assumed to be inputted to the write bit pointer portions $9CW_1$, $9CW_2$ and to the read bit pointer portions $9CR_1$, $9CR_2$, respectively. At this time, the fuse 85 in the control circuit of FIG. 15 are cut off to set the output signal to the write and read bit pointer portions $9CW_1$ and $9CR_1$ to "L", when the defective memory cell lies in the first column.

Fifth Preferred Embodiment

A fifth preferred embodiment according to the present invention will be discussed hereinafter with reference to FIG. 16. The semiconductor memory of the fifth preferred embodiment is provided by partially changing the semiconductor memory of FIG. 12 of the third preferred embodiment. Although the semiconductor memory of FIG. 12 comprises the start address control circuit 100 which controls all of the write bit pointer portions $9CW_1$ to $9CW_{n+k}$ and the read bit pointer portions $9CR_1$ to $9CR_{n+k}$, the semiconductor memory of FIG. 16 comprises a start address control circuit 103 which controls only the write bit pointer portion $9CW_2$ and the read bit pointer portion $9CR_2$. Thus write and read bit address pointers 11d and 13b shown in FIG. 16 comprise the write and read bit pointer portions $9CW_1$ and $9CR_1$ including the flip-flop circuit of FIG. 8, the write and read bit pointer portions $9CW_2$ and $9CR_2$ including the flip-flop circuit of FIG. 13, and the write and read bit pointer portions $9CW_3$ to $9CW_{n+k}$, $9CR_3$ to $9CR_{n+k}$ including the flip-flop circuit of FIG. 5, respectively.

Figure 11:
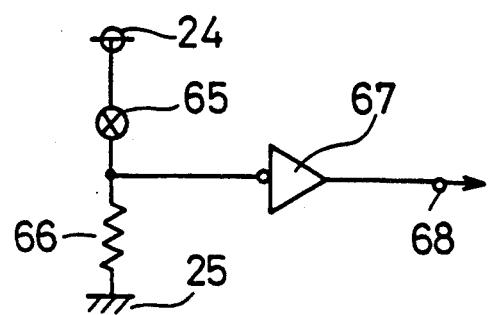
FIG. 11 is a circuit diagram of a spare control circuit for the semiconductor memory of FIG. 10.

The start address control circuit 103, which controls the write bit pointer portion $9CW_2$ and the read bit pointer potion $9CR_2$, may have a simple structure as shown in FIG. 11.

Sixth Preferred Embodiment

Figure 17:
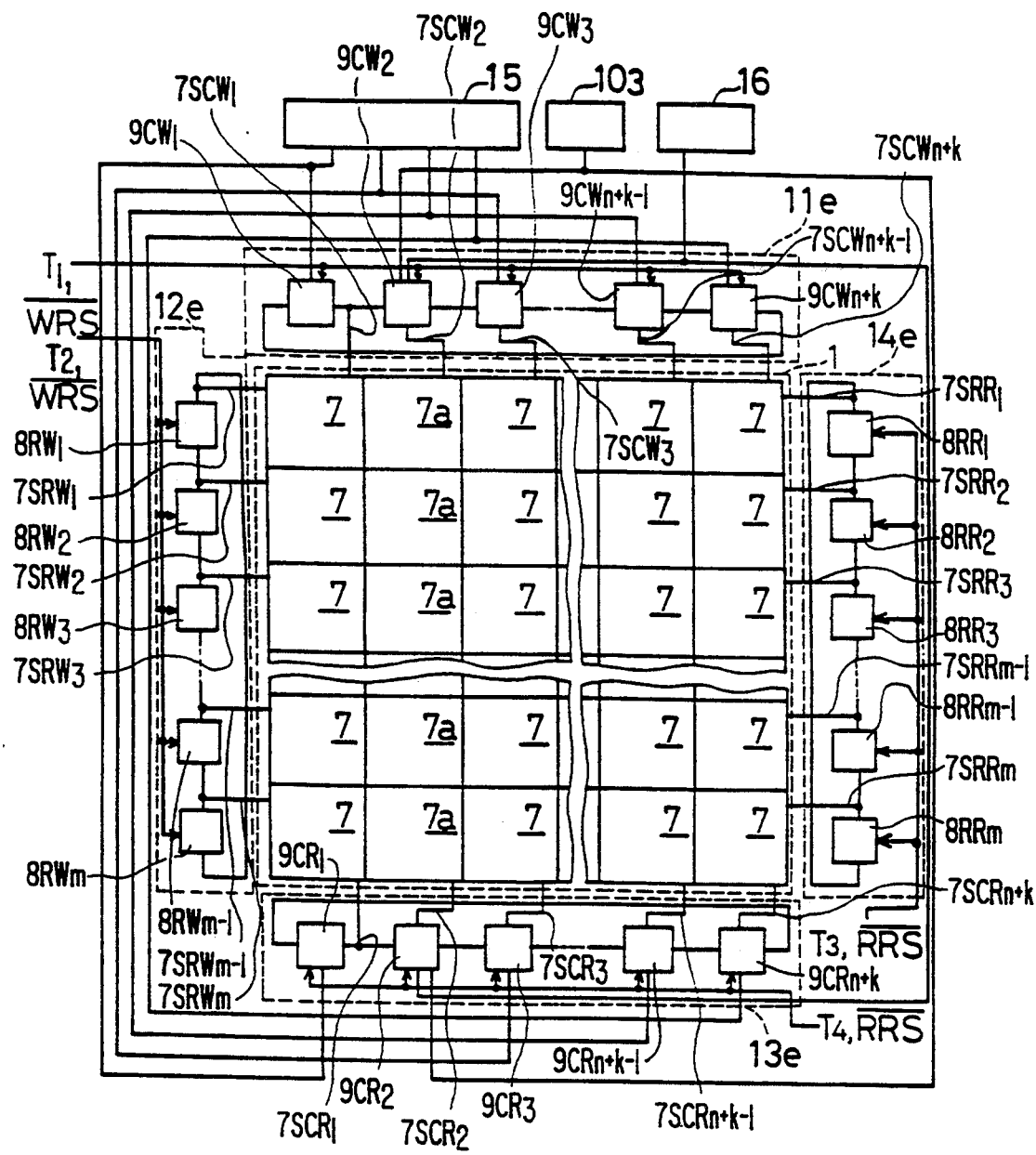
FIG. 17 is a partial block diagram of the semiconductor memory of a sixth preferred embodiment according to the present invention.

A sixth preferred embodiment according to the present invention will be discussed hereinafter with reference to FIG. 17. The semiconductor memory of the sixth preferred embodiment is provided by partially changing the semiconductor memory of FIG. 14 of the fourth preferred embodiment. Although the semiconductor memory of FIG. 14 comprises the start address control circuit 101 which controls the write bit pointer portions 9CW$_1$ and 9CW$_2$ and the read bit pointer portions 9CR$_1$ and 9CR$_2$, the semiconductor memory of FIG. 17 comprises the start address control circuit 103 which controls only the write bit pointer portion 9CW$_2$ and the read bit pointer portion 9CR$_2$. Thus write and read bit address pointers 11e and 13e shown in FIG. 17 comprise the write and read bit pointer portions 9CW$_1$ and 9CR$_1$ including the flip-flop circuit of FIG. 8, the write and read it pointer portions 9CW$_2$ and 9CR$_2$ including the flip-flop circuit of FIG. 13, and the write and read bit pointer portions 9CW$_3$ to 9CW$_{n+k}$, 9CR$_3$ to 9CR$_{n+k}$ including the flip-flop circuit of FIG. 5, respectively.

The start address control circuit 103, which controls the write bit pointer portion 9CW$_2$ and the read bit pointer potion 9CR$_2$, may have a simple structure as shown in FIG. 11.

Seventh Preferred Embodiment

Figure 18:
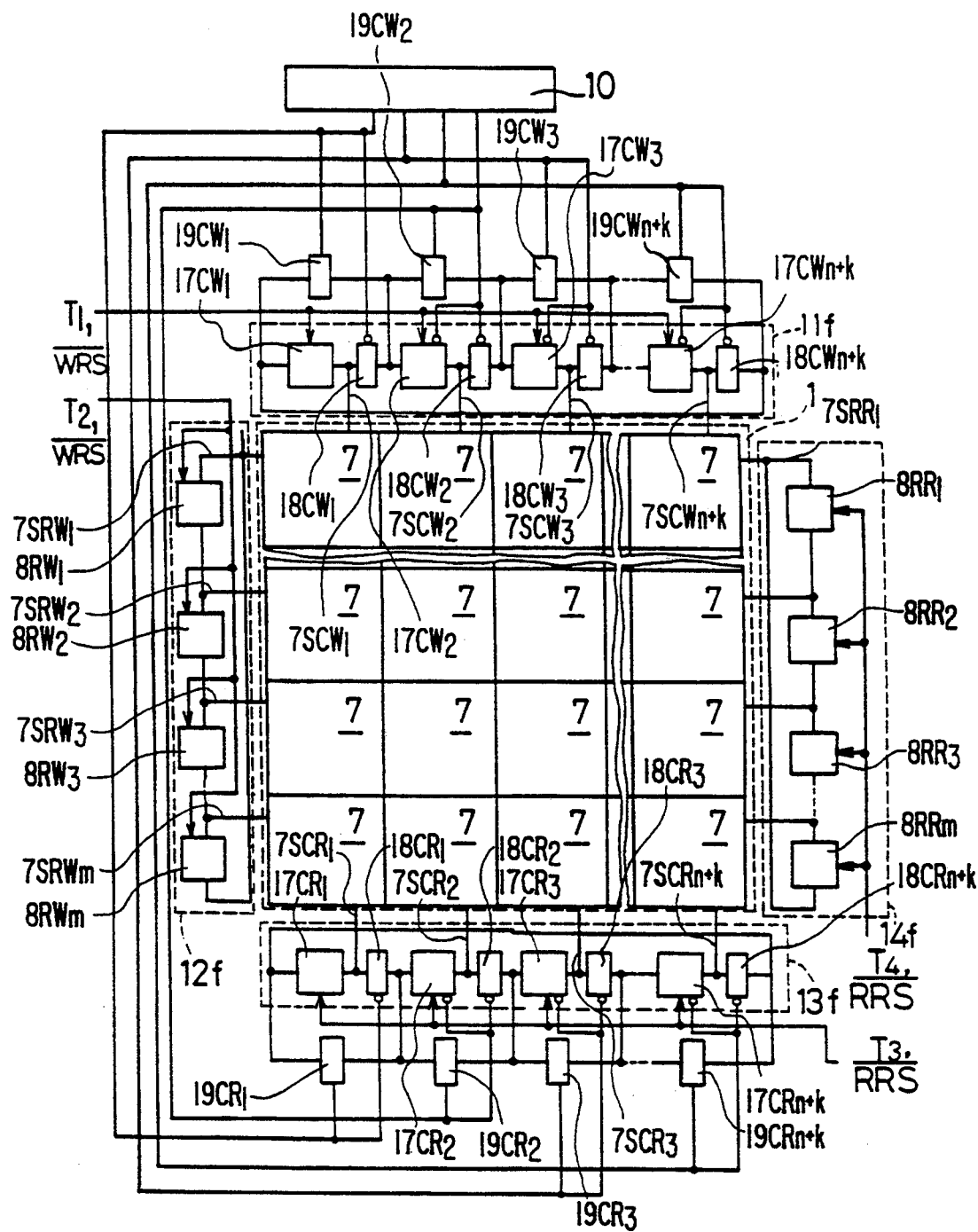
FIG. 18 is a partial block diagram of the semiconductor memory of a seventh preferred embodiment according to the present invention.

A seventh preferred embodiment according to the present invention will be described hereinafter with reference to FIG. 18. FIG. 18 is a partial block diagram of the semiconductor memory of the seventh preferred embodiment according to the present invention. In FIG. 18, there is shown an arrangement corresponding to the memory cell array 1, input address part 3, output address part 5, and control circuit 6 of the semiconductor memory of FIG. 1. Reference numeral 1 designates a memory cell array having the same structure as that shown in FIG. 2. Reference characters 7SCW$_1$ to 7SCW$_{n+k}$, 7SCR$_1$ to 7SCR$_{n+k}$, 7SRW$_1$ to 7SRW$_m$, and 7SRR$_1$ to 7SRR$_m$ are memory cell selection lines identical with those of FIG. 9. Reference character 11f designates a write bit address pointer forming the input address part which includes (n+k) memory cell selecting portions or write bit pointer portions 17CW$_1$ to 17CW$_{n+k}$ provided in corresponding relation to the column write memory cell selection lines 7SCW$_1$ to 7SCW$_{n+k}$ and having column selection output nodes connected to the corresponding column write memory cell selection lines 7SCW$_1$ to 7SCW$_{n+k}$, respectively. The write bit address pointer 11f also includes first switch circuits 18CW$_1$ to 18CW$_{n+k}$ which are connected in series alternately with the write bit pointer portions 17CW$_1$ to 17CW$_{n+k}$, respectively. The write bit pointer portion 17CW$_1$ corresponding to the first column serving as a start position includes a flip-flop circuit which enters the first reset state when it is reset to determine the start address, and each of the other write bit pointer portions 17CW$_2$ to 9CW$_{n+k}$ includes a flip-flop circuit which enters the second reset state when it is reset. The respective write bit pointer portions 17CW$_1$ to 17CW$_{n+k}$ of the write bit address pointer 11f are reset by the write reset signal $\overline{WRS}$. Then the write bit pointer portion 17CW$_1$ outputs the signal for selection of the memory cells, at the "H" level potential herein, through the column write memory cell selection line 7SCW$_1$, and the other write bit pointer portions 17CW$_2$ to 17CW$_{n+k}$ output the signals for non-selection of the memory cells, at the "L" level potential herein, through the column write memory cell selection lines 7SCW$_2$ to 7SCW$_{n+k}$. The respective write bit pointer portions 17CW$_1$ to 17CW$_{n+k}$ transmit the data for sequential selection of the column write memory cell selection lines to the next write bit pointer portion through the first switch circuits 18CW$_1$ to 18CW$_{n+k}$ in synchronism with the write column clock signal T$_1$.

Reference character 12f designates a write word address pointer forming the input address part, which has the same function as the write word address pointer 12 of FIG. 2.

Reference character 13f designates a read bit address pointer forming the output address part which includes (n+k) memory cell selecting portions or read bit pointer portions 17CR$_1$ to 17CR$_{n+k}$ provided in corresponding relation to the column read memory cell selection lines 7SCR$_1$ to 7SCR$_{n+k}$ and having column selection output nodes connected to the corresponding column read memory cell selection lines 7SCR$_1$ to 7SCR$_{n+k}$, respectively. The read bit address pointer 13f also includes first switch circuits 18CR$_1$ to 18CR$_{n+k}$ which are connected in series alternately with the read bit pointer portions 17CR$_1$ to 17CR$_{n+k}$, respectively. The read bit pointer portion 17CR$_1$ corresponding to the first column serving as a start position includes a flip-flop circuit which enters the first reset state when it is reset to determine the start address, and each of the other read bit pointer portions 17CR$_2$ to 17CR$_{n+k}$ includes a flip-flop circuit which enters the second reset state when it is reset. The respective read bit pointer portions 17CR$_1$ to 17CR$_{n+k}$ of the read bit address pointer 13f are reset by the read reset signal $\overline{RRS}$. Then the read bit pointer portion 17CR$_1$ outputs the signal for selection of the memory cells, at the "H" level potential herein, through the column read memory cell selection line 7SCR$_1$, and the other read bit pointer portions 17CR$_2$ to 17CR$_{n+k}$ output the signals for non-selection of the memory cells, at the "L" level potential herein, through the column read memory cell selection lines 7SCR$_2$ to 7SCR$_{n+k}$. The respective read bit pointer portions 17CR$_1$ to 17CR$_{n+k}$ transmit the data for sequential selection of the column read memory cell selection lines to the next read bit pointer portion in synchronism with the read column clock signal T$_3$.

Reference character 14f designates a read word address pointer forming the output address part, which has the same function as the read word address pointer 14 of FIG. 2.

Reference characters 19CW$_1$ to 19CW$_{n+k}$ designate second switch circuits connected at their first end to the input terminal of the corresponding write bit pointer portions 17CW$_1$ to 17CW$_{n+k}$ and connected at their second end to the second end of the corresponding first switch circuits 18CW$_1$ to 18CW$_{n+k}$. The second switch circuits 19CW$_1$ to 19CW$_{n+k}$ conduct on receipt of the control signal at the "H" level to operate complimentarily with the first switch circuits.

Reference characters 19CR$_1$ to 19CR$_{n+k}$ designate second switch circuits connected at their first end to the input terminal of the corresponding read bit pointer portions 17CR$_1$ to 17CR$_{n+k}$ and connected at their second end to the second end of the corresponding first switch circuits 18CR$_1$ to 18CR$_{n+k}$. The second switch circuits 19CR$_1$ to 19CR$_{n+k}$ conduct on receipt of the control signal at the "H" level to operate complimentarily with the first switch circuits.

Reference numeral 10 designates a control circuit for outputting a control signal for selection of the write and read bit pointer portions to the write bit pointer portions 17CW$_1$ to 17CW$_{n+k}$ and first switch circuits 18CW$_1$ to 18CW$_{n+k}$ of the write bit address pointer 11f, the second switch circuits 19CW$_1$ to 19CW$_{n+k}$, the read bit pointer portions 17CR$_1$ to 17CR$_{n+k}$ and first switch circuits 18CR$_1$ to 18CR$_{n+K}$ of the read bit address pointer 13f, and the second switch circuits 19CR$_1$ to 19CR$_{n+k}$. When there are no defective regular memory cells in the second to (n+k)-th columns, the control circuit 10 places into normal operation the flip-flop circuits which select the regular memory cells in the write and read bit pointer portions 17CW$_1$ to 17CW$_{n+k}$ and 17CR$_1$ to 17CR$_{n+k}$ of the write and read bit address pointers 11f and 13f in the second to (n+k)-th columns, and outputs a control signal C, at the "H" level potential herein, for turning on the first switch circuits and turning off the second switch circuits.

The operation of the control circuit 10 where there is a defective regular memory cell 7 in the second to n-th columns will be described below. The control circuit 10 causes the write bit pointer portion of the write bit address pointer 11f and the read bit pointer portion of the read bit address pointer 13f in the column including the defective memory cell to output the signal for non-selection of the bit lines, at the "L" level potential herein, from the column selection output nodes of the flip-flop circuits through the memory cell selection lines, and outputs the control signal C which places the second switch circuits into operation or which permits electrical conduction between the input terminals of the pointer portions and the second terminals of the first switch circuits, at the "L" level potential herein, to the pointer portions. The control circuit 10 also places into normal operation the flip-flop circuits of the write bit pointer portions of the write bit address pointer 11f and the read bit pointer portions of the read bit address pointer 13f in the columns which do not include the defective memory cell, and outputs the control signal C for turning on the first switches and turning off the second switches, at the "H" level potential herein, to the pointer portions.

The detailed structure of the control circuit 10, the write bit pointer portion 17CW$_1$ of the write bit address pointer 11f, the read bit pointer portion 17CR$_1$ of the read bit address pointer 13f, the write word pointer portions 8RW$_1$ to 8RW$_m$ of the write word address pointer 12f, and the read word pointer portions 8RR$_1$ to 8RR$_m$ of the read word address pointer 14f in the seventh preferred embodiment is identical with that of the control circuit 10, the write bit pointer portion 8CW$_1$ of the write bit address pointer 11, the read bit pointer portion 8CR$_1$ of the read bit address pointer 13, the write word pointer portions 8RW$_1$ to 8RW$_m$ of the write word address pointer 12, and the read word pointer portions 8RR$_1$ to 8RR$_m$ of the read word address pointer 14 of the first preferred embodiment shown in FIG. 2.

Figure 19:
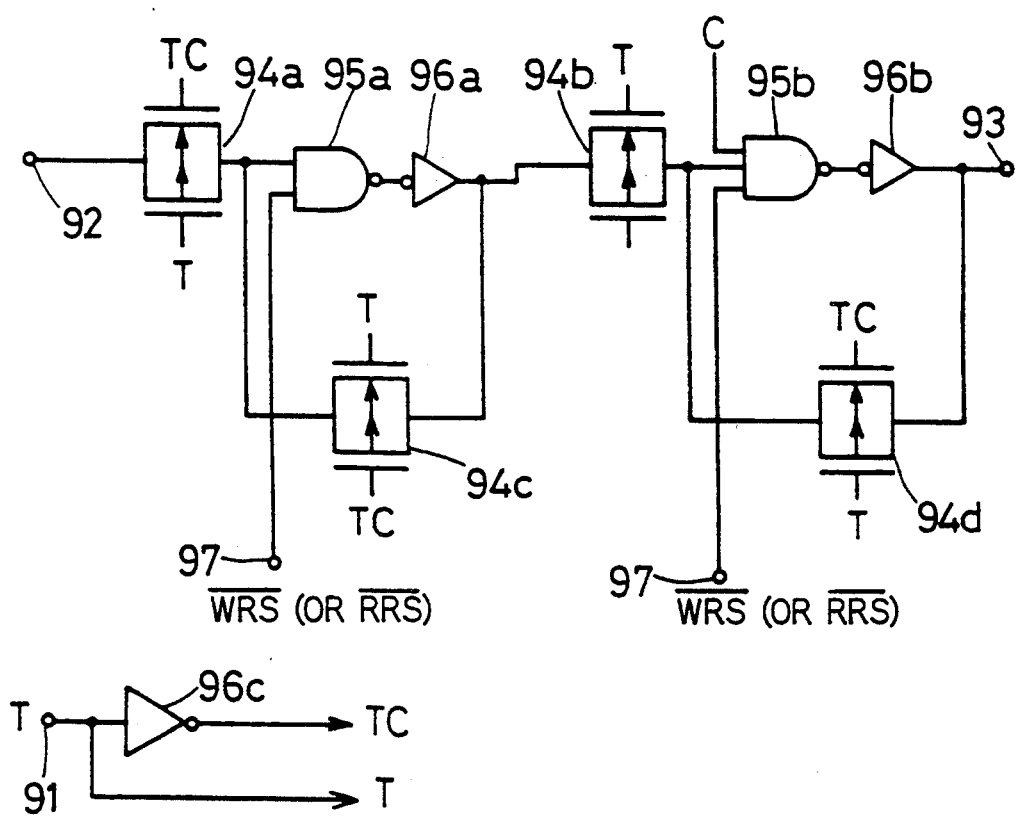
FIG. 19 is a circuit diagram of a flip-flop circuit for the semiconductor memory of FIG. 18.

There is shown in FIG. 19 a structure of the write bit pointer portions 17CW$_1$ to 17CW$_{n+k}$ of the write bit address pointer 11f and the read bit pointer portions 17CR$_1$ to 17CR$_{n+k}$ of the read bit address pointer 13f.

In FIG. 19, reference numeral 91 designates a clock signal input terminal which receives the clock signal T$_1$ of FIG. 2 for the write bit pointer portions 17CW$_2$ to 17CW$_{n+k}$ and receives the clock signal T$_3$ for the read bit pointer portions 17CR$_2$ to 17CR$_{n+k}$. The clock signals T$_1$ and T$_3$ are referred to as a clock signal T hereinafter.

Reference numeral 92 designates an input terminal receiving the output signal from a slave latch circuit included in the preceding flip-flop circuit; 93 designates an output terminal outputting an output signal to a master latch circuit included in the succeeding flip-flop circuit; and 94a to 94d designate transmission gates including PMOS transistors and NMOS transistors. The transmission gate 94a is connected at its first end to the input terminal 92 and turns on/off in synchronism with the logically inverted signal of the clock signal T. The transmission gate 94b is provided between the master latch circuit and the slave latch circuit and turns on/off in synchronism with the dock signal T. The transmission gate 94d is connected at its first end to the output terminal 93 and connected at its second end to a second end of the transmission gate 94b, and turns on/off in synchronism with the logically inverted signal of the clock signal T. The transmission gate 94c is connected at its first end to the transmission gate 94a and connected at its second end to a first end of the transmission gate 94b, and turns on/off in synchronism with the clock signal T. Reference numeral 97 designates a reset signal input terminal receiving the reset signal $\overline{WRS}$ or $\overline{RRS}$ of FIG. 18; 96a to 96c designate inverters; and 95a, 95b designate NAND gates. A first input of the NAND gate 95a is connected to a second end of the transmission gate 94a, and a second input thereof is connected to the reset signal input terminal 97. The input of the inverter 96a is connected to the output of the NAND gate 95a. A first input of the NAND gate 95b is connected to the second end of the transmission gate 94b, and a second input thereof is connected to the reset signal input terminal 97, while a third input thereof receives the control signal C. The input of the inverter 96b is connected to the output of the NAND gate 95b. The input of the inverter 96c is connected to the clock signal input terminal 91.

The clock signal T inputted from the clock signal input terminal 91 is separated into the dock signal T and an inverted dock signal TC, the signal T being transmitted as it is to the respective portions, the signal TC being obtained by inverting the clock signal T in the inverter 96c. The clock signal T and the inverted clock signal TC are inputted to the gate of the transistor of the transmission gates 94a and 94b.

The NAND gates 95a, 95b perform the same operation as an inverter when the reset signal $\overline{WRS}$ or $\overline{RRS}$ is at the "H" level. Data inputted from the input terminal 92 is transmitted to the master latch circuit including the NAND gate 95a connected to the input terminal 92 through the transmission gate 94a, the inverter 96c and the transmission gate 94b in synchronism with the clock signal T. The data in the master latch circuit is in turn transmitted to the slave latch circuit including the NAND gate 95b, the inverter 96b, and the transmission gate 94d. Then the data is outputted from the output terminal 93. The data outputted from the output terminal 93 is inputted to the input terminal of the succeeding flip-flop circuit. When the reset signal $\overline{WRS}$ or $\overline{RRS}$ is at the "L" level, the outputs of the NAND gates 95a, 95b are "H", so that all of the data held in the master and slave latch circuits are cleared to "L".

Description will be given hereinafter on the operation of the semiconductor memory of the seventh preferred embodiment.

The write operation where there is no defective regular memory cell 7 in the memory cell array 1 will be now described below. For selection of the regular memory cells 7, it is necessary to place the write bit pointer portions 17CW$_1$ to 17CW$_n$ into normal operation. For this purpose, the control circuit 10 outputs the control signal C at the "H" level potential to the write bit pointer portions 17CW$_1$ to 17CW$_n$, and the first and second switch circuits 18CW$_1$ to 18CW$_n$ and 19CW$_1$ to 19CW$_n$.

Under the foregoing establishments, when the reset signal $\overline{\text{WRS}}$ is inputted to the write bit address pointer 11$f$, the write bit pointer portion 17CW$_1$ is reset to enter the first reset state. The write bit pointer portion 17CW$_1$ produces and holds data for selection of the memory cells 7 and outputs the signal for memory cell selection through the memory cell selection line 7SCW$_1$. Simultaneously with the input of the reset signal $\overline{\text{WRS}}$, the write bit pointer portions 17CW$_2$ to 17CW$_n$, if having data for memory cell selection, are reset to enter the second reset state, and the data thereof are erased. Similarly, when the reset signal $\overline{\text{WRS}}$ is inputted to the write word address pointer 12$f$, the write word pointer portion 8RW$_1$ is reset to enter the first reset state. The write word pointer portion 8RW$_1$ produces and holds data for memory cell selection and outputs the signal for memory cell selection through the memory cell selection line 7SRW$_1$. Simultaneously with the input of the reset signal $\overline{\text{WRS}}$, the write word pointer portions 8RW$_2$ to 8RW$_m$, if having data for memory cell selection, are reset to enter the second reset state, and the data thereof are erased. Then data is written only into the memory cell corresponding to both the memory cell selection line 7SCW$_1$ of the write bit pointer portion 17CW$_1$ and the memory cell selection line 7SRW$_1$ of the write word pointer portion 8RW$_1$.

The data transmitted to the memory cell array 1 from the input circuit 2 of FIG. 1, as is not shown in FIG. 18, is written into the memory cell. In the flip-flop circuit shown herein, the data is transmitted to the next write bit pointer portion 17CW$_2$ as the clock signal T$_1$ proceeds two cycles. The write bit pointer portion 17CW$_2$ is designed by the control signal C from the control circuit 10 to operate as the flip-flop circuit and not to turn on the second switch circuit 19CW$_2$. Therefore the data is held in the write bit pointer portion 17CW$_2$, and the memory cell selection line 7SCW$_2$ outputs the signal for memory cell selection. The data is written into the memory cell corresponding to the memory cell selection lines 7SCW$_2$ and 7SRW$_1$. As the cycles of the clock signal T$_1$ proceed, the data is shifted sequentially to the succeeding write bit pointer portions, and the data is sequentially written into the n memory cells in the first row as the columns are shifted. The write bit pointer portion 17CW$_{n+1}$, in turn, is designed by the control signal C from the control circuit 10 not to output the signal for memory cell selection but to turn on the second switch circuit 19CW$_{n+1}$. Therefore the data is not held in the write bit pointer portion 17CW$_{n+1}$ but is transmitted to the next write bit pointer portion 17CW$_{n+2}$. The write bit pointer portion 17CW$_{n+2}$ is also designed by the control signal C from the control circuit 10 not to output the signal for memory cell selection but to turn on the second switch circuit 19CW$_{n+2}$. The data is not held in the write bit pointer portion 17CW$_{n+2}$ but is transmitted to the next write bit pointer portion 17CW$_{n+3}$. The data passes through the write bit pointer portions 17CW$_{n+1}$ to 17CW$_{n+k}$ without the write operation. As a result, the data is transmitted from the write bit pointer portion 17CW$_n$ directly to the write bit pointer portion 17CW$_1$.

Normally, the clock signal T$_2$ proceeds as the data makes a round in the write bit address pointer 11$f$, and then the data is shifted to the next write word pointer portion 8RW$_2$ in the write word address pointer 12$f$.

The same operation as executed in the memory cells in the first row is repeated in the memory cells in the second to last rows. The write operation of data into the memory cells arranged in m rows in n columns is achieved in this manner.

The read operation where there is no defective regular memory cell 7 in the memory cell array 1 will be now described below. For selection of the regular memory cells 7, it is necessary to place the read bit pointer portions 17CR$_1$ to 17CR$_n$ into normal operation. For this purpose, the control circuit 10 outputs the control signal C at the "H" level potential to the read bit pointer portions 17CR$_1$ to 17CR$_n$, and the first and second switch circuits 18CR$_1$ to 18CR$_n$ and 19CR$_1$ to 19CR$_n$.

Under the foregoing establishments, when the reset signal $\overline{\text{RRS}}$ is inputted to the read bit address pointer 13$f$, the read bit pointer portion 17CR$_1$ is reset to enter the first reset state. The read bit pointer portion 17CR$_1$ produces and holds data for selection of the memory cells 7 and outputs the signal for memory cell selection through the memory cell selection line 7SCR$_1$. Simultaneously with the input of the reset signal $\overline{\text{RRS}}$, the read bit pointer portions 17CR$_2$ to 17CR$_n$, if having data for memory cell selection, are reset to enter the second reset state, and the data thereof are erased. Similarly, when the reset signal $\overline{\text{RRS}}$ is inputted to the read word address pointer 14$f$, the read word pointer portion 8RR$_1$ is reset to enter the first reset state. The read word pointer portion 8RR$_1$ produces and holds data for memory cell selection and outputs the signal for memory cell selection through the memory cell selection line 7SRR$_1$. Simultaneously with the input of the reset signal $\overline{\text{RRS}}$, the read word pointer portions 8RR$_2$ to 8RR$_m$, if having data for memory cell selection, are reset to enter the second reset state, and the data thereof are erased. Then data is read only from the memory cell corresponding to both the memory cell selection line 7SCR$_1$ of the read bit pointer portion 17CR$_1$ and the memory cell selection line 7SRR$_1$ of the read word pointer portion 8RR$_1$.

The data which is read is transmitted to the output circuit 4 of FIG. 1 from the memory cell selected by the read bit address pointer 13$f$ and the read word address pointer 14$f$, as is not shown in FIG. 18. In the flip-flop circuit shown herein, the data is transmitted to the next read bit pointer portion 17CR$_2$ as the clock signal T$_3$ proceeds two cycles. The read bit pointer portion 17CR$_2$ is designed by the control signal C from the control circuit 10 to operate as the flip-flop circuit and not to turn on the second switch circuit 19CR$_2$. Therefore the data is held in the read bit pointer portion 17CR$_2$, and the memory cell selection line 7SCR$_2$ outputs the signal for memory cell selection. The data is read from the memory cell corresponding to the memory cell selection lines SCR$_2$ and 7SRR$_1$. As the cycles of the dock signal T$_3$ proceed, the data is shifted sequentially to the succeeding read bit pointer portions, and the data is sequentially read from the n memory cells in the first row as the columns are shifted. The read bit pointer portion 17CR$_{n+1}$, in turn, is designed by the control signal C from the control circuit 10 not to output the signal for memory cell selection but to turn on the second switch circuit 19CR$_{n+1}$. Therefore the data is not held in the read bit pointer portion 17CR$_{n+1}$ but is transmitted to the next read bit pointer portion 17CR$_{n+2}$. The read bit pointer portion 17CR$_{n+2}$ is also designed by the control signal C from the control circuit 10 not to output the signal for memory cell selection but to turn on the second switch circuit 19CR$_{n+2}$.

The data is not held in the read bit pointer portion 17CR$_{n+2}$ but is transmitted to the next mad bit pointer portion 17CR$_{n+3}$. The data passes through the read bit pointer portions 17CR$_{n+1}$ to 17CR$_{n+k}$ without the read operation. As a result, the data is transmitted from the read bit pointer portion 17CR$_n$ directly to the read bit pointer portion 17CR$_1$ through the second switch circuits 19CR$_{n+1}$ to 19CR$_{n+k}$.

Normally, the dock signal T$_4$ proceeds as the data makes a round in the read bit address pointer 13$f$, and then the data is shifted to the next read word pointer portion 8RR$_2$ in the read word address pointer 14$f$. The same operation as executed in the memory cells in the first row is repeated in the memory cells in the second to last rows. The read operation of data from the memory cells arranged in m rows in n columns is achieved in this manner.

The write operation where there is a defective regular memory cell in the memory cell array 1 will be now described below. For the purpose of simplification, the memory cell array 1 is assumed to have m rows and four columns, the fourth column being the redundancy memory cell column. It is assumed that the fault is caused, for example, in a memory cell 7 in the third column. For selection of the undefective memory cell columns, it is necessary to place the write bit pointer portions 17CW$_1$, 17CW$_2$ and 17CW$_4$ into normal operation. For this purpose, the control circuit 10 outputs the control signal C at the "H" level potential to the write bit pointer portions 17CW$_1$, 17CW$_2$ and 17CW$_4$. At the same time, for non-selection of the memory cells in the third column having the defective memory cell 7, it is necessary to inhibit the flip-flop operation of the write bit pointer portion 17CW$_3$, to turn off the first switch circuit 18CW$_3$ and to turn on the second switch circuit 19CW$_3$. For this purpose, the control circuit 10 outputs the control signal C at the "L" level potential to the write bit pointer portion 17CW$_3$, the first switch circuit 18CW$_3$ and the second switch circuit 19CW$_3$.

Under the foregoing establishments, when the reset signal $\overline{WRS}$ is inputted to the write bit address pointer 11$f$, the write bit pointer portion 17CW$_1$ and the write word pointer portion 8RW$_1$ enter the first reset state, and the write bit pointer portions 17CW$_2$ to 17CW$_4$ and the write word pointer portions 8RW$_2$ to 8RW$_m$ enter the second reset state. Then data is written only into the memory cell corresponding to both the memory cell selection line 7SCW$_1$ of the write bit pointer portion 17CW$_1$ and the memory cell selection line 7SRW$_1$ of the write word pointer portion 8RW$_1$. The data is shifted to the next write bit pointer portion 17CW$_2$ as the clock signal T$_1$ proceeds two cycles. The write bit pointer portion 17CW$_2$ is designed by the control signal C from the control circuit 10 to operate as the flip-flop circuit. Therefore the memory cell selection line 7SCW$_2$ outputs the signal for memory cell selection. The data is written into the memory cell corresponding to both the memory cell selection lines 7SCW$_2$ and 7SRW$_1$.

The write bit pointer portion 17CW$_3$, in turn, is designed by the control signal C from the control circuit 10 no to operate as the flip-flop circuit, to turn off the first switch circuit 18CW$_3$ and to turn on the second switch circuit 19CW$_3$. Therefore the data is not held in the write bit pointer portion 17CW$_3$ but is transmitted to the next write bit pointer portion 17CW$_4$ through the second switch circuit 19CW$_3$. The write bit pointer portion 17CW$_4$, which is for redundancy memory cell selection, is also designed by the control signal C from the control circuit 10 to operate as the flip-flop circuit. Therefore the memory cell selection line 7SCW$_4$ outputs the signal for selection of the memory cells 7. The data is written into the memory cell corresponding to both the memory cell selection lines 7SCW$_4$ and 7SRW$_1$. The data passes through the second switch circuit 19CW$_3$ in the write bit pointer portion 17CW$_3$ without the write operation, so that the defective memory cell is not selected.

The read operation of data from the memory cells where there is a defective regular memory cell in the memory cell array 1 will be now described below. For the purpose of simplification, the memory cell array 1 is also assumed to have m rows and four columns, the fourth column being the redundancy memory cell column. It is assumed that the fault is caused, for example, in a memory cell 7 in the third column. For selection of the undefective memory cell columns, it is necessary to place the read bit pointer portions 17CR$_1$, 17CR$_2$ and 17CR$_4$ into normal operation. For this purpose, the control circuit 10 outputs the control signal C at the "H" level potential to the read bit pointer portions 17CR$_1$, 17CR$_2$ and 17CR$_4$. At the same time, for non-selection of the memory cells in the third column having the defective memory cell, it is necessary to inhibit the flip-flop operation of the read bit pointer portion 17CR$_3$, to turn off the first switch circuit 18CR$_3$, and to turn on the second switch circuit 19CR$_3$. For this purpose, the control circuit 10 outputs the control signal C at the "L" level potential to the read bit pointer portion 17CR$_3$, the first switch circuit 18CR$_3$ and the second switch circuit 19CR$_3$.

Under the foregoing establishments, when the reset signal $\overline{RRS}$ is inputted to the read bit address pointer 13$f$, the read bit pointer portion 17CR$_1$ and the read word pointer portion 8RR$_1$ enter the first reset state, and the read bit pointer portions 17CR$_2$ to 17CR$_4$ and the read word pointer portions 8RR$_2$ to 8RR$_m$ enter the second reset state. Then data is read only from the memory cell corresponding to both the memory cell selection line 7SCR$_1$ of the read bit pointer portion 17CR$_1$ and the memory cell selection line 7SRR$_1$ of the read word pointer portion 8RR$_1$. The data is shifted to the next read bit pointer portion 17CR$_2$ as the dock signal T$_3$ proceeds two cycles. The read bit pointer portion 17CR$_2$ is designed by the control signal C from the control circuit 10 to operate as the flip-flop circuit, so that the memory cell selection line 7SCR$_2$ outputs the signal for memory cell selection. Then the data is read from the memory cell corresponding to both the memory cell selection lines 7SCR$_2$ and 7SRR$_1$. The read bit pointer portion 17CR$_3$, in turn, is designed by the control signal C from the control circuit 10 not to operate as the flip-flop circuit, to turn off the first switch circuit 18CR$_3$ and to turn on the second switch circuit 19CR$_3$. Therefore the data is not held in the read bit pointer portion 17CR$_3$ but is transmitted to the next read bit pointer portion 17CR$_4$ through the second switch circuit 19CR$_3$. The read bit pointer portion 17CR$_4$, which is for redundancy memory cell selection, is also designed by the control signal C from the control circuit 10 to operate as the flip-flop circuit. Therefore the memory cell selection line 7SCR$_4$ outputs the signal for selection of the memory cells 7. The data is read from the memory cell corresponding to both the memory cell selection lines 7SCR$_2$ and 7SRR$_1$. The data passes through the read bit pointer portion 17CR$_3$ without the read operation, so that the defective memory cell is not selected.

The control circuit 10 has a structure as shown in FIG. 3 when the memory cell array 1 has four columns including the redundancy circuit column. The output signals Y1 to Y4 of the control circuit 10 corresponding to the control signal C are assumed to be inputted to the write bit pointer portions 17CW$_1$, 17CW$_3$, 17CW$_4$ and to the read bit pointer portions 17CR$_1$, 17CR$_3$, 17CR$_4$, respectively. At this time, the fuse 20$b$ of the signal generator 26 in the control circuit of FIG. 3 is cut off to set the output signal Y3 to "L", the fuse 20$a$ left uncut, when the defective memory cell lies in the third column.

Eighth Preferred Embodiment

Figure 20:
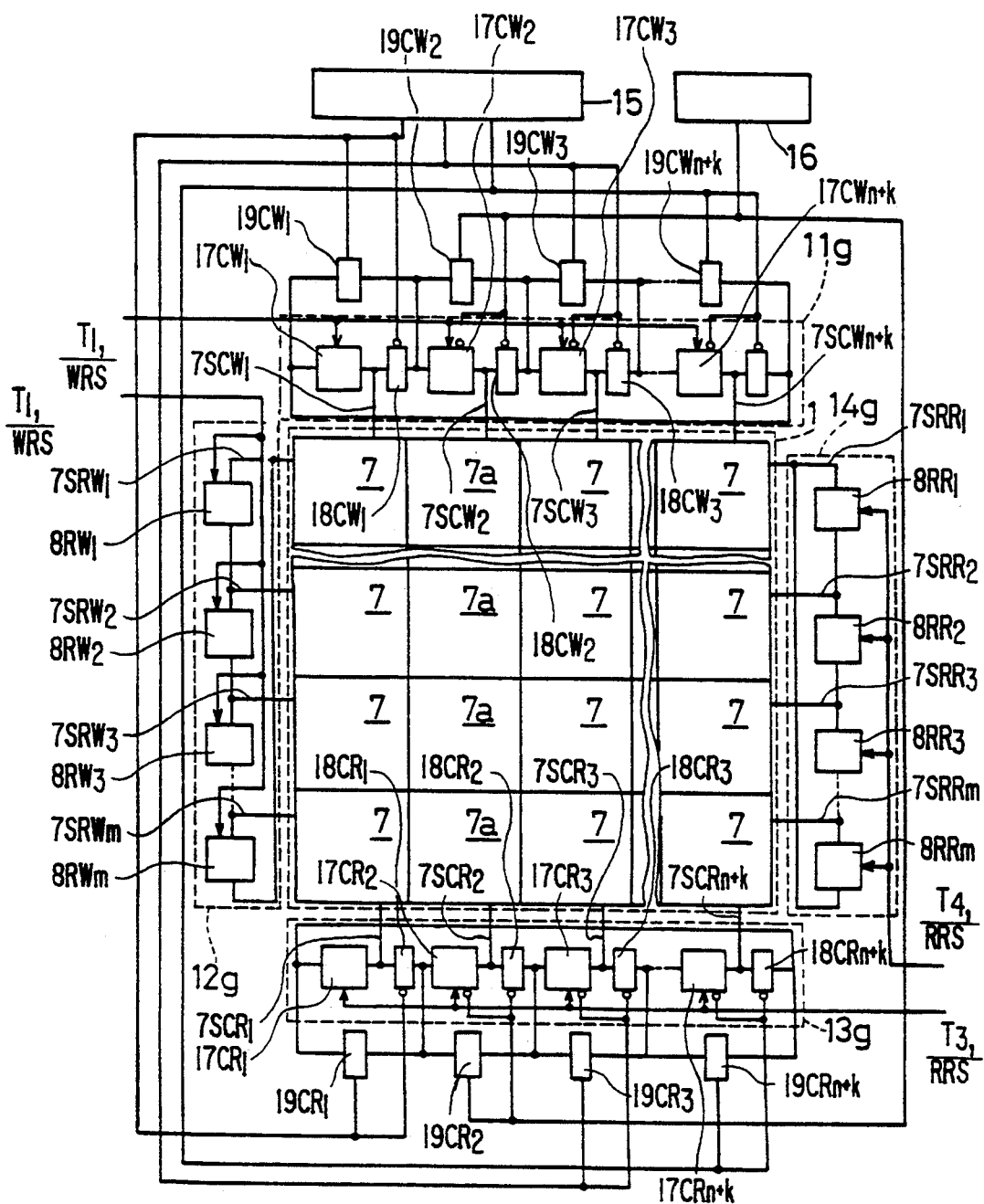
FIG. 20 is a partial block diagram of the semiconductor memory of an eighth preferred embodiment according to the present invention.

An eighth preferred embodiment of the present invention will now be discussed hereinafter with reference to FIG. 20. FIG. 20 is a partial block diagram of the semiconductor memory of the eighth preferred embodiment according to the present invention. In FIG. 20, there is shown an arrangement corresponding to the memory cell array 1, input address part 3, output address part 5 and control circuit 6 of the semiconductor memory of FIG. 1. Reference numeral 1 designates a memory cell array identical with the memory cell array of FIG. 9 including $\{m \times (n+k)\}$ memory cells 7 arranged in matrix form. Reference characters 7SCW$_1$ to 7SCW$_{n+k}$, 7SCR$_1$ to 7SCR$_{n+k}$, 7SRW$_1$ to 7SRW$_m$, and 7SRR$_1$ to 7SRR$_m$ designate memory cell selection lines identical with those of FIG. 9. Reference character 11$g$ designates a write bit address pointer forming the input address part which has the same structure as the write bit address pointer 11$f$ of FIG. 18 except that the write bit pointer portion 17CW$_2$ connected to the spare memory cells 7$a$ is controlled by the spare control circuit 16. Reference character 12$g$ designates a write word address pointer forming the input address part which has the same function as the write word address pointer 12$f$ of FIG. 18. Reference character 13$g$ designates a read bit address pointer forming the output address part which has the same structure as the read bit address pointer 13$f$ of FIG. 18 except that the read bit pointer portion 17CR$_2$ connected to the spare memory cells 7$a$ is controlled by the spare control circuit 16. Reference character 14$g$ designates a read word address pointer forming the output address part which has the same function as the read word address pointer 14$f$ of FIG. 18. The write word address pointer 12$g$ may also function as the read word address pointer 14$g$. In this case, the write bit address pointer 12$g$ is controlled in the read operation by the read reset signal $\overline{RRS}$ and the read clock signal T$_4$ in place of the write reset signal $\overline{WRS}$ and the write clock signal T$_2$.

Reference characters 19CW$_1$ to 19CW$_{n+k}$, 19CR$_1$ to 19CR$_{n+k}$ designate second switch circuits identical with those of FIG. 18. It should be noted that the second switch circuits 19CW$_2$ and 19CR$_2$ are controlled by the spare control circuit 16.

Reference numeral 15 designates a control circuit having the same structure as that of FIG. 9; and 16 designates a spare control circuit having the same structure as that of FIG. 9.

Description will be given hereinafter on the operation of the semiconductor memory of the eighth preferred embodiment.

The write operation where there is no defective regular memory cell 7 in the memory cell array 1 will be now described below. For selection of the regular memory cells 7, it is necessary to place the write bit pointer portions 17CW$_1$ to 17CW$_n$ into normal operation. For this purpose, the control circuit 15 outputs the control signal C at the "H" level potential to the write bit pointer portions 17CW$_1$, 17CW$_3$ to 17CW$_{n+k}$ and the first and second switch circuits 18CW$_1$, 18CW$_3$ to 18CW$_{n+k}$, 19CW$_1$, 19CW$_3$ to 19CW$_{n+k}$. The spare control circuit 16 outputs the control signal at the "H" level potential to the write bit pointer portion 17CW$_2$, and the first and second switch circuits 18CW$_2$ and 19CW$_2$.

Under the foregoing establishments, when the reset signal $\overline{WRS}$ is inputted to the write bit address pointer 11$g$ and the write word address pointer 12$g$, the write bit pointer portion 17CW$_1$ and the write word pointer portion 8RW$_1$ enter the first reset state, and the write bit pointer portions 17CW$_2$ to 17CW$_n$ and the write word pointer portions 8RW$_2$ to 8RW$_m$ enter the second reset state. Data is written only into the memory cell corresponding to both the memory cell selection line 7SCW$_1$ of the write bit pointer portion 17CW$_1$ and the memory cell selection line 7SRW$_1$ of the write word pointer portion 8RW$_1$. The data is transmitted to the next write bit pointer portion 17CW$_2$ in synchronism with the clock signal T$_1$. The write bit pointer portion 17CW$_2$ is designed by the control signal C from the control circuit 15 not to operate as the flip-flop circuit but to turn on the second switch circuit 19CW$_2$. Therefore the data is not held in the write bit pointer portion 17CW$_2$, and the memory cell selection line 7SCW$_2$ does not output the signal for memory cell selection, so that the data is not written into the memory cell corresponding to both the memory cell selection lines 7SCW$_2$ and 7SRW$_1$. Since the write bit pointer portion 17CW$_2$ is designed by the control signal C from the spare control circuit 16 not to output the signal for selection of the spare memory cells 7$a$ but to turn on the second switch circuit 19CW$_2$, the data is transmitted as it is to the next write bit pointer portion 17CW$_3$. As the cycles of the clock signal T$_1$ proceed, the data is shifted sequentially to the succeeding write bit pointer portions, so that the data is written into the n+k−1 memory cells sequentially selected in the first row as the columns are shifted. The data passes through the write bit pointer portion 17CW$_2$ without the write operation. As a result, the data is transmitted from the write bit pointer portion 17CW$_1$ directly to the write bit pointer portion 17CW$_3$ through the second switch circuit 19CW$_2$.

Normally, the clock signal T$_2$ proceeds as the data makes a round in the write bit address pointer 11$g$, and then the data is shifted to the next write word pointer portion 8RW$_2$ in the write word address pointer 12$g$. The same operation as executed in the memory cells in the first row is repeated in the memory cells in the second to last rows. The write operation of data into the memory cells arranged in m rows in n columns is achieved in this manner.

The read operation where there is no defective regular memory cell 7 in the memory cell array 1 will be now described below. The read bit address pointer 13$g$ operates in the same fashion as the write bit address pointer 11$g$. The data passes through the second switch circuit 19CW$_2$ in the read bit pointer portion 17CR$_2$ without the read operation, and the data is transmitted from the read bit pointer portion 17CR$_1$ directly to the read bit pointer portion 17CR$_3$.

The write operation where there is a defective regular memory cell in the memory cell array 1 will be now described below. For the purpose of simplification, the memory cell array 1 is assumed to have m rows and four columns, the fourth column being the redundancy memory cell column. It is assumed that the fault is caused, for example, in a memory cell 7 in the third column. For selection of the undefective memory cell columns, it is necessary to place the write bit pointer portions $17CW_1$, $17CW_2$ and $17CW_4$ into normal operation. For this purpose, the control circuit 15 outputs the control signal C at the "H" level potential to the write bit pointer portions $17CW_1$ and $17CW_4$. The spare control circuit 16 outputs the control signal at the "H" level potential to the write bit pointer portion $17CW_2$. At the same time, for non-selection of the memory cells in the third column having the defective memory cell, it is necessary to inhibit the flip-flop operation of the write bit pointer portion $17CW_3$, to turn off the first switch circuit $18CW_3$ and to turn on the second switch circuit $19CW_3$. For this purpose, the control circuit 15 outputs the control signal C at the "L" level potential to the write bit pointer portion $17CW_3$, the first switch circuit $18CW_3$ and the second switch circuit $19CW_3$.

Under the foregoing establishments, when the reset signal $\overline{WRS}$ is inputted to the write bit address pointer 11g and the write word address pointer 12g, the write bit pointer portion $17CW_1$ and the write word pointer portion $8RW_1$ enter the first reset state, and the write bit pointer portions $17CW_2$ to $17CW_4$ and the write word pointer portions $8RW_2$ to $8RW_m$ enter the second reset state. The data is written into the memory cell corresponding to both the memory cell selection line $7SCW_1$ of the write bit pointer portion $17CW_1$ and the memory cell selection line $7SRW_1$ of the write word pointer portion $8RW_1$. The data is shifted to the next write bit pointer portion $17CW_2$ as the clock signal $T_1$ proceeds two cycles. The write bit pointer portion $17CW_2$ is designed to operate as the flip-flop circuit by the control signal C from the spare control circuit 16. Therefore the spare memory cell selection line $7SCW_2$ outputs the signal for selection of the spare memory cells 7a, and data is written into the spare memory cell 7a selected by both the memory cell selection lines $7SCW_2$ and $7SCW_1$. The write bit pointer portion $17CW_3$, in turn, is designed by the control signal C from the control circuit 15 not to operate as the flip-flop circuit, to turn off the first switch circuit $18CW_3$ and to turn on the second switch circuit $19CW_3$. Therefore the data for memory cell selection is not held in the write bit pointer portion $17CW_3$ but is transmitted to the next write bit pointer portion $17CW_4$. Since the write bit pointer portion $17CW_4$ is designed by the control signal C from the control circuit 15 to operate as the flip-flop circuit, the memory cell selection line $7SCW_4$ outputs the signal for selection of the memory cells 7. The data is written into the memory cell selected by both the memory cell selection lines $7SCW_4$ and $7SRW_1$. The data passes through the second switch circuit $19CW_3$ in the write bit pointer portion $17CW_3$ without the write operation, so that the defective memory cell is not selected.

The read operation of data from the memory cells where there is a defective regular memory cell will be now described below. The read bit address pointer 13g operates in the same fashion as the write bit address pointer 11g. The data passes through the second switch circuit $19CR_3$ in the read bit pointer portion $17CW_3$ without the read operation, so that the defective memory cell is not selected.

Ninth Preferred Embodiment

Figure 21:
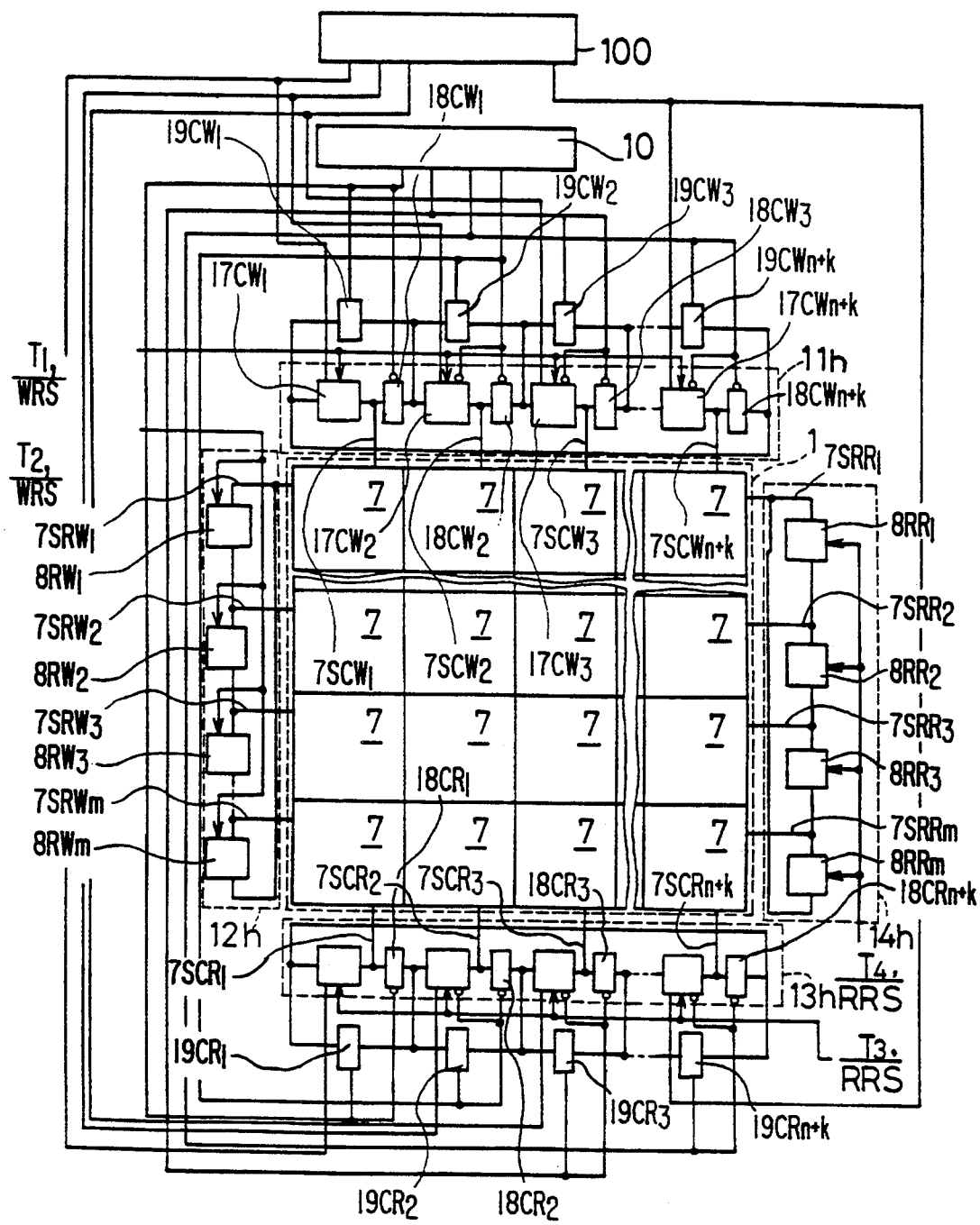
FIG. 21 is a partial block diagram of the semiconductor memory of a ninth preferred embodiment according to the present invention.

Referring to FIG. 21, a ninth preferred embodiment according to the present invention will be described hereinafter. FIG. 21 is a partial block diagram of the semiconductor memory of the ninth preferred embodiment according to the present invention. In FIG. 21, there is shown an arrangement corresponding to the memory cell array 1, input and output address parts 3 and 5, control circuit 6, and start address control circuit 110 of the semiconductor memory of FIG. 11.

In FIG. 21, reference character 11h designates a write bit address pointer forming the input address part which includes (n+k) memory cell selecting portions or write bit pointer portions $17CW_1$ to $17CW_{n+k}$ provided in corresponding relation to the column write memory cell selection lines $7SCW_1$, to $7SCW_{n+k}$ and having column selection output nodes connected to the corresponding column write memory cell selection lines $7SCW_1$ to $7SCW_{n+k}$, respectively. The write bit address pointer 11h also includes first switch circuits $18CW_1$ to $18CW_{n+k}$ which are connected in series alternately with the write bit pointer portions $17CW_1$ to $17CW_{n+k}$, respectively. The write bit pointer portion corresponding to the column at the start position is set by the start address control signal S. The write bit pointer portions $17CW_1$ to $17CW_{n+k}$ of the write bit address pointer 11h are reset by the write reset signal $\overline{WRS}$. Then the write bit pointer portion at the start position outputs the signal for selection of the memory cells, at the "H" level potential herein, through the column write memory cell selection line, and the other write bit pointer portions output the signals for non-selection of the memory cells, at the "L" level potential herein, through the column write memory cell selection lines. The respective write bit pointer portions $17CW_1$ to $17CW_{n+k}$ sequentially transmit the signal for selection of the column write memory cell selection lines to the next write bit pointer portion in synchronism with the write column clock signal $T_1$.

Reference character 12h designates a write word address pointer identical with the write word address pointer 12 of FIG. 2.

Reference character 13h designates a read bit address pointer forming the output address part which includes (n+k) memory cell selecting portions or read bit pointer portions $17CR_1$ to $17CR_{n+k}$ provided in corresponding relation to the column read memory cell selection lines $7SCR_1$ to $7SCR_{n+k}$ and having column selection output nodes connected to the corresponding column read memory cell selection lines $7SCR_1$ to $7SCR_{n+k}$, respectively. The read bit address pointer 13h also includes first switch circuits $18CR_1$ to $18CR_{n+k}$ connected in series alternately with the read bit pointer portions $17CR_1$ to $17CR_{n+k}$, respectively. The read bit pointer portion corresponding to the column at the start position is set-by the start address control signal S. The read bit pointer portions $17CR_1$ to $17CR_{n+k}$ of the read bit address pointer 13h are reset by the read reset signal $\overline{RRS}$. Then the read bit pointer portion at the start position outputs the signal for selection of the memory cells, at the "H" level potential herein, through the column read memory cell selection line, and the other read bit pointer portions output the signals for non-selection of the memory cells, at the "L" level potential herein, through the column read memory cell selection lines. The respective read bit pointer portions $17CR_1$ to $17CR_{n+k}$ sequentially transmit the data for selection of the column read memory cell selection lines to the next read bit pointer portion in synchronism with the read column clock signal $T_3$.

Reference character 14h designates a read word address pointer identical with the read word address pointer 14 of FIG. 2.

Figure 16:
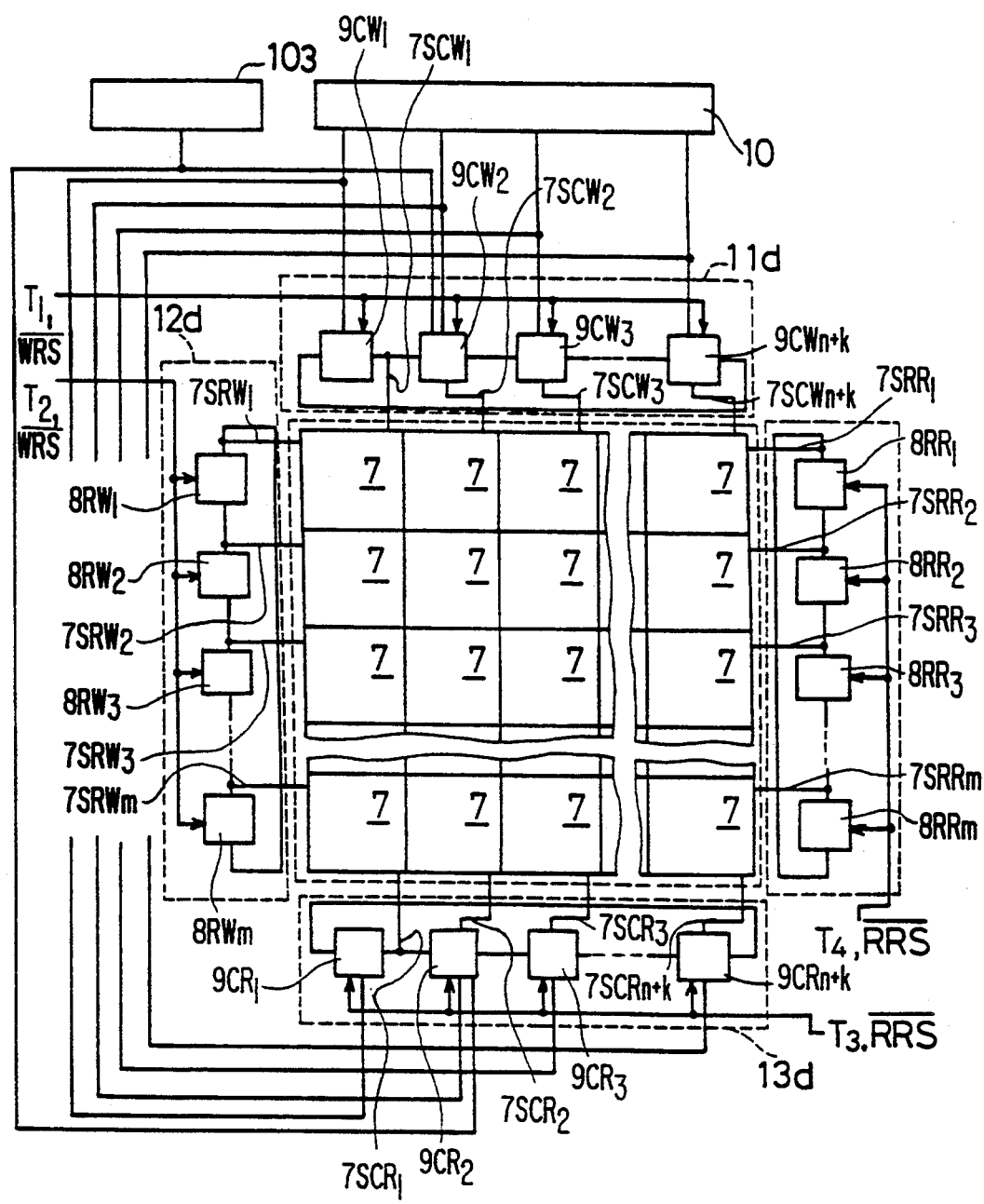
FIG. 16 is a partial block diagram of the semiconductor memory of a fifth preferred embodiment according to the present invention.

Reference numeral 10 designates a control circuit which operates in the same manner as the control circuit 10 of FIG. 16.

Reference numeral 100 designates a start address control circuit for outputting the start address control signal S which controls the write bit pointer portions $17CW_1$ to $17CW_{n+k}$ of the write bit address-pointer 11h and the read bit pointer portions $17CR_1$ to $17CR_{n+k}$ of the read bit address pointer 13h to set the start position. The start address control circuit 100 outputs the start address control signal S at the "H" level potential herein to the write bit pointer portions $17CW_1$ to $17CW_n$ of the write bit address pointer 11h and the read bit pointer portions $17CR_1$ to $17CR_n$ of the read bit address pointer 13h in the first to n-th columns so that they enter the first reset state when reset, and outputs the control signal C at the "L" level potential to the other bit pointer portions so that they enter the second reset state when reset.

The detailed structure of the control circuit 10, the write word pointer portions $8RW_1$ to $8RW_m$ of the write word address pointer 12h, and the read word pointer portions $8RR_1$ to $8RR_m$ of the read word address pointer 14h in the ninth preferred embodiment is identical with that of the control circuit 10, the write word pointer portions $8RW_1$ to $8RW_m$ of the write word address pointer 12, and the read word pointer portions $8RR_1$ to $8RR_m$ of the read word address pointer 14 in the seventh preferred embodiment.

The start address control circuit 100 may have the same structure as the control circuit 10 of FIG. 12 of the third preferred embodiment.

Figure 22:
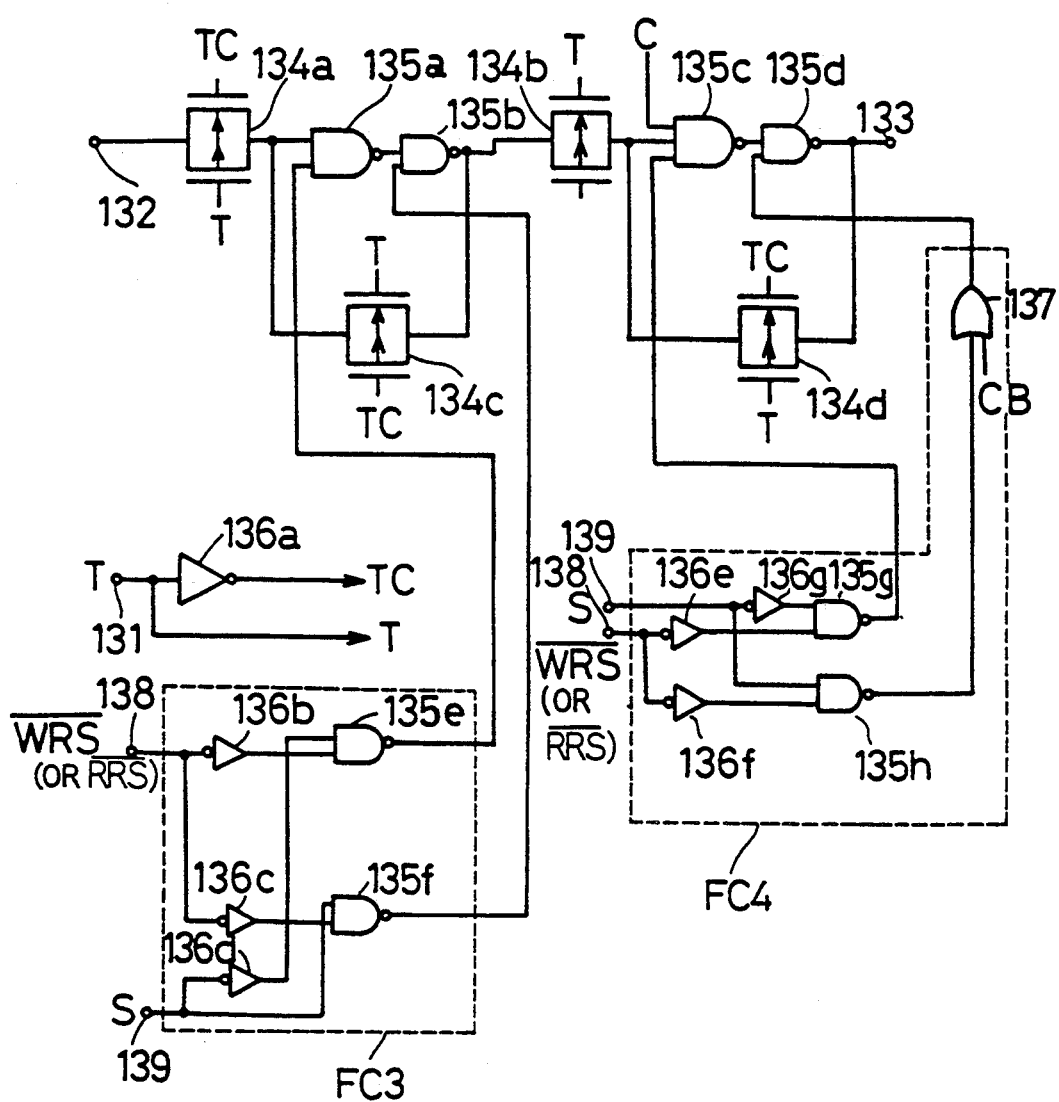
FIG. 22 is a circuit diagram of a flip-flop circuit for the semiconductor memory of FIG. 20.

Referring now to FIG. 22, description will be given on the circuit structure of the flip-flop circuits for use in the write bit point portions $17CW_1$ to $17CW_{n+k}$ of the write bit address pointer 11h and the read bit pointer portions $17CR_1$ to $17CR_{n+k}$ of the read bit address pointer 13h. In FIG. 22, reference numeral 138 designates a reset signal input terminal receiving the reset signal $\overline{WRS}$ or $\overline{RRS}$ of FIG. 21; 139 designates a control input terminal receiving the control signal S for setting the first and second reset states; 131 designates a dock signal input terminal which receives the clock signal $T_1$ of FIG. 12 for the write bit pointer portions $17CW_2$ to $17CW_{n+k}$ and receives the dock signal $T_3$ for the read bit pointer portions $17CR_2$ to $17CR_{n+k}$. The clock signals $T_1$ and $T_3$ are referred to as the clock signal T hereinafter.

In FIG. 22, reference numeral 132 designates an input terminal receiving the output signal from a slave latch circuit included in the preceding flip-flop circuit; 133 designates an output terminal outputting an output signal to a master latch circuit included in the succeeding flip-flop circuit; and 134a to 134e designate transmission gates including PMOS transistors and NMOS transistors. The transmission gate 134a is connected at its first end to the input terminal 132 and turns on/off in synchronism with the logically inverted signal of the dock signal T. The transmission gate 134b is provided between the master latch circuit and the slave latch circuit and turns on/off in synchronism with the dock signal T. The transmission gate 134d is connected at its first end to the output terminal 133 and connected at its second end to a second end of the transmission gate 134b, and turns on/off in synchronism with the logically inverted signal of the clock signal T. The transmission gate 134c is connected at its first end to the transmission gate 134a and connected at its second end to a first end of the transmission gate 134b, and turns on/off in synchronism with the clock signal T. Reference characters 136a to 136k designate inverters; and 135a to 135h designate NAND gates. A first input of the NAND gate 135a is connected to a second end of the transmission gate 134a, and a second input thereof receives an output signal from a set/reset control circuit FC3. A first input of the NAND gate 135b is connected to the output of the NAND gate 135a, and a second input thereof receives the output signal from the set/reset control circuit FC3. A first input of the NAND gate 135c is connected to the second end of the transmission gate 134b, and a second input thereof receives an output signal from a set/reset control circuit FC4, while a third input thereof receives the control signal C. A first input of the NAND gate 135c is connected to the second end of the transmission gate 134d, and a second input thereof receives the output signal from the set/reset control circuit FC4, while a third input thereof receives the control signal C. A first input of the NAND gate 135d is connected to the output of the NAND gate 135c, and a second input thereof receives the output signal from the set/reset control circuit FC4. The input of the inverter 136a is connected to the dock signal input terminal 131.

The control signal C inputted from the control terminal is separated into the signals C and CB, the control signal C being transmitted as it is to the respective portions, the signal CB being obtained by inverting the control signal C in the inverter. The control signal C is inputted to the NAND gate 135c. The inverted control signal CB is inputted to an OR gate 137. The clock signal T inputted from the clock signal input terminal 131 is separated into the signals T and TC, the signal T being transmitted as it is to the respective portions, the signal TC being obtained by inverting the clock signal T in the inverter 136a. The clock signal T and the inverted clock signal TC are inputted to the transmission gates 134a to 134d.

The set/reset control circuit FC3 includes three inverters 136b to 136d and two NAND gates 135e, 135f. In the set/reset control circuit FC3, the reset signal input terminal 138 is connected to the inputs of the inverters 136b, 136c. The start address control signal input terminal 139 is connected to a first input of the NAND gate 135e through the inverter 136d and to a first input of the NAND gate 135f. A second input of the NAND gate 135e is connected to the output of the inverter 136b. A second input of the NAND gate 135f is connected to the output of the inverter 136c. The output of the NAND gate 135e is connected to the second input of the NAND gate 135a. The output of the NAND gate 135f is connected to the second input of the NAND gate 135b. The set/reset control circuit FC4 includes three inverters 136e to 136g, two NAND gates 135g, 135h, and the OR gate 137. In the set/reset control circuit FC4, the reset signal input terminal 138 is connected to the inputs of the inverters 136e, 136f. The start address control signal input terminal 139 is connected to a first input of the NAND gate 135g through the inverter 136g and is connected to a first input of the NAND gate 135h. A second input of the NAND gate 135g is connected to the output of the inverter 136e. A second input of the NAND gate 135h is connected to the output of the inverter 136f. The output of the NAND gate 135g is connected to the second input of the NAND gate 135c. The output of the NAND gate 135h is connected to the second input of the OR gate 137. The output of the OR gate 137 is connected to the second input of the NAND gate 135d. The flip-flop circuit of FIG. 22 differs from that of FIG. 13 in that it does not include the inverter 76c and the inverter formed by the MOS transistors 79 to 82. The signal for memory cell selection is outputted from the output terminal 133.

The operations of the set/reset control circuit FC3 and FC4 are identical with those of the set/reset control circuits of FIG. 13. When the start address control signal S is "L", on receipt of the reset signal $\overline{WRS}$ or $\overline{RRS}$, the set/reset control circuits FC3 and FC4 set the master and slave latch circuits to the second reset state.

When the start address control signal S is "H", on receipt of the reset signal $\overline{WRS}$ or $\overline{RRS}$, the set/reset control circuits FC3 and FC4 set the master and slave latch circuits to the first reset state.

The OR gate 137 is provided to output the output signal MC at the "L" level for memory cell selection from the flip-flop circuit when the logically inverted signal CB of the control signal C is "H".

For example, the start address is supposed to be set to the write bit pointer portion 17CW$_1$ of the write bit address pointer 11h and to the read bit pointer portion 17CR$_1$ of the read bit address pointer 13h. The reset signal $\overline{WRS}$ or $\overline{RRS}$ causes the write bit pointer portion 17CW$_1$ and the read bit pointer portion 17CR$_1$ to enter the first reset state, and causes the other write bit pointer portions and read bit pointer portions to enter the second reset state.

Description will be given hereinafter on the operation of the semiconductor memory of the ninth preferred embodiment.

The write and read operations where no fault is caused in the regular memory cells 7 in the first to n-th columns in the ninth preferred embodiment are identical with those of the semiconductor memory of FIG. 18 in the seventh preferred embodiment.

The write and read operations where a fault is caused in the regular memory cells 7 in the second to n-th columns in the ninth preferred embodiment are also identical with those of the semiconductor memory of FIG. 18.

The write operation where there is a defective regular memory cell which determines the start address in the memory cell array 1 will be now described below. For the purpose of simplification, the memory cell array 1 is assumed to have m rows and four columns, the fourth column being the redundancy memory cell column. The fault is caused in a memory cell 7 in the first column. For selection of the undefective memory cell columns, it is necessary to place the write bit pointer portions 17CW$_2$ to 17CW$_4$ into normal operation. For this purpose, the control circuit 10 outputs the control signal C at the "H" level potential to the write bit pointer portions 17CW$_2$ to 17CW$_4$, the first switch circuits 18CW$_2$ to 18CW$_4$, and the second switch circuits 19CW$_2$ to 19CW$_4$. At the same time, for non-selection of the memory cells in the first column having the defective memory cell, it is necessary to inhibit the flip-flop operation of the write bit pointer portion 17CW$_1$, to turn off the first switch circuit 18CW$_1$ and to turn on the second switch circuit 19CW$_1$. For this purpose, the control circuit 10 outputs the control signal C at the "L" level potential to the write bit pointer portion 17CW$_1$, the first switch circuit 18CW$_1$ and the second switch circuit 19CW$_1$. When the reset signal is inputted, it is required to set the write and read bit pointer portions which determine the start address of the write and read bit address pointers 11h and 13h. When the reset signal $\overline{WRS}$ or $\overline{RRS}$ is inputted, in order to cause the write bit pointer portion 17CW$_2$ and the read bit pointer portion 17CR$_2$ to serve as the start address, the start address control circuit 100 outputs the start address control signal at the "H" level potential to the write bit pointer portion 17CW$_2$, the first switch circuit 18CW$_2$ and the second switch circuit 19CW$_2$.

Under the foregoing establishments, when the reset signal $\overline{WRS}$ is inputted to the write bit address pointer 11h and the write word address pointer 12h, the write bit pointer portion 17CW$_1$ does not operate as the flip-flop circuit. The write bit pointer portion 17CW$_2$ and the write word pointer portion 8RW$_1$ enter the first reset state, and the write bit pointer portions 17CW$_3$, 17CW$_4$ and the write word pointer portions 8RW$_2$ to 8RW$_m$ enter the second reset state. Then data is written only into the memory cell corresponding to both the memory cell selection line 7SCW$_2$ of the write bit pointer portion 17CW$_2$ and the memory cell selection line 7SRW$_1$ of the write word pointer portion 8RW$_1$. The data is shifted to the next write bit pointer portion 17CW$_3$ as the clock signal T$_1$ proceeds two cycles. The memory cell selection line 7SCW$_3$ outputs the signal for memory cell selection, and the data is written into the memory cell corresponding to the memory cell selection lines 7SCW$_3$ and 7SRW$_1$. The write bit pointer portion 17CW$_4$, which is the write bit pointer portion for redundancy memory cell selection, is designed to operate as the flip-flop circuit by the control signal C from the control circuit 10. Therefore the data is held in the write bit pointer portion 17CW$_4$, and the memory cell selection line 7SCW$_4$ outputs the signal for memory cell selection. The data for memory cell selection outputted from the write bit pointer portion 17CW$_4$ to the write bit pointer portion 17CW$_1$ passes through the second switch circuit 19CW$_1$ to be transmitted to the write bit pointer portion 17CW$_2$. Thus the data passes through the write bit pointer portion 17CW$_1$ without the write operation, so that the defective memory cell is not selected. Normally, the clock signal T$_2$ proceeds as the data makes a round in the write bit address pointer 11h, and then the data is shifted to the next write word pointer portion 8RW$_2$ in the write word address pointer 12h. The same operation as executed in the memory cells in the first row is repeated in the memory cells in the second to last rows. The write operation of data into the memory cells arranged in m rows in three columns is achieved in this manner.

The read operation of data from the memory cells where there is a defective regular memory cell will be now described below. The same operation as the write operation is carried out in the read operation. The data passes through the read bit pointer portion 17CR$_1$ without the read operation, so that the defective memory cell is not selected.

The start address control circuit 100 has a structure as shown FIG. 4 when the memory cell array 1 has four columns including the redundancy circuit column. The output signals Y1 to Y4 of the start address control circuit 100 corresponding to the start address control signal S are assumed to be inputted to the write bit pointer portions 17CW$_1$ to 17CW$_4$ and to the read bit pointer portions 17CR$_1$ to 17CR$_4$, respectively. At this time, the fuses 20a and 20c of the signal generator 26 in the control circuit of FIG. 4 are cut off to set the output signal Y1 to "L", the fuse 20b left uncut, when the defective memory cell lies in the first column.

Tenth Preferred Embodiment

Figure 23:
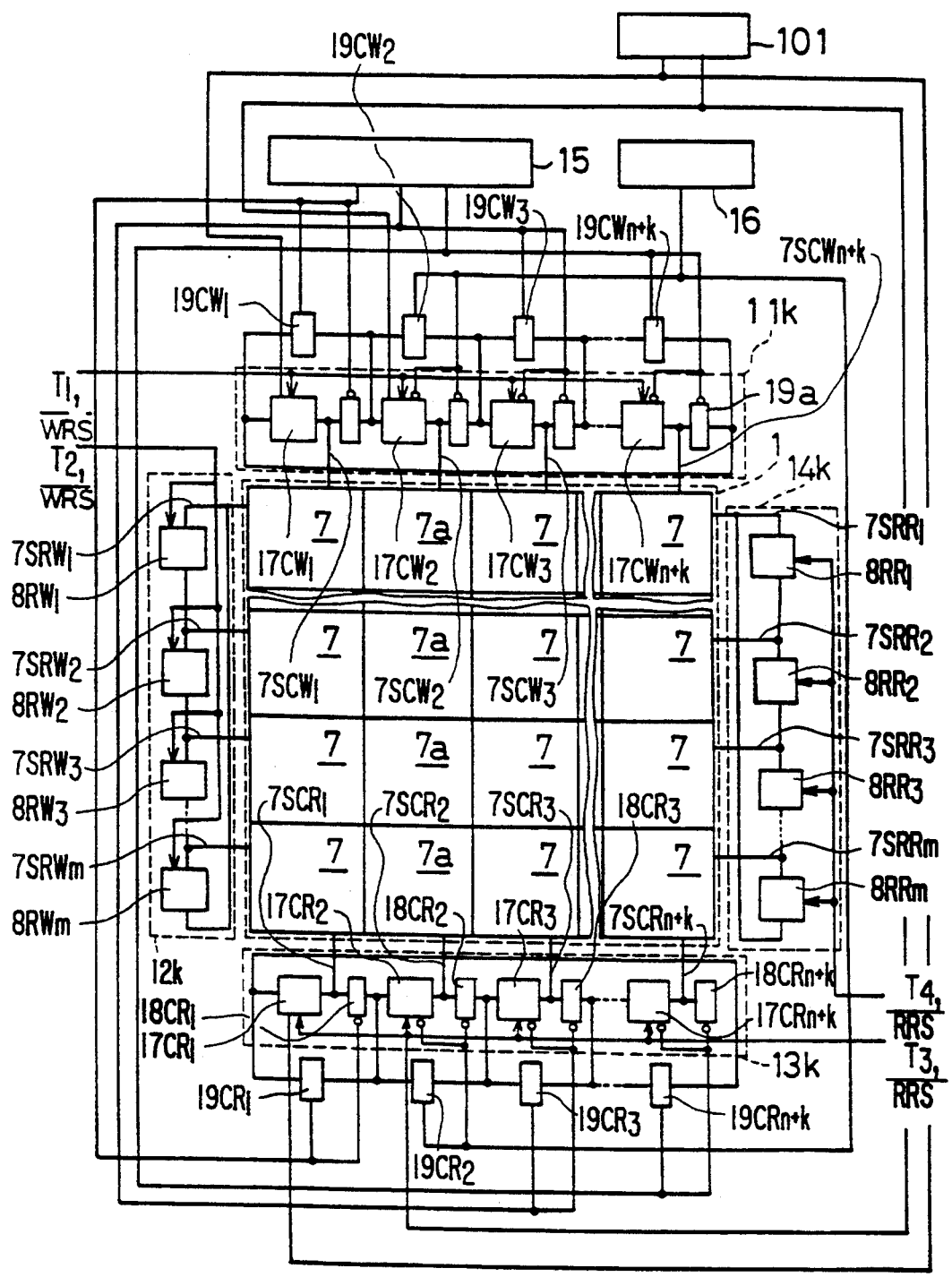
FIG. 23 is a partial block diagram of the semiconductor memory of a tenth preferred embodiment according to the present invention.

A tenth preferred embodiment according to the present invention will be discussed hereinafter with reference to FIG. 23. FIG. 23 is a partial block diagram of the semiconductor memory of the tenth preferred embodiment according to the present invention. In FIG. 23, there is shown an arrangement corresponding to the memory cell array 1, input address part 3, output address part 5, and control circuit 6 of the semiconductor memory of FIG. 1. Reference numeral 1 designates a memory cell array identical with the memory cell array of FIG. 9 including {m×(n+k)} memory cells 7 arranged in matrix form. Reference characters 7SCW$_1$ to 7SCW$_{n+k}$, 7SCR$_1$ to 7SCR$_{n+k}$, 7SRW$_1$ to 7SRW$_m$, and 7SRR$_1$ to 7SRR$_m$ designate column write memory cell selection lines, column read memory cell selection lines, row write memory cell selection lines, and row read memory cell selection lines, respectively, which are identical with those of FIG. 9. Reference character 11k designates a write bit address pointer forming the input address part which has the same structure as the write bit address pointer 11h of FIG. 21 except that the write bit pointer portion 17CW$_2$ connected to the spare memory cells 7a is controlled by the spare control circuit 16. Reference character 12k designates a write word address pointer forming the input address part which has the same function as the write word address pointer 12h of FIG. 21. Reference character 13k designates a read bit address pointer forming the output address part which has the same structure as the read bit address pointer 13h of FIG. 21 except that the write bit pointer portion 17CR$_2$ connected to the spare memory cells 7a is controlled by the spare control circuit. Reference character 14k designates a read word address pointer forming the output address part which has the same function as the read word address pointer 14h of FIG. 21. The write word address pointer 12k may also function as the read word address pointer 14k. In this case, the write word address pointer 12k is controlled in the read operation by the read reset signal $\overline{\text{RRS}}$ and the read clock signal T$_4$ in place of the write reset signal $\overline{\text{WRS}}$ and the write clock signal T$_2$.

Reference characters 19CW$_1$ to 19CW$_{n+k}$, 19CR$_1$ to 19CR$_{n+k}$ designate second switch circuits identical with those of FIG. 21. The second switch circuits 19CW$_2$ and 19CR$_2$ are controlled by the spare control circuit 16.

Reference numeral 15 designates a control circuit having the same structure as the control circuit of FIG. 9, and 16 designates a spare control circuit having the same structure as the spare control circuit of FIG. 9. The start address control circuit 101 controls the write bit pointer portions 17CW$_1$, 17CW$_2$ and the read bit pointer portions 17CR$_1$, 17CR$_2$. The start address control circuit has the same structure as the start address control circuit 101 of FIG. 14.

Description will be given hereinafter on the operation of the semiconductor memory of the tenth preferred embodiment. The write and read operations where there is no defective regular memory cell 7 in the memory cell array 1 and where there is a defective regular memory cell 7 in the column which does not serve as the start address are identical with those of the semiconductor memory of FIG. 20 of the eighth preferred embodiment.

The write operation where there is a defective regular memory cell which determines the start address in the memory cell array 1 will be now described below. For the purpose of simplification, the memory cell array 1 is assumed to have m rows and four columns, the second column being the redundancy spare memory cell column. The fault is caused in a memory cell 7 in the first column. For selection of the undefective memory cell columns, it is necessary to place the write bit pointer portions 17CW$_2$ to 17CW$_4$ into normal operation. For this purpose, the control circuit 15 and the spare control circuit 16 output the control signal C at the "H" level potential to the write bit pointer portions 17CW$_2$ to 17CW$_4$, the first switch circuits 18CW$_2$ to 18CW$_4$, and the second switch circuits 19CW$_2$ to 19CW$_4$. At the same time, for non-selection of the memory cells in the first column having the defective memory cell, it is necessary to inhibit the flip-flop operation of the write bit pointer portion 17CW$_1$, to turn off the first switch circuit 18CW$_1$, and to turn on the second switch circuit 19CW$_1$. For this purpose, the control circuit 15 outputs the control signal C at the "L" level potential to the write bit pointer portion 17CW$_1$, the first switch circuit 18CW$_1$, and the second switch circuit 19CW$_1$. In addition, a need exists for setting the write and read bit pointer portions which determine the start address of the write and read bit address pointers 11k and 13k when the reset signal is inputted. When the reset signal $\overline{\text{WRS}}$ or $\overline{\text{RRS}}$ is inputted, in order to cause the write bit pointer portion 17CW$_2$ and the read bit pointer portion 17CR$_2$ to serve as the start address, the start address control circuit 101 outputs the start address control signal at the "H" level potential to the write bit pointer portion 17CW$_2$, the first switch circuit 18CW$_2$, and the second switch circuit 19CW$_2$.

Under the foregoing establishments, when the reset signal $\overline{\text{WRS}}$ inputted to the write bit address pointer 11k and the write word address pointer 12k, the write bit pointer portion 17CW$_1$ does not operate as the flip-flop circuit. The write bit pointer portion 17CW$_2$ and the write word pointer portion 8RW$_1$ enter the first reset state, and the write bit pointer portions 17CW$_3$, 17CW$_4$, and the write word pointer portions 8RW$_2$ to 8RW$_m$ enter the second reset state. Then data is written only into the memory cell corresponding to both the memory cell selection line 7SCW$_2$ of the write bit pointer portion 17CW$_2$ and the memory cell selection line 7SRW$_1$ of the write word pointer portion 8RW$_1$.

The data transmitted to the memory cell array 1 from the input circuit 2 of FIG. 11, as is not shown in FIG. 21, is written into the memory cells. The data is shifted to the next write bit pointer portion 17CW$_3$ in synchronism with the dock signal T$_1$. The memory cell selection line 7SCW$_3$ outputs the signal for memory cell selection, and the data is written into the memory cell corresponding to the memory cell selection lines 7SCW$_3$ and 7SRW$_1$. The write bit pointer portion 17CW$_2$, which is for selection of the spare memory cells 7a for redundancy, is designed to operate as the flip-flop circuit by the control signal C from the spare control circuit 16. Therefore the data for selection of the spare memory cells 7a is held in the write bit pointer portion 17CW₂, and the spare memory cell selection line 7SCW₂ outputs the signal for selection of the spare memory cells 7a. Then the data is written into the memory cell selected by the write bit pointer portion 17CW₄. The data for memory cell selection outputted from the write bit pointer portion 17CW₄ to the write bit pointer portion 17CW₁ passes through the second switch circuit 19CW₁ to be transmitted to the write bit pointer portion 17CW₂. The data passes through the write bit pointer portion 17CW₁ without the write operation, so that the defective memory cell is not selected. Normally, the clock signal T₂ proceeds as the data makes a round in the write bit address pointer 11k, and then the data is shifted to the next write word pointer portion 8RW₂ in the write word address pointer 12k. The same operation as executed in the memory cells in the first row is repeated in the memory cells in the second to last rows. The write operation of data into the memory cells arranged in m rows in three columns in the memory cell array 1 is achieved in this manner.

The read operation of data from the memory cells where there is a defective regular memory cell will be now described below. The same operation as the write operation is carried out in the read operation. The data passes through the read bit pointer portion 17CR₁ without the read operation, so that the defective memory cell is not selected.

The start address control circuit 101 has a structure as shown FIG. 4 when the memory cell array 1 has four columns including the redundancy circuit column. The output signals Y1 to Y4 of the start address control circuit 101 corresponding to the start address control signal S are assumed to be inputted to the write bit pointer portions 17CW₁ to 17CW₄ and to the read bit pointer portions 17CR₁ to 17CR₄, respectively. At this time, the fuses 20a and 20c of the signal generator 26 in the control circuit of FIG. 4 are cut off to set the output signal Y1 to "L", the fuse 20b left uncut, when the defective memory cell lies in the first column.

Eleventh Preferred Embodiment

Figure 24:
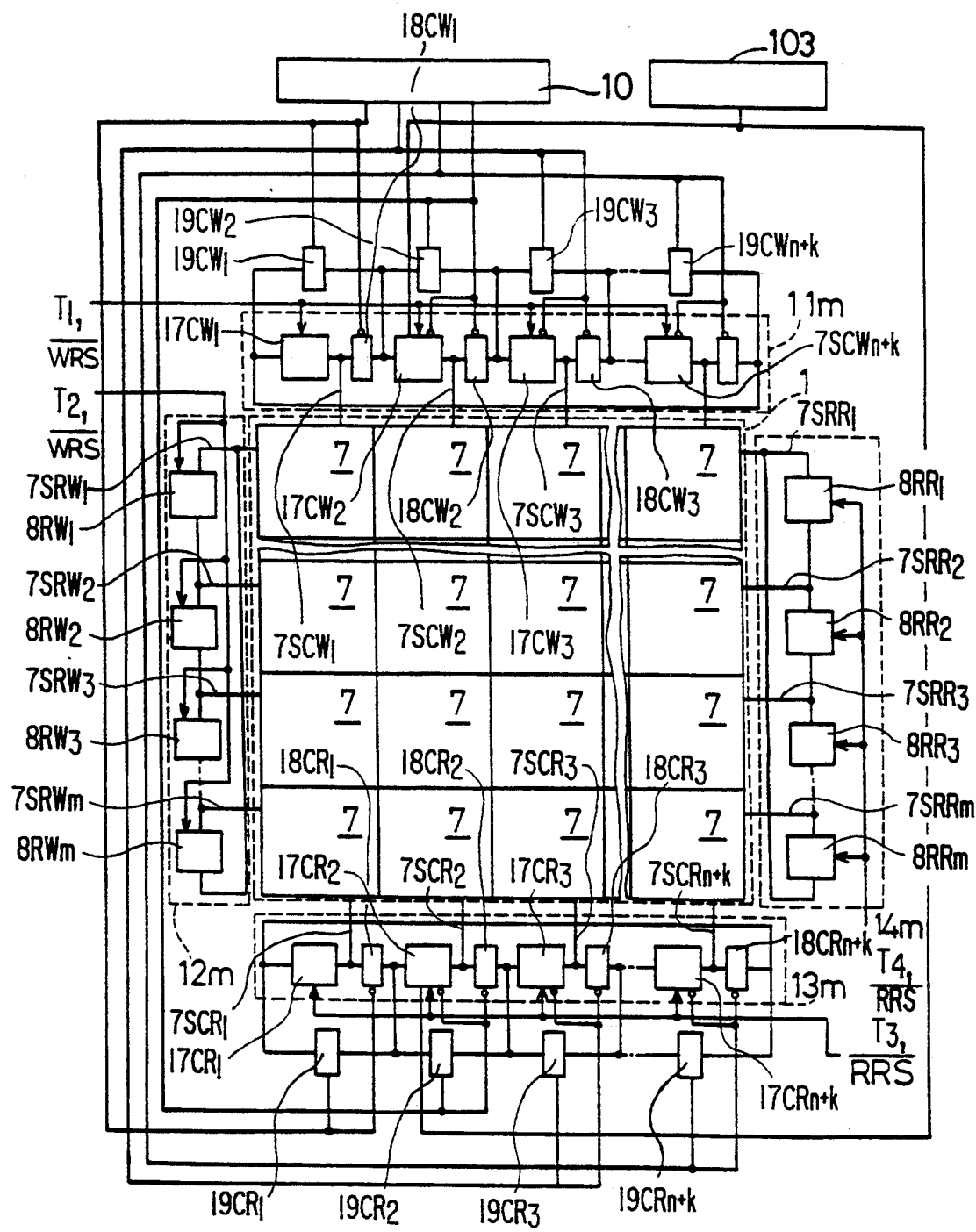
FIG. 24 is a partial block diagram of the semiconductor memory of an eleventh preferred embodiment according to the present invention.

An eleventh preferred embodiment according to the present invention will be discussed hereinafter with reference to FIG. 24. The semiconductor memory of the eleventh preferred embodiment is provided by partially changing the semiconductor memory of FIG. 21 of the ninth preferred embodiment. Although the semiconductor memory of FIG. 21 comprises the start address control circuit 100 which controls all of the write bit pointer portions 17CW₁ to 17CW$_{n+k}$ and the read bit pointer portions 17CR₁ to 17CR$_{n+k}$, the semiconductor memory of FIG. 24 comprises a start address control circuit 103 which controls only the write bit pointer portion 17CW₂ and the read bit pointer portion 17CR₂. Thus write and read bit address pointers 11m and 13m shown in FIG. 24 comprise the write and read bit pointer portions 17CW₁ and 17CR₁ including the flip-flop circuit of FIG. 8, the write and read bit pointer portions 17CW₂ and 17CR₂ including the flip-flop circuit of FIG. 22, and the write and read bit pointer portions 17CW₃ to 17CW$_{n+k}$, 17CR₃ to 17CR$_{n+k}$ including the flip-flop circuit of FIG. 19, respectively.

The start address control circuit 103, which controls the write bit pointer portion 17CW₂ and the read bit pointer portion 17CR₂, may have a simple structure as shown in FIG. 10.

Twelfth Preferred Embodiment

Figure 25:
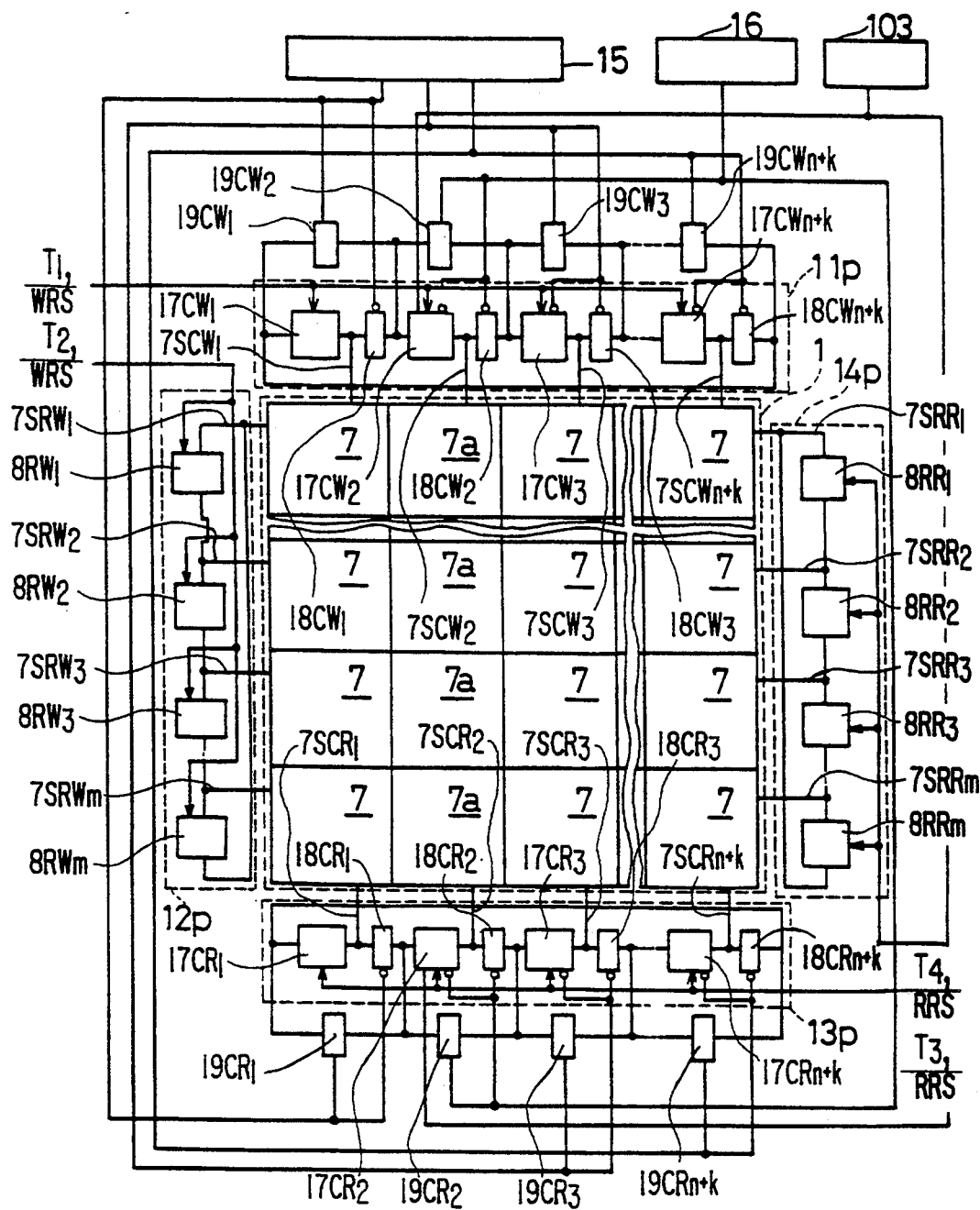
FIG. 25 is a partial block diagram of the semiconductor memory of a twelfth preferred embodiment according to the present invention.
Figure 26:
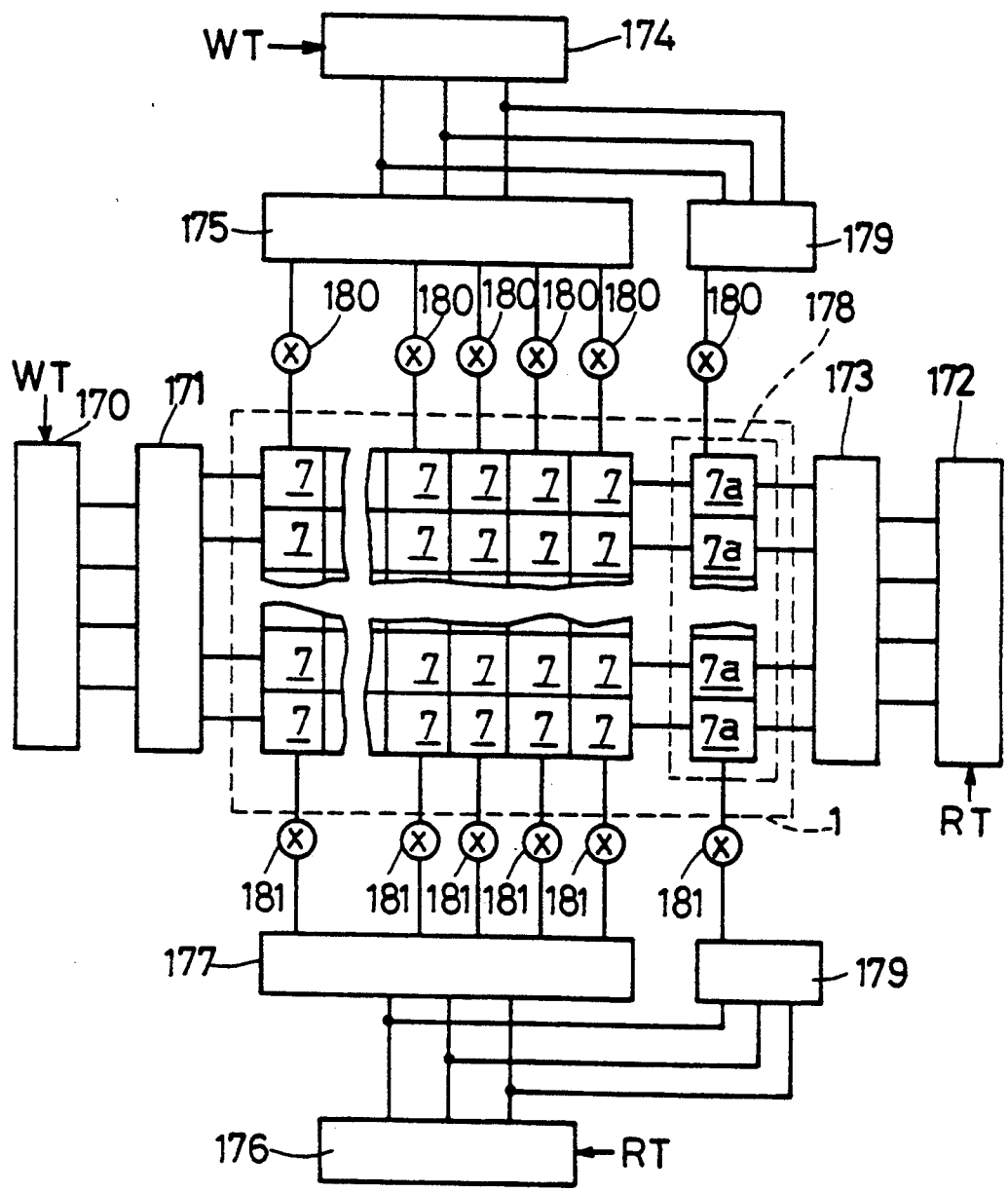
FIG. 26 is a block diagram of a conventional semiconductor memory.

A twelfth preferred embodiment according to the present invention will be discussed hereinafter with reference to FIG. 25. The semiconductor memory of the twelfth preferred embodiment is provided by partially changing the semiconductor memory of FIG. 23 of the tenth preferred embodiment. Although the semiconductor memory of FIG. 23 comprises the start address control circuit 101 which controls all of the write bit pointer portions 17CW₁ to 17CW$_{n+k}$ and the read bit pointer portions 17CR₁ to 17CR$_{n+k}$, the semiconductor memory of FIG. 25 comprises the start address control circuit 103 which controls only the write bit pointer portion 17CW₂ and the read bit pointer portion 17CR₂. Thus write and read bit address pointers 11p and 13p shown in FIG. 25 comprise the write and read bit pointer portions 17CW₁ and 17CR₁ including the flip-flop circuit of FIG. 8, the write and read bit pointer portions 17CW₂ and 17CR₂ including the flip-flop circuit of FIG. 22, and the write and read bit pointer portions 17CW₃ to 17CW$_{n+k}$, 17CR₃ to 17CR$_{n+k}$ including the flip-flop circuit of FIG. 19, respectively.

The start address control circuit 103, which controls the write bit pointer portion 17CW₂ and the read bit pointer portion 17CR₂, may have a simple structure as shown in FIG. 10.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:
    (a) a plurality of memory cells arranged in the form of a matrix having a plurality of rows and a plurality of columns;
    (b) memory cell selecting means including a plurality of memory cell selecting portions provided in corresponding relation to said plurality of rows or said plurality of columns and each having an input node, an output node, a control node, a selection signal output node, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to said selecting portion for transmitting the data inputted to the corresponding input node directly to the corresponding output node, said control node receiving a control signal which makes one of the corresponding selecting portion and data through portion operable and makes the other portion inoperable, said input and output nodes of said memory cell selecting portions being connected in series so that said memory cell selecting portions form a loop; and
    (c) programmable control means for outputting the control signals to said plurality of control nodes of said memory cell selecting means as a function of signals smaller in number than said control signals in order to make the selecting portion inoperable and make the data through portion operable in at least one of said plurality of memory cell selecting portions of said memory cell selecting means.

2. A semiconductor memory comprising:
(a) a plurality of memory cells arranged in the form of a matrix having a plurality of rows and a plurality of columns;
(b) memory cells selecting means including
a plurality of memory cell selecting portions provided in corresponding relation to rows or columns and each having an input node, an output node, a control node, a selection signal output node, a state setting signal input terminal, a selecting portion for temporarily storing the data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to said selecting portion for transmitting the data inputted to the corresponding input node directly to the corresponding output node, said control node receiving a control signal which makes one of the corresponding selection portion and data through portion operable and makes the other portion inoperable, each of said plurality of memory cell selecting portions executing a predetermined setting whether to produce therein data to be stored or to erase the stored data in accordance with a state setting signal inputted to said state setting signal input terminal, and
a start address memory cell selecting portion provided in corresponding relation to at least one row or one column and having an input node, and output node, a control node, a selection signal output node, a state setting signal input terminal, a start address control signal input terminal, a selecting portion for temporarily storing data inputted to the corresponding input node to transmit the temporarily stored data to the corresponding output node and to output a signal for selecting the memory cells provided in the corresponding column or row by means of the temporarily stored data to the corresponding selection signal output node, and a data through portion corresponding to said selecting portion for transmitting the data inputted to the corresponding input node directly to the corresponding output node, said control node receiving a control signal which makes one of the selecting portion and data through portion operable and makes the other portion inoperable, said state address memory cell selecting portion selectively setting whether to produce therein data to be stored or to erase the stored data in accordance with a state setting signal inputted to said state setting signal input terminal and a start address control signal inputted to said start address control signal input terminal,
said input and output nodes of said memory cell selecting portions and said start address memory cell selecting portion being connected in series so that said memory cell selecting portions and said start address memory cell selecting portion form a loop; and
(c) programmable control means for outputting the control signals to the control nodes of said memory cell selecting means as a function of signals smaller in number than said control signals in order to make the selecting portion inoperable and make the data through portion operable in at least one of the plurality of memory cell selecting portions and start address memory cell selecting portion of said memory cell selecting means.

3. A semiconductor memory comprising:
(a) a memory cell array including a plurality of memory cells;
(b) a plurality of memory cell selection lines for transmitting a signal for selecting a memory cell from or into which data is to be read or written from said plurality of memory cells;
(c) an address pointer including a plurality of flip-flop circuits each having an input terminal, an output terminal, a control terminal, a selection signal output terminal connected to the corresponding memory cell selection line, and a data through circuit connected to said input and output terminals, said plurality of flip-flop circuits being connected in series to form a loop; and
(d) a control circuit including a plurality of control signal output terminals corresponding to said flip-flop circuits, selection signal producing means for producing a flip-flop selection signal for selecting an arbitrary flip-flop circuit from said plurality of flip-flop circuits, and decoding means for decoding said flip-flop selection signal to output a first or second control signal to said respective control signal output terminals, said control signal output terminals being connected to said control terminals of said flip-flop circuits, respectively, said control circuit controlling said data through circuits by means of said first or second control signal outputted from said control terminals to select a data transmission path in said flip-flop circuits,
wherein each of said flip-flop circuits enters a first state of passing data inputted from said input terminal directly to said output terminal by means of said data through circuit in response to said first control signal inputted to said control terminal, and enters a second state of outputting a signal for selecting said memory cells from said selection signal output terminal by means of the signal inputted from said input terminal without passing the data inputted from said input terminal directly to said output terminal by means of said data through circuit in response to said second control signal inputted to said control terminal.

4. The semiconductor memory of claim 3, wherein said selection signal producing means includes:
a plurality of fuses each having a first end connected to a first potential, and a second end; and
a plurality of voltage drop means each having a first end connected to a second potential different from said first potential and a second end connected to the second end of the corresponding fuses for outputting said flip-flop selection signal from said second end thereof.

5. The semiconductor memory of claim 4 wherein said decoding means includes:
a plurality of first inverter circuits each having an input connected to said second end of the corresponding voltage drop means for outputting the logically inverted signal of said flip-flop selection signal outputted from said selection signal producing means; and a plurality of first AND circuits each having a plurality of inputs receiving all of said flip-flop selection signals from said selection signal producing means directly or the logically inverted signals thereof through said first inverter circuits for outputting the logical product of said signals to the corresponding control signal output terminals.

6. The semiconductor memory of claim 5, wherein each of said flip-flop circuits includes:

a master latch circuit receiving a clock signal and connected to said input terminal for latching and outputting a signal inputted from said input terminal in synchronism with said clock signal; and a slave latch circuit receiving an output signal of said master latch circuit, said clock signal, and said first or second control signal for selecting a state of latching and outputting said output signal to said output terminal in synchronism with said clock signal or a state of unlatching said output signal by means of said first or second control signal.

7. The semiconductor memory of claim 6, wherein said data through circuit includes:

a transistor having a first electrode connected to said input terminal, a second electrode connected to said output terminal, and a control electrode receiving said first or second control signal or the logically inverted signal thereof.

8. The semiconductor memory of claim 7, wherein said slave latch circuit includes:

a first transmission gate having a first end for receiving said output signal of said master latch circuit, said first transmission gate being turned on or off in response to said clock signal or the logically inverted signal thereof, said first transmission gate further having a second end for selectively outputting said output signal of said master latch circuit;

a second AND circuit having a first input connected to said second end of said first transmission gate, a second input receiving said first or second control signal, and an output;

a second inverter circuit having an input connected to the output of said second AND circuit, and an output connected to the corresponding memory cell selection line;

a third inverter circuit having an input connected to the output of said second inverter circuit, and an output;

a fourth inverter circuit having an input connected to the output of said third inverter circuit, and an output connected to said output terminal, and receiving said first or second control signal, said fourth inverter circuit being controlled to be operable or inoperable by means of said first or second control signal; and a second transmission gate having a first end connected to said second end of said first transmission gate, and a second end connected to said output terminal, said second transmission gate being turned on or off complementarily to said first transmission gate in response to said clock signal or the logically inverted signal thereof.

9. The semiconductor memory of claim 7, wherein said slave latch circuit includes:

a first transmission gate having a first end for receiving said output signal of said master latch circuit, said first transmission gate being turned on or off in response to said clock signal or the logically inverted signal thereof, said first transmission gate further having a second end for selectively outputting said output signal of said master latch circuit;

a second AND circuit having a first input connected to said second end of said first transmission gate, a second input receiving said first or second control signal, and an output;

a second inverter circuit having an input connected to the output of said second AND circuit, and an output connected to said output terminal, and receiving said first or second control signal, said second inverter circuit being controlled to be operative or inoperative by means of said first or second control signal; and a second transmission gate having a first end connected to said second end of said first transmission gate, and a second end connected to said output terminal, said second transmission gate being turned on or off in response to said clock signal or the logically inverted signal thereof.

10. A semiconductor memory comprising:

(a) a memory cell array including a plurality of memory cells;

(b) a plurality of memory cell selection lines for transmitting a signal for selecting a memory cell from or into which data is to be read or written from said plurality of memory cells;

(c) an address pointer including a plurality of flip-flop circuits each having an input terminal and an output terminal, and a plurality of first switch circuits each having a first terminal, a second terminal and a control terminal, said input terminals of said flip-flop circuits being connected to said second terminals of said first switch circuits, said output terminals of said flip-flop circuits being connected to said first terminals of said first switch circuits whereby said flip-flop circuits and said first switch circuits are connected in series alternately with each other to form a loop, said memory cell selection lines being connected to connections between said output terminals of said flip-flop circuits and said first terminals of said first switch circuits;

(d) a plurality of second switch circuits each including a first terminal, a second terminal and a control terminal, said first terminals being connected to said input terminals of said flip-flop circuits, said second terminals being connected to said second terminals of said first switch circuits connected to said output terminals of said flip-flop circuits; and (e) a control circuit including a plurality of control signal output terminals corresponding to said plurality of first and second switch circuits, respectively, selection signal producing means for producing a flip-flop selection signal for selecting an arbitrary flip-flop circuit from said plurality of flip-flop circuits; and decoding means for decoding said flip-flop selection signal to output a first or second control signal to said respective control signal output terminals, said control signal output terminals being connected to said control terminals of said first and second switch circuits, respectively, said control circuit controlling said first and second switch circuits by means of said first or second control signal outputted to said control terminals from said control signal output terminals to select a first state of turning off said first switch circuits and turning on said second switch circuits or a second state of turning on said first switch circuits and turning off said second switch circuits.

11. The semiconductor memory of claim 10, wherein said selection signal producing means includes:
a plurality of fuses each having a first end connected to a first potential, and a second end; and
a plurality of voltage drop means each having a first end connected to a second potential different from said first potential, and a second end connected to the second end of the corresponding fuses for outputting said flip-flop selection signal from said second end thereof.

12. The semiconductor memory of claim 11, wherein said decoding means includes:
a plurality of first inverter circuits each having an input connected to said second end of the corresponding voltage drop means for outputting the logically inverted signal of said flip-flop selection signal outputted from said selection signal producing means; and
a plurality of first AND circuits each having a plurality of inputs receiving all of said flip-flop selection signals from said selection signal producing means directly or the logically inverted signals thereof through said first inverter circuits for outputting the logical product of said signals to the corresponding control signal output terminals.

13. The semiconductor memory of claim 12, wherein each of said flip-flop circuits includes:
a master latch circuit receiving a clock signal and a state setting signal and connected to said input terminal for latching and outputting a signal inputted from said input terminal in synchronism with said clock signal, the state of said master latch circuit being permitted to be set by means of said state setting signal; and
a slave latch circuit receiving an output signal of said master latch circuit, said clock signal, and said state setting signal for latching and outputting said output signal to said output terminal in synchronism with said clock signal.

14. A semiconductor memory comprising:
(a) a memory cell array including a plurality of memory cells;
(b) a plurality of memory cell selection lines for transmitting a signal for selecting a memory cell from or into which data is to be read or written from said plurality of memory cells;
(c) an address pointer including a plurality of flip-flop circuits each having an input terminal, an output terminal, a control terminal, a selection signal output terminal connected to the corresponding memory cell selection line, and a data through circuit connected to said input and output terminals, said plurality of flip-flop circuits being connected in series to form a loop;
(d) a control circuit including a plurality of control signal output terminals corresponding to said flip-flop circuits, selection signal producing means for producing a flip-flop selection signal for selecting an arbitrary flip-flop circuit from said plurality of flip-flop circuits, and decoding means for decoding said flip-flop selection signal to output a first or second control signal to said respective control signal output terminals, said control signal output terminals being connected to said control terminals of said flip-flop circuits, respectively, said control circuit controlling said data through circuits by means of said first or second control signal outputted from said control terminals to select a data transmission path in said flip-flop circuits; and
(e) a start address control circuit including at least one start address control signal output terminal connected to at least one of said flip-flop circuits for producing a start address control signal for specifying one arbitrary flip-flop circuit among said flip-flop circuits connected to said start address control signal output terminal to output said start address control signal from said start address control signal output terminal,
said flip-flop circuit connected to said start address control signal output terminal including a start address control signal input terminal connected to said start address control signal output terminal, a state setting signal input terminal receiving a state setting signal, and a set/reset control circuit controlled by said start address control signal inputted to said start address control signal input terminal for setting a set or reset state of said flip-flop circuit in response to said state setting signal inputted to said state setting signal input terminal,
each flip-flop circuit which is not connected to said start address control signal output terminal including a state setting signal input terminal receiving said state setting signal and set or reset in response to said state setting signal,
wherein each of said flip-flop circuits enters a first state of passing data inputted from said input terminal directly to said output terminal by means of said data through circuit in response to said first control signal inputted to said control terminal, and enters a second state of outputting a signal for selecting said memory cells from said selection signal output terminal by means of the signal inputted from said input terminal without passing the data inputted to said input terminal directly to said output terminal by means of said data through circuit in response to said second control signal inputted to said control terminal.

15. The semiconductor memory of claim 14, wherein said selection signal producing means includes:
a plurality of fuses-each having a first end connected to a first potential, and a second end; and
a plurality of voltage drop means each having a first end connected to a second potential different from said first potential, and a second end connected to the second end of the corresponding fuses for outputting said flip-flop selection signal from said second end thereof.

16. The semiconductor memory of claim 15, wherein said decoding means includes:
a plurality of inverter circuits each having an input connected to said second end of the corresponding voltage drop means for outputting the logically inverted signal of said flip-flop selection signal outputted from said selection signal producing means; and
a plurality of AND circuits each having a plurality of inputs receiving all of said flip-flop selection signals from said selection signal producing means directly or the logically inverted signals thereof through said first inverter circuits for outputting the logical product of said signals to the corresponding control signal output terminals.

17. The semiconductor memory of claim 26, wherein said flip-flop circuit that is not connected to said start address control circuit includes:

a master latch circuit receiving a clock signal and said state setting signal and connected to said input terminal for latching and outputting a signal inputted from said input terminal in synchronism with said clock signal, said master latch circuit being permitted to be set to a set or reset state; and a slave latch circuit receiving an output signal of said master latch circuit, said clock signal, said first or second control signal and said state setting signal for selecting a state of latching and outputting said output signal to said output terminal in synchronism with said clock signal or a state of unlatching said output signal by means of said first or second control signal, said slave latch circuit being permitted-to be set to a set or reset-state.

18. The semiconductor memory of claim 17, wherein said data through circuit that is not connected to said start address control circuit includes:

a transistor having a first electrode connected to said input terminal, a second electrode connected to said output terminal, and a control electrode receiving said first or second control signal or the logically inverted signal thereof.

19. The semiconductor memory of claim 18, wherein said slave latch circuit that is not connected to said start address control circuit includes:

a first transmission gate having a first end for receiving said output signal of said master latch circuit, said first transmission gate being turned on or off in response to said clock signal or the logically inverted signal thereof, said first transmission gate further having a second end for selectively outputting said output signal of said master latch circuit;

a second AND circuit having a first input connected to said second end of said first transmission gate, a second input receiving said state setting signal, a third input receiving said first or second control signal, and an output;

a second inverter circuit having an input connected to the output of said second AND circuit, and an output connected to the corresponding memory cell selection line;

a third inverter circuit having an input connected to the output of said second inverter circuit, and an output;

a fourth inverter circuit having an input connected to the output of said third inverter circuit, and an output connected to said output terminal, and receiving said first or second control signal, said fourth inverter circuit being controlled to be operable or inoperable by means of said first or second control signal; and a second transmission gate having a first end connected to said second end of said first transmission gate, and a second end connected to said output terminal, said second transmission gate being turned on or off complementarily to said first transmission gate in response to said clock signal or the logically inverted signal thereof.

20. The semiconductor memory of claim 18, wherein said slave latch circuit that is not connected to said start address control circuit includes:

a first transmission gate having a first end for receiving said output signal of said master latch circuit, said first transmission gate being turned on or off in response to said dock signal or the logically inverted signal thereof, said first transmission gate further having a second end for Selectively outputting said output signal of said master latch circuit;

a second AND circuit having a first input connected to said second end of said first transmission gate, a second input receiving said state setting signal, a third input receiving said first or second control signal, and an output;

a second inverter circuit having an input connected to the output of said second AND circuit, and an output connected to said output terminal, and receiving said first or second control signal, said second inverter circuit being controlled to be operable or inoperable by means of said first or second control signal; and a second transmission gate having a first end connected to said second end of said first transmission gate, and a second end connected to said output terminal, said second transmission gate being turned on or off in response to said clock signal or the logically inverted signal thereof.

21. The semiconductor memory of claim 16, wherein said set/reset control circuit includes first and second set/reset control circuits, and said flip-flop circuit connected to said start address control circuit includes:

a master latch circuit having said first set/reset control circuit connected to said state setting signal input terminal, and receiving a clock signal, and connected to said input terminal for latching and outputting a signal inputted from said input terminal in synchronism with said clock signal, said master latch circuit being permitted to be set to a set or reset state so as to output a start address by means of said state setting signal; and a slave latch circuit having said second set/reset control circuit connected to said state setting signal input terminal, and receiving an output signal of said master latch circuit, said clock signal, and said first or second control signal for selecting a state of latching and outputting said output signal to said output terminal in synchronism with said clock signal or a state of unlatching said output signal by means of said first or second control signal, said slave latch circuit being permitted to be set to a set or reset state so as to output a start address by, means of said state setting signal.

22. The semiconductor memory of claim 21, wherein said data through circuit of said flip-flop circuit connected to said start address control circuit includes:

a transistor having a first electrode connected to said input terminal, a second electrode connected to said output terminal, and a control electrode receiving said first or second controls signal or the logically inverted signal thereof.

23. The semiconductor memory of claim 22, wherein said master latch circuit of said flip-flop circuit connected to said start address control circuit includes:

a first transmission gate having a first end connected to said input terminal, said first transmission gate being turned on or off in response to said clock signal or the logically inverted signal thereof, and a second end;

a second AND circuit having a first input connected to the second end of said first transmission gate, a second input receiving a first output signal of said first set/reset control circuit, and an output;

a third AND circuit having a first input connected to the output of said second AND circuit, and a second input receiving a second output signal of said first set/reset control circuit; and a second transmission gate having a first end connected to the second end of said first transmission gate, and a second end connected to the output of said third AND circuit, said second transmission gate being turned on or off complementarily to said first transmission gate in response to said clock signal or the logically inverted signal thereof, and said slave latch circuit of said flip-flop circuit connected to said start address control circuit includes:

a third transmission gate having a first end for receiving said output signal of said master latch circuit, said third transmission gate being turned on or off complementarily to said first transmission gate in response to said clock signal or the logically inverted signal thereof, said third transmission gate further having a second end for selectively outputting said output signal of said master latch circuit;

a fourth AND circuit having a first input connected to said second end of said third transmission gate, a second input receiving a first output signal of said second set/reset control circuit, a third input receiving said first or second control signal, and an output;

a fifth AND circuit having a first input connected to the output of said fourth AND circuit, a second input receiving a second output signal of said second set/reset control circuit, and an output connected to the corresponding memory cell selection line;

a second inverter circuit having an input connected to the output of said fifth AND circuit, and an output;

a third inverter circuit having an input connected to the output of said second inverter circuit, and an output connected to said output terminal, and receiving said first or second control signal, said third inverter circuit being controlled to be operable or inoperable by means of said first or second control signal; and a fourth transmission gate having a first end connected to said second end of said third transmission gate, and a second end connected to said output terminal, said fourth transmission gate being turned on or off complementarily to said third transmission gate in response to said clock signal or the logically inverted signal thereof.

24. The semiconductor memory of claim 22, wherein said start address control circuit includes:

a fuse having a first end connected to a first potential, and a second end; and voltage drop means having a first end connected to a second potential different from said first potential, and a second end connected to the second end of said fuse.

25. A semiconductor memory comprising:

(a) a memory cell array including a plurality of memory cells;

(b) a plurality of memory cell selection lines for transmitting a signal for selecting a memory cell from or into which data is to be read or written from said plurality of memory cells;

(c) an address pointer including a plurality of flip-flop circuits each having an input terminal and an output terminal, and a plurality of first switch circuits each having a first terminal, a second terminal and a control terminal, said input terminals of said flip-flop circuits being connected to said second terminals of said first switch circuits, said output terminals of said flip-flop circuits being connected to said first terminals of said first switch circuits, whereby said flip-flop circuits and said first switch circuits being connected in series alternately with each other to form a loop, said memory cell selection lines being connected to connections between said output terminals of said flip-flop circuits and said first terminals of said first switch circuits;

(d) a plurality of second switch circuits each including a first terminal, a second terminal and a control terminal, said first terminals being connected to said input terminals of said flip-flop circuits, said second terminals being connected to said second terminals of said first switch circuits connected to said output terminals of said flip-flop circuits;

(e) a control circuit including a plurality of control signal output terminals corresponding to said plurality of first and second switch circuits, respectively, selection signal producing means for producing a flip-flop selection signal for selecting an arbitrary flip-flop circuit from said plurality of flip-flop circuits, and decoding means for decoding said flip-flop selection signal to output a first or second control signal to said respective control signal output terminals, said control signal output terminals being connected to said control terminals of said first and second switch circuits, respectively, said control circuit controlling said first and second switch circuits by means of said first or second control signal outputted from said control signal output terminals to said control terminals to select a first state of turning off said first switch circuits and turning on said second switch circuits or a second state of turning on said first switch circuits and turning off said second switch circuits; and (f) a start address control circuit including at least one start address control signal output terminal connected to at least one of said flip-flop circuits for producing a start address control signal for specifying one arbitrary flip-flop circuit among said flip-flop circuits connected to said start address control signal output terminal to output said start address control signal from said start address control signal output terminal, said flip-flop circuit connected to said start address control signal output terminal including a start address control signal input terminal connected to said start address control signal output terminal, a state setting signal input terminal receiving a state setting signal, and a set/reset control circuit controlled by said start address control signal for setting a set or reset state of said flip-flop circuit in response to said state setting signal, each flip-flop circuit which is not connected to said start address control signal output terminal including a state setting signal input terminal receiving said state setting signal and set or reset in response to said state setting signal.

26. The semiconductor memory of claim 25, wherein said selection signal producing means includes:

a plurality of fuses each having a first end connected to a first potential, and a second end; and a plurality of voltage drop means each having a first end connected to a second potential different from said first potential, and a second end connected to the second end of the corresponding fuses for outputting said flip-flop selection signal from said second end thereof.

27. The semiconductor memory of claim 26, wherein said decoding means includes:

a plurality of first inverter circuits each having an input connected to said second end of the corresponding voltage drop means for outputting the logically inverted signal of said flip-flop selection signal outputted from said selection signal producing means; and a plurality of first AND circuits each having a plurality of inputs receiving all of said flip-flop selection signals from said selection signal producing means directly or the logically inverted signals thereof through said first inverter circuits for outputting the logical product of said signals to the corresponding control signal output terminals.

28. The semiconductor memory of claim 27, wherein said flip-flop circuit that is not connected to said start address control circuit includes:

a master latch circuit receiving a clock signal and said state setting signal, and connected to said input terminal for latching and outputting a signal inputted from said input terminal in synchronism with said clock signal, said master latch circuit being permitted to be set to a set or reset state; and a slave latch circuit receiving an output signal of said master latch circuit, said clock signal, and said state setting signal for latching and outputting said output signal to said output terminal in synchronism with said clock signal, said slave latch circuit being permitted to be set to a set or reset state.

29. The semiconductor memory of claim 27, wherein said set/reset control circuit includes first and second set/reset control circuits, and said flip-flop circuit connected to said start address control circuit includes:

a master latch circuit having said first set/reset control circuit connected to said state setting signal input terminal, and receiving a clock signal, and connected to said input terminal for latching and outputting a signal inputted from said input terminal in synchronism with said clock signal, said master latch circuit being permitted to be set to a set or reset state so as to output a start address by means of said state setting signal; and a slave latch circuit having said second set/reset control circuit connected to said state setting signal input terminal, and receiving an output signal of said master latch circuit, said clock signal, and said first or second control signal for selecting a state of latching and outputting said output signal to said output terminal in synchronism with said clock signal or a state of unlatching said output signal by means of said first or second control signal, said slave latch circuit being permitted to be set to a set or reset state so as to output a start address by means of said state setting signal.

30. The semiconductor memory of claim 29, wherein said master latch circuit of said flip-flop circuit connected to said start address control circuit includes:

a first transmission gate having a first end connected to said input terminal, said first transmission gate being turned on or off in response to said clock signal or the logically inverted signal thereof, and a second end;

a second AND circuit having a first input connected to the second end of said first transmission gate, a second input receiving a first output signal of said first set/reset control circuit, and an output;

a third AND circuit having a first input connected to the output of said second AND circuit, a second input receiving a second output signal of said first set/reset control circuit, and an output; and a second transmission gate having a first end connected to the second end of said first transmission gate, and a second end connected to the output of said third AND circuit, said second transmission gate being turned on or off complementarily to said first transmission gate in response to said clock signal or the logically inverted signal thereof, and said slave latch circuit of said flip-flop circuit connected to said start address control circuit includes:

a third transmission gate having a first end for receiving said output signal of said master latch circuit, said third transmission gate being turned on or off complementarily to said first transmission gate in response to said clock signal or the logically inverted signal thereof, said third transmission gate further having a second end for selectively outputting said output signal of said master latch circuit;

a fourth AND circuit having a first input connected to said second end of said third transmission gate, a second end receiving a first output signal of said second set/reset control circuit, a third input receiving said first or second control signal, and an output;

a fifth AND circuit having a first input connected to the output of said fourth AND circuit, a second input receiving a second output signal of said second set/reset control circuit, and an output connected to said output terminal; and a fourth transmission gate having a first end connected to said second end of said third transmission gate, and a second end connected to said output terminal, said fourth transmission gate being turned on or off complementarily to said third transmission gate in response to said clock signal or the logically inverted signal thereof.

31. The semiconductor memory of claim 31, wherein said start address control circuit includes:

a fuse having a first end at a first potential; and voltage drop means having a first end at a second potential different from said first potential, and a second end connected to the second end of said fuse.

32. The semiconductor memory of claim 31, wherein said first set/reset control circuit includes:

second and third inverter circuits each having an input receiving said state setting signal;

a fourth inverter circuit having an input receiving said start address control signal;

a Sixth AND circuit having a first input connected to the output of said second inverter circuit, and a second input connected to the output of said fourth inverter-circuit for outputting said first output signal; and a seventh AND circuit having a first input connected to the output of said third inverter circuit, and a second input receiving said start address control signal for outputting said second output signal, and said second set/reset control circuit includes:

fifth and sixth inverter circuits each having an input receiving said state setting signal;

a seventh inverter circuit having an input receiving said start address control signal;

an eighth AND circuit having a first input connected to the output of said fifth inverter circuit, and a second input connected to the output of said seventh inverter circuit for outputting said first output signal;

a ninth AND circuit having a first input connected to the output of said sixth inverter circuit, and a second input receiving said start address control signal; and a first OR circuit having a first input receiving the output of said ninth AND circuit, and a second input receiving the logically inverted signal of said first or second control signal for outputting said second output signal.

* * * * *